(12) United States Patent
Chen

(10) Patent No.: US 9,214,525 B2
(45) Date of Patent: *Dec. 15, 2015

(54) GATE STACK HAVING ELECTRON BLOCKING LAYERS ON CHARGE STORAGE LAYERS FOR ELECTRONIC DEVICES

(71) Applicant: SanDisk Corporation, Milpitas, CA (US)

(72) Inventor: Jian Chen, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 43 days.

This patent is subject to a terminal disclaimer.

(21) Appl. No.: 14/164,065

(22) Filed: Jan. 24, 2014

(65) Prior Publication Data

US 2014/0183613 A1 Jul. 3, 2014

Related U.S. Application Data

(63) Continuation of application No. 12/390,275, filed on Feb. 20, 2009, now Pat. No. 8,686,490, which is a continuation-in-part of application No. 12/247,917, filed on Oct. 8, 2008, now Pat. No. 7,847,341, which is (Continued)

(51) Int. Cl.
*H01L 29/423* (2006.01)
*B82Y 10/00* (2011.01)
(Continued)

(52) U.S. Cl.
CPC ............ *H01L 29/42324* (2013.01); *B82Y 10/00* (2013.01); *G11C 11/5621* (2013.01); *G11C 11/5671* (2013.01); *G11C 16/04* (2013.01); *G11C 16/10* (2013.01); *H01L 21/28273* (2013.01); *H01L 21/28282* (2013.01); *H01L 29/42332* (2013.01); *H01L 29/42348* (2013.01); *H01L 29/512* (2013.01);
(Continued)

(58) Field of Classification Search
None
See application file for complete search history.

(56) References Cited

U.S. PATENT DOCUMENTS 5,043,940 A 8/1991 Harari
5,172,338 A 12/1992 Mehrotra et al.
(Continued)

FOREIGN PATENT DOCUMENTS

CN 1761392 4/2006
EP 1324378 A 7/2003
(Continued)

OTHER PUBLICATIONS

Written Appeal and Amendment filed Aug. 20, 2014 in Japanese Patent Application No. 2009-543077.
(Continued)

*Primary Examiner* — Michael Jung
(74) *Attorney, Agent, or Firm* — Vierra Magen Marcus LLP

(57) ABSTRACT

Methods and apparatuses for electronic devices such as non-volatile memory devices are described. The memory devices include a multi-layer control dielectric, such as a double or triple layer. The multi-layer control dielectric includes a combination of high-k dielectric materials such as aluminum oxide, hafnium oxide, and/or hybrid films of hafnium aluminum oxide. The multi-layer control dielectric provides enhanced characteristics, including increased charge retention, enhanced memory program/erase window, improved reliability and stability, with feasibility for single or multi state (e.g., two, three or four bit) operation.

11 Claims, 33 Drawing Sheets

Related U.S. Application Data a continuation-in-part of application No. PCT/US2007/087167, filed on Dec. 12, 2007, which is a continuation-in-part of application No. 11/743,085, filed on May 1, 2007, now abandoned, which is a continuation-in-part of application No. 11/688,087, filed on Mar. 19, 2007, now abandoned, which is a continuation-in-part of application No. 11/641,956, filed on Dec. 20, 2006, now abandoned.

(60) Provisional application No. 60/931,488, filed on May 23, 2007.

(51) Int. Cl.
  G11C 11/56 (2006.01)
  G11C 16/04 (2006.01)
  G11C 16/10 (2006.01)
  H01L 21/28 (2006.01)
  H01L 29/51 (2006.01)
  H01L 29/66 (2006.01)

(52) U.S. Cl.
  CPC ........... *H01L 29/513* (2013.01); *H01L 29/517* (2013.01); *H01L 29/66825* (2013.01); *H01L 29/66833* (2013.01)

(56) References Cited

U.S. PATENT DOCUMENTS

| | | |
|---|---|---|
| 5,434,825 A | 7/1995 | Harari |
| 5,583,812 A | 12/1996 | Harari |
| 5,714,766 A | 2/1998 | Chen et al. |
| 5,719,808 A | 2/1998 | Harari et al. |
| 5,768,192 A | 6/1998 | Eitan |
| 5,937,295 A | 8/1999 | Chen et al. |
| 5,959,896 A | 9/1999 | Forbes |
| 5,991,517 A | 11/1999 | Harari et al. |
| 6,054,349 A | 4/2000 | Nakajima et al. |
| 6,060,895 A | 5/2000 | Soh et al. |
| 6,090,666 A | 7/2000 | Ueda et al. |
| 6,139,626 A | 10/2000 | Norris et al. |
| 6,159,620 A | 12/2000 | Heath et al. |
| 6,207,229 B1 | 3/2001 | Bawendi et al. |
| 6,222,762 B1 | 4/2001 | Guterman et al. |
| 6,232,643 B1 | 5/2001 | Forbes et al. |
| 6,275,419 B1 | 8/2001 | Guterman et al. |
| 6,297,095 B1 | 10/2001 | Muralidhar et al. |
| 6,317,363 B1 | 11/2001 | Guterman et al. |
| 6,317,364 B1 | 11/2001 | Guterman et al. |
| 6,319,775 B1 | 11/2001 | Halliyal et al. |
| 6,322,901 B1 | 11/2001 | Bawendi et al. |
| 6,333,214 B1 | 12/2001 | Kim et al. |
| 6,344,403 B1 | 2/2002 | Madhukar et al. |
| 6,400,610 B1 | 6/2002 | Sadd |
| 6,407,435 B1 | 6/2002 | Ma et al. |
| 6,413,819 B1 | 7/2002 | Zafar et al. |
| 6,441,392 B1 | 8/2002 | Gautier et al. |
| 6,542,956 B1 | 4/2003 | Lee et al. |
| 6,559,014 B1 | 5/2003 | Jeon |
| 6,562,491 B1 | 5/2003 | Jeon |
| 6,576,291 B2 | 6/2003 | Bawendi et al. |
| 6,577,532 B1 | 6/2003 | Chevallier |
| 6,586,349 B1 | 7/2003 | Jeon et al. |
| 6,586,785 B2 | 7/2003 | Flagan et al. |
| 6,602,805 B2 | 8/2003 | Chang |
| 6,610,615 B1 | 8/2003 | McFadden |
| 6,642,573 B1 | 11/2003 | Halliyal et al. |
| 6,656,792 B2 | 12/2003 | Choi et al. |
| 6,657,253 B2 | 12/2003 | Kim et al. |
| 6,670,670 B2 | 12/2003 | Chae et al. |
| 6,713,846 B1 | 3/2004 | Senzaki |
| 6,717,226 B2 | 4/2004 | Hegde et al. |
| 6,723,606 B2 | 4/2004 | Flagan et al. |
| 6,730,537 B2 | 5/2004 | Hutchison et al. |
| 6,750,066 B1 | 6/2004 | Cheung et al. |
| 6,753,224 B1 | 6/2004 | Lin et al. |
| 6,753,570 B1 | 6/2004 | Tripsas et al. |
| 6,781,166 B2 | 8/2004 | Lieber et al. |
| 6,803,272 B1 | 10/2004 | Halliyal et al. |
| 6,844,604 B2 | 1/2005 | Lee et al. |
| 6,872,645 B2 | 3/2005 | Duan et al. |
| 6,888,739 B2 | 5/2005 | Forbes |
| 6,949,793 B2 | 9/2005 | Choi et al. |
| 6,951,782 B2 | 10/2005 | Ding |
| 6,996,009 B2 | 2/2006 | Forbes |
| 7,005,697 B2 | 2/2006 | Batra et al. |
| 7,012,299 B2 | 3/2006 | Mahajani et al. |
| 7,045,851 B2 | 5/2006 | Black et al. |
| 7,091,120 B2 | 8/2006 | Buretea et al. |
| 7,091,548 B2 | 8/2006 | Jeong et al. |
| 7,129,554 B2 | 10/2006 | Lieber et al. |
| 7,138,680 B2 | 11/2006 | Li et al. |
| 7,154,140 B2 | 12/2006 | Forbes |
| 7,169,674 B2 | 1/2007 | Bojarczuk, Jr. et al. |
| 7,217,643 B2 | 5/2007 | Liang et al. |
| 7,221,586 B2 | 5/2007 | Forbes et al. |
| 7,365,389 B1 | 4/2008 | Jeon et al. |
| 7,423,326 B2 | 9/2008 | Rotondaro et al. |
| 7,816,727 B2 | 10/2010 | Lai et al. |
| 7,825,458 B2 | 11/2010 | Shimizu et al. |
| 7,956,406 B2 | 6/2011 | Yasuda |
| 7,976,646 B1 | 7/2011 | Ranganathan et al. |
| 2002/0130311 A1 | 9/2002 | Lieber et al. |
| 2003/0075756 A1 | 4/2003 | Suzuki |
| 2003/0077625 A1 | 4/2003 | Hutchinson |
| 2003/0138611 A1 | 7/2003 | Girardie |
| 2003/0153151 A1 | 8/2003 | Choi et al. |
| 2004/0074565 A1 | 4/2004 | Hayakawa et al. |
| 2004/0103936 A1* | 6/2004 | Andriessen .................. 136/252 |
| 2004/0130941 A1 | 7/2004 | Kan et al. |
| 2004/0144972 A1 | 7/2004 | Dai et al. |
| 2004/0178470 A1 | 9/2004 | Hieda |
| 2004/0266126 A1 | 12/2004 | Lee |
| 2005/0006696 A1 | 1/2005 | Noguchi et al. |
| 2005/0062098 A1* | 3/2005 | Mahajani .......... H01L 21/28185 257/324 |
| 2005/0072989 A1 | 4/2005 | Bawendi et al. |
| 2005/0074982 A1 | 4/2005 | Lee et al. |
| 2005/0093054 A1 | 5/2005 | Jung |
| 2005/0148127 A1 | 7/2005 | Jung et al. |
| 2005/0181619 A1 | 8/2005 | Hwu et al. |
| 2005/0201149 A1 | 9/2005 | Duan et al. |
| 2005/0201150 A1 | 9/2005 | Wang |
| 2005/0202615 A1 | 9/2005 | Duan et al. |
| 2005/0236678 A1 | 10/2005 | Sato et al. |
| 2005/0280069 A1 | 12/2005 | Mizushima et al. |
| 2006/0001053 A1 | 1/2006 | Wang |
| 2006/0040103 A1 | 2/2006 | Whiteford et al. |
| 2006/0054943 A1 | 3/2006 | Li et al. |
| 2006/0076606 A1 | 4/2006 | Lojek |
| 2006/0081911 A1 | 4/2006 | Batra et al. |
| 2006/0118858 A1 | 6/2006 | Jeon et al. |
| 2006/0160303 A1 | 7/2006 | Ang et al. |
| 2006/0166452 A1 | 7/2006 | Rao et al. |
| 2006/0175653 A1 | 8/2006 | Joo et al. |
| 2006/0175656 A1 | 8/2006 | Govoreanu et al. |
| 2006/0180851 A1 | 8/2006 | Lee et al. |
| 2006/0186457 A1 | 8/2006 | Burnett et al. |
| 2006/0186462 A1 | 8/2006 | Han et al. |
| 2006/0231889 A1 | 10/2006 | Chen et al. |
| 2006/0275975 A1 | 12/2006 | Yeh et al. |
| 2007/0018342 A1 | 1/2007 | Sandhu et al. |
| 2007/0029625 A1 | 2/2007 | Lue et al. |
| 2007/0032091 A1 | 2/2007 | Heald et al. |
| 2007/0045718 A1 | 3/2007 | Bhattacharyya |
| 2007/0051998 A1 | 3/2007 | Kil et al. |
| 2007/0056925 A1 | 3/2007 | Liu et al. |
| 2007/0057313 A1 | 3/2007 | Kim |
| 2007/0092989 A1 | 4/2007 | Kraus et al. |
| 2007/0096202 A1 | 5/2007 | Kang et al. |
| 2007/0122946 A1 | 5/2007 | Hieda |
| 2007/0267682 A1 | 11/2007 | Tanaka et al. |
| 2008/0150003 A1 | 6/2008 | Chen et al. |

(56) References Cited

U.S. PATENT DOCUMENTS

| | | | |
|---|---|---|---|
| 2008/0150004 | A1 | 6/2008 | Chen et al. |
| 2008/0150009 | A1 | 6/2008 | Chen |
| 2009/0078989 | A1* | 3/2009 | Seol et al. ............... 257/324 |
| 2009/0212351 | A1 | 8/2009 | Chen |
| 2009/0309150 | A1* | 12/2009 | Power et al. ............ 257/316 |
| 2010/0001335 | A1 | 1/2010 | Wang et al. |
| 2010/0219459 | A1* | 9/2010 | Orlowski ................. 257/316 |
| 2011/0062416 | A1* | 3/2011 | Wang et al. ............... 257/14 |

FOREIGN PATENT DOCUMENTS

| | | |
|---|---|---|
| JP | 2002-319583 | 10/2002 |
| JP | 2004-111756 A | 4/2004 |
| JP | 2004363329 | 12/2004 |
| JP | 2006005006 | 1/2006 |
| JP | 2006-128333 | 5/2006 |
| JP | 2006-229044 | 8/2006 |
| WO | 2006112793 | 10/2006 |
| WO | 2008079684 A2 | 7/2008 |
| WO | 2008079684 A3 | 7/2008 |

OTHER PUBLICATIONS

Response to Office Action filed Aug. 18, 2014 in Japanese Patent Application No. 2011-531058.

Corso, D. et al., "Localized Charge storage in nanocrystal memories: feasibility of a multi-bit cell," European Solid-State Device Research (2003) 33rd Conference on ESSDERC '03, pp. 91-94.

De Blauwe, J. "Nanoparticle Nonvolatile Memory Devices," IEEE Trans. Nanotechnology (2002) 1:72.

Drexler, H. et al., "Spectroscopy of quantum levels in charge-tunable InGaAs quantum dots" Phys. Rev. Lett (1994) 73:2252-2255.

Fazio, A. et al. "Inter StrataFlash TM Memory Technology Development and Implementation," International Tech Journal Q4'97 (1997) pp. 1-13.

Iannaccone, G. et al., "Simulation of a quantum-dot flash memory," J. Appl. Phys. (1998) 84(9):5032-5036.

Ichige, M. et al. "A novel self-aligned shallow trench isolation cell for 90nm 4Gbit NANP Flash EEPROs," Digest of Tech Papers, Symposium on VLSI Tech, (2003) 2 pages.

Jeon, S. et al. "Triple high k stacks (Al2O3/HfO2/Al2O3) with high pressure (10 atm) H2 and D2 annealing for SONOS type flash memory device applications," 4th IEEE Conf on Nanotech (2004) pp. 53-55.

Kan, E. "Technology for self-assembled entities in logic and memory units below the lithography limit," The 2004-2005 CNF Research Accomplishments, Cornell Nanoscale Facility, CNF Project #715-98 (2004-2005) pp. 88-89.

Kim, J-H et al. "Long-term electron leakage mechanism through ONO interpoly dielectric in stacked-gate EEPROM cells," IEEE Trans Electronic Devices (2004) 51:2048-2053.

Kolloipoulou, S. et al., "Hybrid silicon-organic nanoparticle memory device," J. Appl. Phys. (2003) 94(8):5234-5239.

Lin, Y-H et al., "High-Performance Nonvolatile HfO2 Nanocrystal Memory," IEEE Electron Device Letts (Mar. 2005) 26(3):154-156.

Mandal, S. "Quantum Dots," E & ECE, IIT Kharagpur, Roll:9819107, 24 pages, Aug. 29, 2001.

McCarthy, W., O'Reilly Network, "Quantum Dots and Programmable Matter," http://www.oreillynet.com/pub/a/network/2004/01/09/quantumdots.html, 5 pages, (2000-2004) O'Reilley & Associates, Inc.

Mori, S. et al. "Polyoxide thinning limitation and superior ONO interpoly dielectric for nonvolatile memory devices," IEEE Trans Electronic Devices (1991) 38:270-277.

Mori, S. et al. "ONO inter-poly dielectric scaling for nonvolatile memory applications," IEEE Trans Electronic Devices (1991) 38:386-391.

Mori, S. et al. "Thickness scaling limitation factors of ONO interpoly dielectric for nonvolatile memory devices," IEEE Trans Electron Devices (1996) 43:47-53.

Pavan, P. et al. "Flash memory cells—an overview," Proc. IEEE (1997) 85:1248-1271.

Power, J.R. et al. "Improved reliability of a high-k IPD flash cell through use of a top-oxide," IEEE Non-volatile Semiconductor Memory Workshop (2007) 27-29.

Power, J.R. et al. "Improved retention for a Al2O3 IPD embedded flash cell without top-oxide," IEEE Non-volatile Semiconductor Memory Workshop 2008 and 2008 Int'l Conf on Memory Tech and Design (2008) pp. 93-96.

Samanta, S.K. et al. "Enhancement of memory window in short channel non-volatile memory devices using double layer tungsten nanocrystals," Electron Devices Meeting, 2005. IEDM Technical Digest. IEEE International Dec. 5-7, 2005 pp. 170-173.

Shum, D.P. et al. "A highly robust process for integration with scaled ONO interpoly dielectrics for embedded nonvolatile memory applications," IEEE Trans Electron Devices (1995) 42:1376-1377.

Takata, M. et al. "Fundamental characteristics of new non-volatile memory with extremely high density metal quantum dots," (Publication and Publication Date unknown).

Tiwari, S. et al. "Volatile and Non-Volatile Memories in Silicon with Nano-Crystal Storage," IEDM (1995) 95-521.

Tiwari, S. et al., "A silicon nanocrystals based memory," Appl. Phys. Lett (1996) 68 (10:1377-1379).

Vampola, K. et al., "Growth and Characterization of metal nanocrystals," 2002 NNUN REU Program, Cornell Nanofabrication Facility (2002) p. 27.

Wu, K., et al. "A model for eprom intrinsic charge loss through oxide nitride-oxide (ONO) interpoly dielectric," IEEE 28th Ann. Proc. Reliability Physics Symp (1990) pp. 145-149.

Yim, Y-S. et al. "70nm NAND flash technology with 0.025 um2 cell size for 4Gb flash memory," IEEE Electron Device Meeting IEDM '03 Tech Digest (2003) vol. 34.1.1-34.1.4.

Yu et al., "ALD (HfO2)(Al2O3) 1-x high-k gate dielectrics for advanced MOS devices application," Thin Solid Films 462-463: 110-113 (2004).

"ISSCC delegates eye successor to floating gate flash memory," http://www.electronicsweekly.com/article4907.htm Feb. 25, 2004.

Silicon Storage Technology, Inc. "Technical Comparison of Floating Gate Reprogrammable Nonvolatile Memories," Technical Paper, Nov. 2001 (Copyright 2002), 8 pages.

NVM Technology Overview, available at: www.saifun.com/content.asp?id=113.

NROM Technology, available at: www.saifun.com/content.asp?id=343.

AP Lawrence, "Nonvolatile memory overview," AP Lawrence.com, accessed at http://aplawrence.com/makwana/nonvolmem.html, accessed on Mar. 23, 2009, 22 pages.

International Search Report for International Application No. PCT/US2007/87167 dated May 23, 2008.

Iwamoto, K.; Kamimuta, Y.; Ogawa, A.; Watanabe, Y.; Migita, S.; Mizubayashi, W.; Morita, Y.; Takahashi, M.; Ota, H.; Nabatame, T.; Toriumi, A. "Experimental Evidence for the Flatband Voltage Shift of High-k Metal-Oxide-Semiconductor Devices Due to the Dipole Formation at the High-k/SiO2 Interface," Applied Physics Letters, 2008, 92, pp. 132907-1 to 132907-3.

Non-Final Rejection mailed Dec. 14, 2010 in U.S. Appl. No. 12/390,275.

Response to Non-Final Rejection mailed Mar. 14, 2011 in U.S. Appl. No. 12/390,275.

Final Rejection mailed May 26, 2011 in U.S. Appl. No. 12/390,275.

Response to Final Rejection mailed Jul. 27, 2011 in U.S. Appl. No. 12/390,275.

Advisory Action mailed Aug. 4, 2011 in U.S. Appl. No. 12/390,275.

Non-Final Rejection mailed Feb. 26, 2013 in U.S. Appl. No. 12/390,275.

Response to Non-Final Rejection mailed May 28, 2013 in U.S. Appl. No. 12/390,275.

Final Rejection mailed Aug. 29, 2013 in U.S. Appl. No. 12/390,275.

Response to Final Rejection mailed Oct. 28, 2013 in U.S. Appl. No. 12/390,275.

Notice of Allowance and Fees Due mailed Nov. 12, 2013 in U.S. Appl. No. 12/390,275.

(56) References Cited

OTHER PUBLICATIONS

Amendment after Notice of Allowance mailed Feb. 14, 2014 in U.S. Appl. No. 12/390,275.
Response to Amendment under Rule 312 mailed Feb. 20, 2014 in U.S. Appl. No. 12/390,275.
Advisory Action of related U.S. Appl. No. 11/688,087 (SD-NSA-0005-1) mailed Oct. 19, 2010.
Sep. 24, 2010 Reply to Sep. 13, 2010 Final Office Action of related U.S. Appl. No. 11/688,087 (SD-NSA-0005-1).
Amendment submitted with RCE of related U.S. Appl. No. 11/688,087 (SD-NSA-0005-1) filed Feb. 14, 2011.
Preliminary Amendment of related U.S. Appl. No. 12/247,917 (SD-NSA-0005-3) filed May 14, 2009.
Office Action of related U.S. Appl. No. 12/247,917 (SD-NSA-0005-3) mailed Nov. 6, 2009.
Saitoh et al., "1.2 nm HfSiON/SiON Stacked Gate Insulators for 65-nm-Node MISFETs," 2005, Japanese Journal of Applied Physics, vol. 44, No. 48, pp. 2330-2335.
Feb. 3, 2010 Reply to Nov. 6, 2009 Office Action of related U.S. Appl. No. 12/247,917 (SD-NSA-0005-3).
Final Office Action of related U.S. Appl. No. 12/247,917 (SD-NSA-0005-3) mailed May 10, 2010.
Specht et al., "Charge trapping memory structures with Al2O3 trapping dielectric for high-temperature applications," 2005, Solid-State Electronics 49, pp. 716-720.
Jul. 12, 2010 Reply to May 10, 2010 Final Office Action of related U.S. Appl. No. 12/247,917 (SD-NSA-0005-3).
Notice of Allowance of related U.S. Appl. No. 12/247,917 (SD-NSA-0005-3) mailed Jul. 28, 2010.
Restriction Requirement of related U.S. Appl. No. 11/743,085 (SD-NSA-0005-2) mailed Oct. 8, 2009.
Nov. 6, 2009 Reply to Oct. 8, 2009 Restriction Requirement of related U.S. Appl. No. 11/743,085 (SD-NSA-0005-2).
Office Action of related U.S. Appl. No. 11/743,085 (SD-NSA-0005-2) mailed Feb. 5, 2010.
Jul. 5, 2010 Reply to Feb. 5, 2010 Office Action of related U.S. Appl. No. 11/743,085 (SD-NSA-0005-2).
Final Office Action of related U.S. Appl. No. 11/743,085 (SD-NSA-0005-2) mailed Sep. 30, 2010.
Jan. 31, 2011 RCE & Reply to Sep. 30, 2010 Final Office Action of related U.S. Appl. No. 11/743,085 (SD-NSA-0005-2).
Office Action of related Chinese Patent Application No. 200780046789.2 (SD-NSA-0005-2-CN) dated Aug. 9, 2011.
Office Action of related Chinese Patent Application No. 200780046789.2 (SD-NSA-0005-2-CN) dated Apr. 6, 2012.
Sep. 4, 2012 Reply to Apr. 6, 2012 Office Action of related Chinese Patent Application No. 200780046789.2 (SD-NSA-0005-2-CN).
European Search Report of related European Patent Application No. 07252410.1 (SD-NSA-0005-2-EP) dated Jan. 25, 2008.
Office Action of related European Patent Application No. 07252410.1 (SD-NSA-0005-2-EP) dated Feb. 10, 2009.
Jun. 9, 2009 Reply to Feb. 10, 2009 Office Action of related European Patent Application No. 07252410.1 (SD-NSA-0005-2-EP).
Office Action of related European Patent Application No. 07252410.1 (SD-NSA-0005-2-EP) dated Aug. 24, 2009.
Mar. 3, 2010 Reply to Aug. 24, 2009 Office Action of related European Patent Application No. 07252410.1 (SD-NSA-0005-2-EP).
Office Action of related European Patent Application No. 07252410.1 (SD-NSA-0005-2-EP) dated May 3, 2010.
Sep. 13, 2010 Reply to May 3, 2010 Office Action of related European Patent Application No. 07252410.1 (SD-NSA-0005-2-EP).
Office Action of related European Patent Application No. 07252410.1 (SD-NSA-0005-2-EP) dated Nov. 11, 2010.
Office Action of related European Patent Application No. 07252410.1 (SD-NSA-0005-2-EP) dated May 11, 2011.
Sep. 12, 2011 Reply to May 11, 2011 Office Action of related European Patent Application No. 07252410.1 (SD-NSA-0005-2-EP).
Office Action of related European Patent Application No. 07252410.1 (SD-NSA-0005-2-EP) dated Dec. 1, 2011.
Apr. 3, 2012 Reply to Dec. 1, 2011 Office Action of related European Patent Application No. 07252410.1 (SD-NSA-0005-2-EP).
International Search Report and the Written Opinion of the International Searching Authority dated Nov. 20, 2009 for International Patent Application No. PCT/US2009/058182.
Pfeiffer, O., Ayre, A. "Using Flash Memory in Embedded Applications," Embedded Systems Academy, www.esacademy.com/faq/docs/flash/lifetime.htm, printed 2009, (2 pages).
Gutt, J.; Brown, G.A.; Senzaki, Y.; Park, S. "An Advanced High-k Transistor Utilizing Metal-Organic Precursors in an ALD Deposition of Hafnium Oxide and Hafnium Silicate with Ozone as Oxidizer," Materials Research Society Symposium Proceedings, 2004, Materials Research Society, 811, D2.4.1-D2.4.6.
Kil, D-S; Hong, K.; Lee, K-J.; Kim, J.; Song, H-S.; Park, K-S.; Roh, J-S.; Sohn, H-C.; Kim J-W.; Park, S-W. "Development of Highly Robust Nano-mixed HfxAlyOz Dielectrics for TiN/HfxAlyOz/TiN Capacitor Applicable to 65nm Generation DRAMs," Symposium on VLSI Technology Digest of Technical Papers, 2004, 126-127.
Liu, X.; Ramanathan, S.; Longdergan, A.; Srivastava, A.; Lee, E.; Seidel, T.E.; Barton, J.T.; Pang, D.; Gordon, R.G. "ALD of Hafnium Oxide Thin Films from Tetrakis(ethylmethylamino)hafnium and Ozone," Journal of the Electrochemical Society, 2005, 152, G213-G219.
Suzuki, I.; Yanagita, K.; Dussarrat, C. "Extra Low-Temperature SiO2 Deposition Using Aminosilanes," 210th ECS Meeting, 2006, Abstract #1053.
Swerts, J.; Deweerd, W.; Wang, C-G.; Fedorenko, Y.; Delabie, A.; Shero, E.; Zhao, C.; Maes, J.W.; De Gendt, S.; Wilk, G. "Highly Scalable ALD-deposited Hafnium Silicate Gate Stacks for Low Standby Power Applications," Materials Research Symposium Proceedings, 2006, 917, 6 pages.
Aminzadeh, M. et al. "Conduction and charge trapping in polysilicon-silicon nitride-oxide-silicon structures under positive gate bias," IEEE Trans Elec. Dev. (1988) 35:459-467.
Atwater, H.A. "Silicon nanoparticle engineering for novel logic and memory applications," Project Overview, Functional Nanostructures Program, NSF (Jan. 2001).
Bell, L.D. et al., "A Radiation-tolerant, low-power non-volatile memory based on silicon nanocrystal quantum dots," Forum on Innovative Approaches to Outer Planetary Exploration 2001-2020, Houston, TX (2001).
Bez, R. et al. "Introduction to flash memory," Proc. IEEE (2003) 91:489-502.
Bodefield, M.C. et al., "Storage of electrons and holes in self-assembled InAs quantum dots," Appl. Phys. Lett. (1999) 74(13):1839-1841.
Casperson, J.D. et al., "Materials issues for layered tunnel barrier structures," J. Appl. Phys. (2002) 92(1):261-267.
Casperson, J.D. "Design and Characterization of Layered Tunnel Barriers for Nonvolatile Memory Applications," Dissertation for Doctor of Philosophy, California Institute of Technology, Pasadena, CA, Defended May 17, 2004.
Chae, D-H et al., "Nanocrystal memory cell using high-density SiGe Quantum Dot Array," J. Kor. Phys. Soc. (1999) 35:S995-S998.
Chen, J.H. et al., "Nonvolatile Flash Memory Device Using Ge Nanocrystals Embedded in HfAlO High-k Tunneling and Control Oxides: Device Fabrication and Electrical Performance," IEEE Transactions on Electronic Devices (2004) 51:1840-1848.
Cheng, X et al., "Characteristics of sandwich-structured Al[2]O[3]/HfO[2]/Al[2]O[3] gate dielectric films on ultra-thin silicon-on-insulator substrates," Applied Surface Science (2005) 252:1876-1882.
Choi, S. et al., "Band engineered charge trap NAND flash with sub-40nm process technologies (invited)" 2008 Int'l Electron Devices Meeting, Paper 37.5 (2008) pp. 925-928.
Office Action filed Jan. 21, 2014 in Japanese Patent Application No. 2011-531058.
Machine Translation of JP 2006-128333 published May 18, 2006.
Response to Office Action filed Dec. 13, 2013 in Korean Patent Application No. 10-2009-7012821.
U.S. Appl. No. 14/087,723, filed Nov. 22, 2013.
U.S. Appl. No. 14/087,877, filed Nov. 22, 2013.
U.S. Appl. No. 14/089,835, filed Nov. 26, 2013.

(56) References Cited

OTHER PUBLICATIONS

Response to Office Action filed Oct. 28, 2013 in Japanese Patent Application No. 2009-543077.
Office Action dated Oct. 14, 2013 in Korean Patent Application No. 10-2009-7012821.
Office Action dated Jul. 30, 2013 in Japanese Patent Application No. 2009-543077.
Reexamination Decision dated Aug. 1, 2013 in Chinese Patent Application No. 200780046789.2.
Response to Office Action filed Aug. 27, 2013 in Taiwanese Patent Application No. 098134155.
English translations of Response, Replacement Pages of Specification, Replacement Claims and Replacement Drawings as submitted in Response to Office Action filed Aug. 27, 2013 in Taiwanese Patent Application No. 098134155.
May 3, 2013 Reply to Feb. 4, 2013 Office Action of related Chinese Patent Application No. 200780046789.2 (SD-NSA-0005-2-CN).
Office Action and Search Report of related Taiwan Patent Application No. 098134155 (SD-NSA-0005-4-TW).
Examiner Interview Summary of related U.S. Appl. No. 11/743,085 (SD-NSA-0005-2) mailed Jun. 13, 2013.
Office Action of related U.S. Appl. No. 11/641,956 (SD-NSA-0005) mailed May 23, 2013.
Office Action of related U.S. Appl. No. 11/688,087 (SD-NSA-0005-1) mailed May 24, 2013.
Office Action of related U.S. Appl. No. 11/743,085 (SD-NSA-0005-2) mailed May 30, 2013.
Apr. 17, 2013 Reply to Jan. 8, 2013 Office Action of related Japanese Patent Application No. 2009-543077 (SD-NSA-0005-2-JP).
Dec. 22, 2011 Reply to Aug. 9, 2011 Office Action of related Chinese Patent Application No. 200780046789.2 (SD-NSA-0005-2-CN).
Office Action of related Chinese Patent Application No. 200780046789.2 (SD-NSA-0005-2-CN) dated Feb. 4, 2013.
Office Action of related Japanese Patent Application No. 2009-543077 (SD-NSA-0005-2-JP) dated Jan. 8, 2013.
Office Action of related Taiwan Patent Application No. 96149083 (SD-NSA-0005-2-TW) dated Jun. 28, 2011.
Taiwan Search Report of related Taiwan Patent Application No. 96149083 (SD-NSA-0005-2-TW) dated Jun. 10, 2011.
Office Action and Search Report of related Chinese Patent Application No. 200980139673.2 (SD-NSA-0005-4-CN) dated Dec. 28, 2012.
Office Action of related European Patent Application No. 07252410.1 (SD-NSA-0005-2-EP) dated Jun. 8, 2012.
Oct. 18, 2012 Reply to Jun. 8, 2012 Office Action of related European Patent Application No. 07252410.1 (SD-NSA-0005-2-EP).
Summons to attend oral proceedings pursuant to Rule 115(1) EPC of related European Patent Application No. 07252410.1 (SD-NSA-0005-2-EP) dated Jan. 16, 2013.
Partial European Search Report of related European Patent Application No. 11155070.3 (SD-NSA-0005-2-1-EP) dated Mar. 5, 2012.
Mar. 22, 2011 Reply to Nov. 11, 2010 Office Action of related European Patent Application No. 07252410.1 (SD-NSA-0005-2-EP).
Preliminary Amendment of related U.S. Appl. No. 11/641,956 (SD-NSA-0005) filed Apr. 18, 2007.
Preliminary Amendment of related U.S. Appl. No. 11/641,956 (SD-NSA-0005) filed Apr. 29, 2008.
Preliminary Amendment of related U.S. Appl. No. 11/641,956 (SD-NSA-0005) filed Aug. 21, 2008.
Restriction Requirement of related U.S. Appl. No. 11/641,956 (SD-NSA-0005) mailed Sep. 18, 2008.
Oct. 8, 2008 Reply to Sep. 18, 2008 Restriction Requirement of related U.S. Appl. No. 11/641,956 (SD-NSA-0005).
Office Action of related U.S. Appl. No. 11/641,956 (SD-NSA-0005) mailed Jan. 16, 2009.
Interview Summary of related U.S. Appl. No. 11/641,956 (SD-NSA-0005) mailed Mar. 23, 2009.
Apr. 16, 2009 Reply to Jan. 16, 2009 Office Action of related U.S. Appl. No. 11/641,956 (SD-NSA-0005).
Final Office Action of related U.S. Appl. No. 11/641,956 (SD-NSA-0005) mailed Jul. 22, 2009.
Oct. 5, 2009 RCE & Reply to Jul. 22, 2009 Final Office Action of related U.S. Appl. No. 11/641,956 (SD-NSA-0005).
Office Action of related U.S. Appl. No. 11/641,956 (SD-NSA-0005) mailed Dec. 24, 2009.
Mar. 24, 2010 Reply to Dec. 24, 2009 Office Action of related U.S. Appl. No. 11/641,956 (SD-NSA-0005).
Final Office Action of related U.S. Appl. No. 11/641,956 (SD-NSA-0005) mailed Jun. 22, 2010.
Sep. 23, 2010 RCE & Reply to Jun. 22, 2010 Final Office Action of related U.S. Appl. No. 11/641,956 (SD-NSA-0005).
Preliminary Amendment of related U.S. Appl. No. 11/688,087 (SD-NSA-0005-1) filed May 17, 2007.
Restriction Requirement of related U.S. Appl. No. 11/688,087 (SD-NSA-0005-1) mailed Aug. 21, 2009.
Sep. 4, 2009 Reply to Aug. 21, 2009 Restriction Requirement of related U.S. Appl. No. 11/688,087 (SD-NSA-0005-1).
Office Action of related U.S. Appl. No. 11/688,087 (SD-NSA-0005-1) mailed Dec. 30, 2009.
Jun. 29, 2010 Reply to Dec. 30, 2009 Office Action of related U.S. Appl. No. 11/688,087 (SD-NSA-0005-1).
Final Office Action of related U.S. Appl. No. 11/688,087 (SD-NSA-0005-1) mailed Sep. 13, 2010.
Response to Office Action dated Apr. 2, 2014 in Japanese Patent Application No. 2011-531058.
Office Action dated May 12, 2014 in Japanese Patent Application No. 2011-531058.
Decision of Refusal and Decision to Dismiss the Amendment dated Apr. 22, 2014 in Japanese Patent Application No. 2009-543077.
Response to Communication filed Jun. 11, 2014 in European Patent Application No. 09819642.1.
Office Action dated Apr. 27, 2015 in Chinese Patent Application No. 201310153363.4.

\* cited by examiner

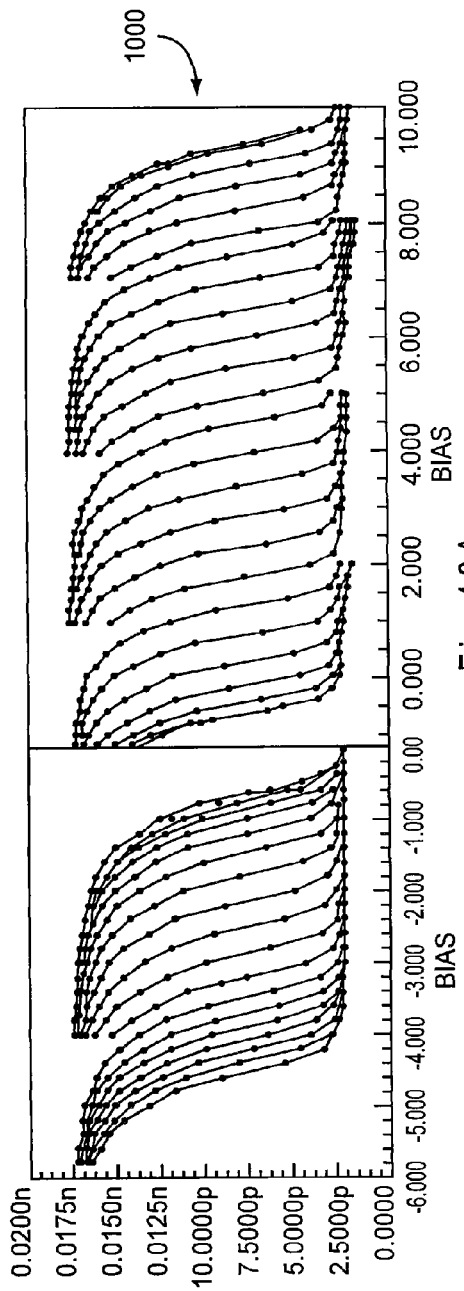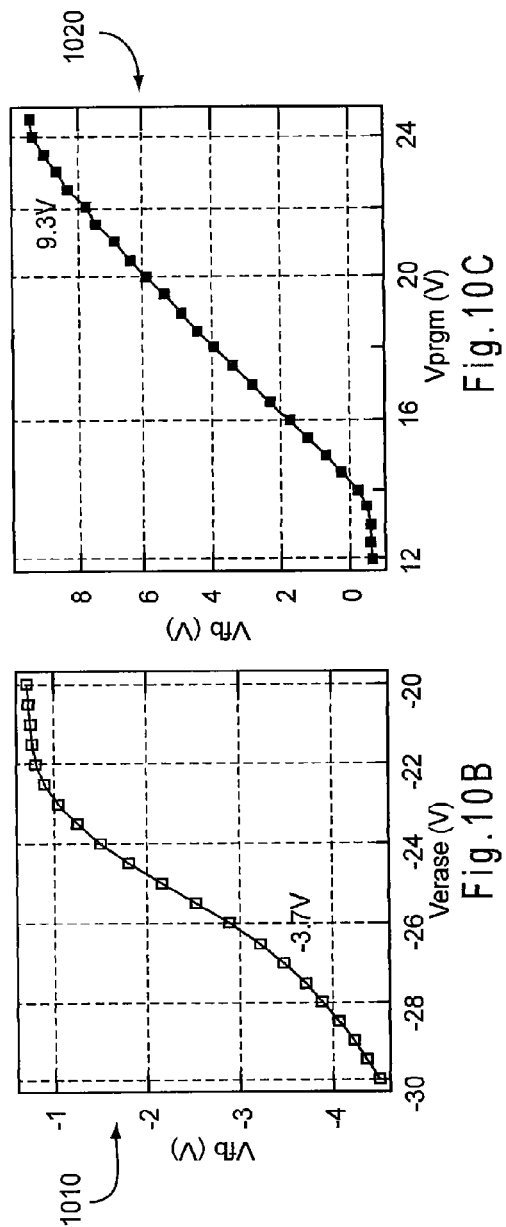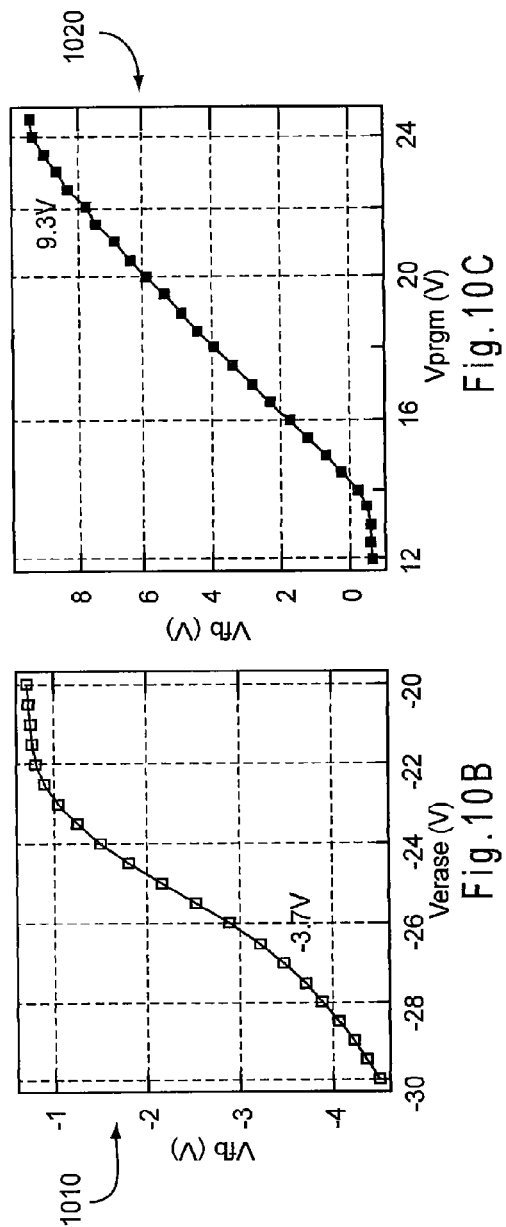
Fig.10A
Fig.10B
Fig.10C

GATE STACK HAVING ELECTRON BLOCKING LAYERS ON CHARGE STORAGE LAYERS FOR ELECTRONIC DEVICES

REFERENCE TO RELATED APPLICATIONS

This application is a continuation of U.S. patent application Ser. No. 12/390,275, filed Feb. 20, 2009, now U.S. Pat. No. 8,686,490, which is a continuation-in-part of U.S. patent application Ser. No. 12/247,917, filed Oct. 8, 2008, now U.S. Pat. No. 7,847,341, which is a continuation-in-part of PCT International Patent Application No. PCT/US2007/087167, filed Dec. 12, 2007, and which claims priority to U.S. Provisional Patent Application Ser. No. 60/931,488, filed May 23, 2007, and also is a continuation-in-part of U.S. patent application Ser. No. 11/743,085, filed May 1, 2007, now abandoned, which is a continuation-in-part of U.S. patent application Ser. No. 11/688,087, filed Mar. 19, 2007, now abandoned, which is a continuation-in-part of U.S. patent application Ser. No. 11/641,956, filed Dec. 20, 2006, now abandoned, each of which is incorporated by reference in its entirety for all purposes.

BACKGROUND

The present disclosure relates to memory devices, and more particularly, to flash memory devices.

Non-volatile memory devices, such as flash memory devices, are memory devices that can store information even when not powered. A flash memory device stores information in a charge storage layer that is separated from a "control gate." A voltage is applied to the control gate to program and erase the memory device by causing electrons to be stored in, and discharged from the charge storage layer.

A control dielectric is used to isolate the control gate from the charge storage layer. It is desirable for the control dielectric to block charge flow between the charge storage layer and control gate. High-k dielectric layers can serve as efficient charge-blocking layers. They have been used as the control dielectric layer for flash memory devices, such as Samsung's TANOS devices, to enable the down-scaling of flash memory devices below 40 nm. The control dielectric layer may be a single layer of $Al_2O_3$, typically with a thickness of less than 20 nm. However, $Al_2O_3$ does not completely block charge transport and leads to program and erase saturation at lower voltage windows.

What is needed are improved, longer lasting non-volatile memory devices, with improved charge blocking characteristics. Furthermore, multi-state memory devices exist, which can store more than one bit of information per memory cell. What is needed are improved multi-state memory devices that can store multiple bits per cell with relatively large program/erase voltage windows of operation.

BRIEF SUMMARY OF THE INVENTION

Described herein are gate stacks for nonvolatile memory devices that may provide advantages over existing devices and methods.

According to one embodiment, the gate stack of the memory device comprises: a charge storage layer on a tunneling dielectric layer; a first dielectric layer comprising a high-k dielectric material on the charge storage layer; a second dielectric layer comprising $SiO_2$ on the first dielectric layer; a third dielectric layer comprising SiN on the second dielectric layer; a fourth dielectric layer comprising $SiO_2$ on the third dielectric layer, and a fifth dielectric layer comprising a high-k dielectric material on the fourth dielectric layer.

According to second embodiment, the gate stack comprises: a charge storage layer comprising localized charge traps on a tunneling dielectric layer; a first dielectric layer comprising $SiO_2$ on the charge storage layer; a second dielectric layer comprising SiN on the first dielectric layer; a third dielectric layer comprising $SiO_2$ on the second dielectric layer, and a fourth dielectric layer comprising a high-k dielectric material on the third dielectric layer.

According to a third embodiment, the gate stack comprises: a charge storage layer comprising nanocrystals on a tunneling dielectric layer; a first charge blocking layer on the charge storage layer, the first charge blocking layer comprising hafnium; a control dielectric layer including a first oxide layer on the first charge blocking layer; a nitride layer on the first oxide layer; and a second oxide layer on the nitride layer, and a second charge blocking layer on the control dielectric layer, the second charge blocking layer comprising hafnium.

BRIEF DESCRIPTION OF THE DRAWINGS/FIGURES

FIGS. 10A-10C and 11A-11D show plots related to a program/erase window for various gate stacks having one or more charge blocking layers, according to various embodiments;

In the drawings, like reference numbers indicate identical or functionally similar elements. Additionally, the left-most digit(s) of a reference number generally identifies the drawing in which the reference number first appears.

DETAILED DESCRIPTION

Introduction

Figure 1:
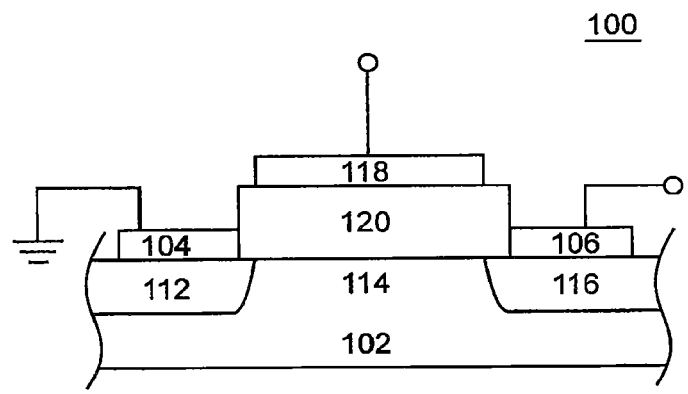
FIG. 1 shows a cross-sectional view of a memory device.

It should be appreciated that the particular implementations shown and described herein are exemplary and are not intended to otherwise limit the scope of the present invention in any way. Indeed, for the sake of brevity, conventional electronics, manufacturing, semiconductor devices, and other functional aspects of the systems (and components of the individual operating components of the systems) may not be described in detail herein.

It should be understood that the spatial descriptions (e.g., "above," "below," "up," "down," "top," "bottom," etc.) made herein are for purposes of illustration only, and that devices described herein can be spatially arranged in any orientation or manner.

The terms "adjacent," "on," "over," and "overlying," as used herein to describe the relationship of one layer to another layer, are intended to be interpreted broadly to include layers in direct contact with one another and layers spaced apart by one or more intervening layers. Similarly, the term "between" is intended to be interpreted broadly to include a layer that is directly between two other layers or spaced apart from two other layers but still intermediate the two other layers.

Memory Device Embodiments

Embodiments of the present invention are provided in the following sub-sections for electronic devices, such as non-volatile memory devices, including flash memory devices. Furthermore, embodiments for enhanced memory devices, such as multistate memory devices, are described. These embodiments are provided for illustrative purposes, and are not limiting. The embodiments described herein may be combined in any manner. Additional operational and structural embodiments will be apparent to persons skilled in the relevant art(s) from the description herein. These additional embodiments are within the scope and spirit of the present invention.

A conventional charge storage layer memory cell or structure is programmed by applying appropriate voltages to the source, drain, and control gate nodes of the memory structure for an appropriate time period. Electrons are thereby caused to tunnel or be injected (e.g., via channel hot electrons) from a channel region to a charge storage layer, which is thereby "charged." The charge stored in the charge storage layer sets the memory transistor to a logical "1" or "0." Depending on whether the memory structure includes an enhancement or depletion transistor structure, when the charge storage layer is positively charged or contains electrons (negative charge), the memory cell will or will not conduct during a read operation. When the charge storage layer is neutral (or positively charged) or has an absence of negative charge, the memory cell will conduct during a read operation by a proper choice of the gate voltage. The conducting or non-conducting state is output as the appropriate logical level. "Erasing" is the process of transferring electrons from the charge storage layer (or holes to the charge storage layer) (i.e., charge trapping layer). "Programming" is the process of transferring electrons onto the charge storage layer.

The enhancement of performance and charge retention properties of nonvolatile memory devices using metal or semiconductor nanocrystals (such as colloidal quantum dots or quantum dots formed using processes such as chemical vapor deposition or physical vapor deposition) or nonconductive nitride based charge trapping layers embedded in a high-k dielectric matrix, may be important to overcome the scaling limitations of conventional non-volatile memories beyond the 50 nm technology node and to fully enable reliable multi-bit operation.

FIG. 1 shows a detailed cross-sectional view of a memory device 100, according to an exemplary embodiment. As shown in FIG. 1, memory device 100 is formed on a substrate 102. Memory device 100 includes source region 112, channel region 114, drain region 116, a control gate or gate contact 118, a gate stack 120, a source contact 104, a drain contact 106. Source region 112, channel region 114, and drain region 116 are configured generally similar to a transistor configuration. Gate stack 120 is formed on channel region 114. Gate contact 118, which may alternatively be referred to as a control gate or gate electrode, is formed on gate stack 120.

Memory device 100 generally operates as described above for conventional memories having charge storage layers. However, charge storage layer memory device 100 includes gate stack 120. Gate stack 120 provides a charge storage layer for memory device 100, and further features, as further described below. When memory device 100 is programmed, electrons are transferred to, and stored by, the charge storage layer of gate stack 120. Gate stack 120 may include any type of charge storage layer or charge storage medium. Exemplary charge storage layers are described below.

In the current embodiment, substrate 102 is a semiconductor type substrate, and is formed to have either P-type or N-type conductivity, at least in channel region 114. Gate contact 118, source contact 104, and drain contact 106 provide electrical connectivity to memory device 100. Source contact 104 is formed in contact with source region 112. Drain contact 106 is formed in contact with drain region 116.

Source and drain regions 112 and 116 are typically doped regions of substrate 102 that have a conductivity different from that of channel region 114.

As shown in FIG. 1, source contact 104 is coupled to a potential, such as a ground potential. Drain contact 106 is coupled to another signal. Note that source and drain regions 112 and 116 are interchangeable, and their interconnections may be reversed.

Figure 2:
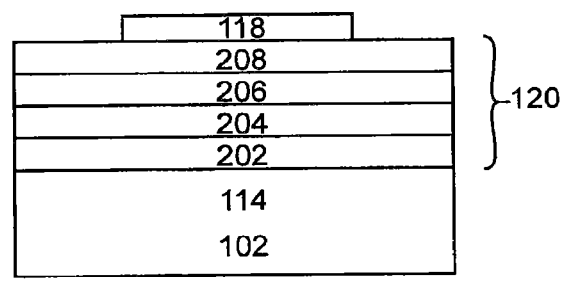
FIGS. 2-3 show cross-sectional views of a gate stack of a memory device according to two embodiments.

FIG. 2 shows a cross-sectional view of gate stack 120, according to one exemplary embodiment. In FIG. 2, gate stack 120 includes a tunneling dielectric layer 202, a charge storage layer 204, a charge blocking layer 206, and a control dielectric layer 208. In the example of FIG. 2, tunneling dielectric layer 202 is formed on channel region 114 of substrate 102 of memory device 100. Charge storage layer 204 is formed on tunneling dielectric layer 202. Charge blocking layer 206 is formed on charge storage layer 204. Control dielectric layer 208 is formed on charge blocking layer 206. As shown in FIG. 2, gate contact 118 is formed on control dielectric layer 208. Alternatively, the charge blocking layer 206 may be formed on the control dielectric layer 208, and the gate contact 118 may be formed on the charge blocking layer 206, as shown in FIG. 11. Note that in exemplary embodiments, one or more further layers of material may separate the layers of gate stack 120 and/or may separate gate stack 120 from substrate 102 and/or gate contact 118.

Charge storage layer 204 stores a positive or negative charge to indicate a programmed state of memory device 100, as described above. Charge storage layer 204 may include the materials described above, or otherwise known. During programming, a voltage applied to gate contact 118 creates an electric field that causes electrons to tunnel (e.g., or via hot electron injection) into charge storage layer 204 from channel region 114 through tunneling dielectric layer 202. The resulting negative charge stored in charge storage layer 204 shifts a threshold voltage of memory device 100. The charge remains in charge storage layer 204 even after the voltage is removed from gate contact 118. During an erase process, an oppositely charged voltage may be applied to gate contact 118 to cause electrons to discharge from charge storage layer 204 to substrate 102 through tunneling dielectric layer 202 or draws holes from the channel 114 to tunnel through (or via channel hot holes) the tunnel dielectric layer 202 to the charge storage layer 204. Control dielectric layer 208 isolates the gate contact 118 from the charge blocking layer 206.

The gate contact 118 is preferably formed of a conductive material. For example, the gate contact 118 may be formed of polycrystalline silicon (polysilicon). In another example, the gate contact 118 may be formed of a metal or a material including one or more metals, such as, for example, one or more transition metals. Exemplary transition metals that may be suitable for the gate contact 118 include, but are not limited to: Ti, V, Cr, Mn, Fe, Co, Ni, Cu, Zn, Zr, Nb, Mo, Ru, Rh, Pd, Ag, Cd, Hf, Ta, W, Re, Os, Ir, Pt, Au, and Hg. According to one exemplary embodiment, the gate contact 118 may be formed of TaN.

Generally, the thickness of the gate contact 118 is in the range of from about 5 nm to about 5,000 nm. Preferably, the thickness is in the range of from about 10 nm to about 500 nm. According to one exemplary embodiment, the gate contact 118 may include a plurality of sublayers. Each sublayer may be formed of a different conductive material.

The gate contact 118 may be formed by vapor deposition techniques known in the art. Physical vapor deposition (PVD) techniques, such as sputtering or thermal evaporation, chemical vapor deposition (CVD), or atomic layer deposition (ALD) may be suitable for deposition of the gate contact 118.

The charge storage layer 204 may include any type of charge storage medium. Preferably, the charge storage layer 204 is a localized charge storage layer that includes a plurality of discrete charge storage elements. The discrete charge storage elements may be one or more localized charge traps, such as those found in a nitride layer, or semiconducting, metallic, or dielectric nanoparticles (quantum dots). For example, charge storage layer 204 may include nanocrystals formed of a high work function (e.g., greater than 4.5 eV) metal such as ruthenium (Ru), and preferably having a size of less than about 5 nm. Such nanocrystals may be deposited on tunneling dielectric layer 202 by a variety of processes, such as chemical vapor deposition (CVD), atomic layer deposition (ALD) or physical vapor deposition (PVD), as is known in the art. Charge storage layer 204 may also include preformed colloidal metal or semiconductor or dielectric quantum dots (nanocrystals) deposited on tunneling dielectric layer 202. For example, such materials may be deposited by methods such as spin coating, spray coating, printing, chemical assembly, nano-imprints using polymer self-assembly and the like, such as described in U.S. Pat. No. 6,586,785, U.S. patent application Ser. No. 11/147,670, and U.S. patent application Ser. No. 11/495,188, which are each incorporated by reference herein in their entirety. Charge storage layer 204 may also include a contiguous metal or semiconductor conductive layer, a non-contiguous metal or semiconductor conductive layer, a nonconductive nitride-based or other types of insulating charge trapping layer, a nonconductive oxide layer (e.g., $SiO_2$) having conductive elements disposed therein (e.g., silicon islands), a doped oxide layer, etc. For further description of charge storage layers that include nitrides, refer to U.S. Pat. No. 5,768,192, which is incorporated by reference herein in its entirety. According to one exemplary embodiment, the charge storage layer may have a U-shape when viewed in cross-section along a word line direction of the memory cell.

Figure 3:
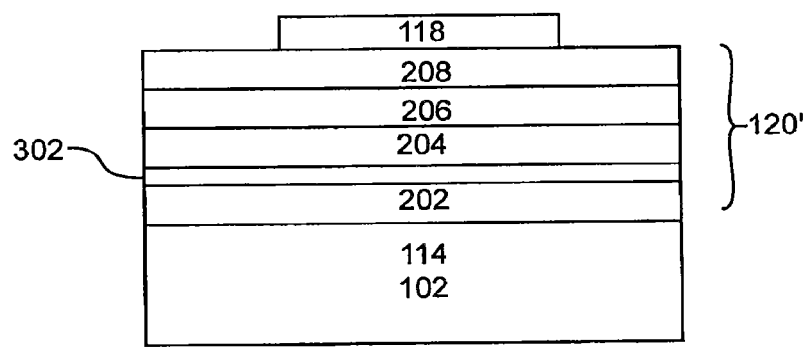

A surface of tunneling dielectric layer 202 (also referred to as "tunnel dielectric layer") may be altered in order to provide an improved barrier to metal migration when metal quantum dots such as ruthenium (or other metal or alloy) are used for the charge storage material. For example, as shown in FIG. 3, gate stack 120' may include a barrier layer 302 formed on tunneling dielectric layer 202 between tunneling dielectric layer 202 and charge storage layer 204. Barrier layer 302 can include, for example, a nitrogen containing compound such as nitride ($Si_3N_4$) or silicon oxynitride ($SiO_xN_y$, wherein x and y are positive numbers, 0.8, 1.5, etc., or other suitable barrier layer such as alumina ($Al_2O_3$). Barrier layer 302 changes the surface structure of tunneling dielectric layer 202 such that metal migration effects may be minimized. Where barrier layer 302 is made from a nitrogen compound, the nitrogen-containing layer may be formed by adding nitrogen or a "nitrogen-containing" compound (e.g., "nitriding") to tunneling dielectric layer 202 (e.g., which may be $SiO_2$). In an exemplary embodiment, the nitrogen or nitrogen-containing compound may be deposited on tunneling dielectric layer 202 using a chemical vapor deposition (CVD) process, such as low pressure CVD (LPCVD) or ultra high vacuum CVD (UHVCVD). The nitrogen-containing layer may be in direct contact with tunneling dielectric layer 202.

UHVCVD of barrier layer 302 may be more controllable than LPCVD, as the UHVCVD generally occurs more slowly, and therefore the growth rate may be more closely regulated. The nitrogen-containing layer may be formed as a result of deposition from the reaction of such gases as silane (or other silicon source precursor such as dichlorosilane, or disilane) and ammonia (or other nitrogen species such as plasma-ionized nitrogen, $N_2O$ or NO), or a surface reaction to a reacting gas such as ammonia (or other nitrogen species such as plasma-ionized nitrogen, $N_2O$ or NO). Dichlorosilane and ammonia gas in combination with a co-flow of some inert gas and oxygen-containing gas may be used for growth of the nitrogen-containing layer. Barrier layer 302 impedes penetration of metal nanoparticles/quantum dots of charge storage layer 204 into tunneling dielectric layer 202, such that contamination of tunnel dielectric layer 202, which may result in leakage, is avoided.

A thickness of barrier layer 302 is preferably configured to ensure that carrier traps included in nitride structures do not dominate the charge storage aspects of the semiconductor device being formed. In an exemplary embodiment, a desired thickness for barrier layer 302 is less than about 10 angstroms. In further embodiments, the desired thickness may be about 5 angstroms or less. The relative thicknesses of tunneling dielectric layer 202 and barrier layer 302 can be tailored to optimize electrical performance and metal migration barrier functions. The thickness of barrier layer 302 should be at least that required to ensure generally uniform coverage of tunneling dielectric layer 202 by barrier layer 302. Preferably, the barrier layer 302 is at least about 1 angstrom in thickness. In an exemplary embodiment where silicon oxynitride is utilized as barrier layer 302, the concentration of nitrogen within the silicon oxynitride may be greater than about 5%, for example. A percentage concentration of nitrogen included in the silicon oxynitride can be controlled such that the trade-off between the barrier function of the nitrogen layer against metal migration from metal quantum dots (when in charge storage layer 204) and the inclusion of traps due to nitride concentration is regulated.

In an exemplary embodiment, the tunneling dielectric layer 202 is $SiO_2$ and the substrate 102 is silicon. The control dielectric layer 208 may be formed of a single component oxide, such as, for example, $Al_2O_3$ or $SiO_2$. It is believed that $SiO_2$ may be advantageous as the control dielectric layer 208 because it poses a high energy barrier to electron tunneling (e.g., see FIG. 4B). Also, $SiO_2$ contains few charge traps, and it is believed that those present in the layer are sufficiently deep that they do not hamper the charge retention of the device. According to an alternative embodiment, the control dielectric layer 208 may be formed of a multicomponent material such as a multicomponent oxide. According to one embodiment, the multicomponent oxide may be a silicate. Exemplary silicates include $Hf_xSi_{1-x}O_y$, $Zr_xSi_{1-x}O_y$, and $Hf_x$-$Al_ySi_zO$, where x is a positive number between 0 and 1, and y and z are positive numbers.

It is preferred that the control dielectric layer 208 have a thickness of no more than about 20 nm. The thickness of the control dielectric layer is believed to be important due to the scaling of new generations of memory devices to smaller lateral dimensions. As the channel length and device width of a memory cell reduce to below about 30 nm, it is desirable to reduce the thickness of the dielectric layer to less than the channel length such that the control gate can maintain the coupling to the charge storage layer. According to an exemplary embodiment, the control dielectric layer 208 is about 15 nm or less in thickness. The control dielectric layer 208 may also be about 10 nm or less in thickness. According to a preferred embodiment, the control dielectric layer 208 has a thickness of about 5 nm or less. For example, the control dielectric layer 208 may be about 4 nm or less in thickness, about 3 nm or less in thickness, about 2 nm or less in thickness, or about 1 nm or less in thickness. It is also preferred that the thickness of the control dielectric layer 208 is at least that required to ensure generally uniform coverage of the underlying layer. Accordingly, the thickness of the control dielectric layer 208 is preferably at least about 0.1 nm.

Preferably, the thickness of the control dielectric layer 208 is no more than about 200% of a thickness of the charge blocking layer 206. More preferably, the thickness of the control dielectric layer 208 is no more than about 150% of the thickness of the charge blocking layer 206. For example, according to one exemplary embodiment, the thickness of the charge blocking layer 206 is about 4 nm, and the thickness of the control dielectric layer 208 is about 5 nm or about 125% of the thickness of the charge blocking layer 206. In other exemplary embodiments, the thickness of the control dielectric layer 208 is no more than about 125% of the thickness of the charge blocking layer 206, or no more than about 100% of the thickness of the charge blocking layer 206. It is also contemplated that the thickness of the control dielectric layer 208 may be less than the thickness of the charge blocking layer 206.

In an exemplary embodiment, charge blocking layer 206 is formed of a high-k dielectric material. For the purposes of this disclosure, a high-k dielectric material has a dielectric constant higher than that of $SiO_2$ (e.g., 3.9). The high-k dielectric material of the charge blocking layer 206 may be, for example, $Al_2O_3$, $HfO_2$, $HfSiO_2$, $ZrO_2$, $Hf_{1-x}Al_xO_y$, where x is a positive number between 0 and 1, and y is a positive number, e.g., $HfAlO_3$, etc., preferably $HfO_2$ or $Hf_{1-x}Al_xO_y$, where x is a positive number between 0 and 1, and y is a positive number, e.g., $HfAlO_3$. In further embodiments, charge blocking layer 206 may be formed of other high-k dielectric materials, such as $Gd_2O_3$, $Yb_2O_3$, $Dy_2O_3$, $Nb_2O_5$, $Y_2O_3$, $La_2O_3$, $ZrO_2$, $TiO_2$, $Ta_2O_5$, $SrTiO_3$, $Ba_xSr_{1-x}TiO_3$, $Zr_xSi_{1-x}O_y$, $Hf_xSi_{1-x}O_y$, $Al_xZr_{1-x}O_2$, or $Pr_2O$, for example.

In exemplary embodiments, charge blocking layer 206 has a higher dielectric constant than control dielectric layer 208. For example, in one embodiment, control dielectric layer 208 is $Al_2O_3$, which has a dielectric constant of approximately 9, and charge blocking layer 206 is $HfO_2$, which has a dielectric constant of less than about 25, e.g., around 22, when deposited. In another embodiment, control dielectric layer 208 is $SiO_2$, which has a dielectric constant of approximately 4, while charge blocking layer is $HfO_2$.

Figure 4A:
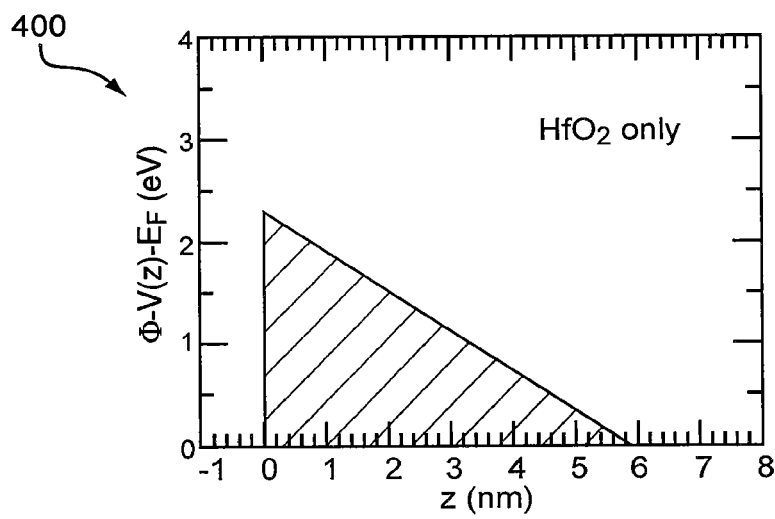
FIGS. 4A-4C are schematics showing the energy barrier to electron tunneling posed by dielectric layers according to several embodiments.
Figure 4B:
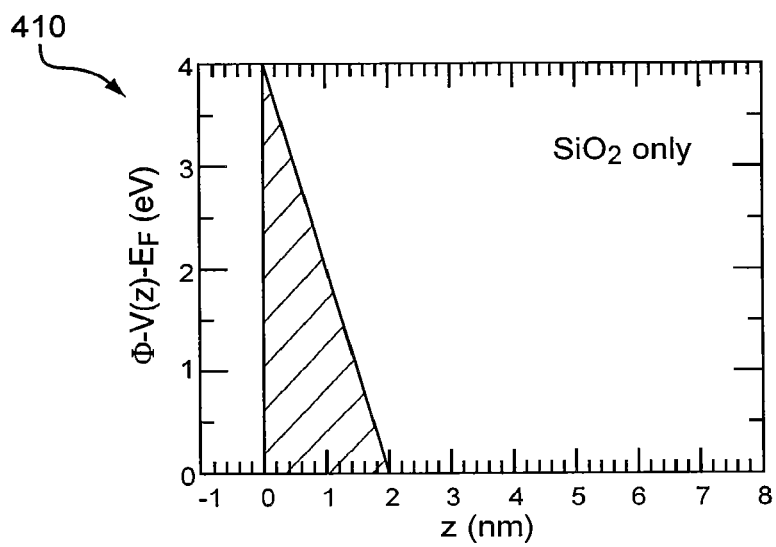
Figure 4C:
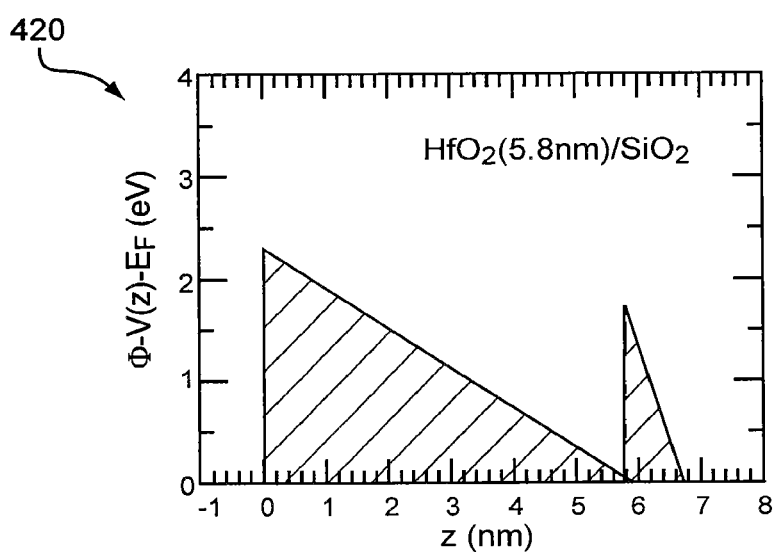

FIGS. 4A-4C include plots 400, 410, 420 showing schematically how including a dielectric layer of a higher dielectric constant (e.g., the charge blocking layer 206) adjacent to a dielectric layer of a lower dielectric constant (e.g., the control dielectric layer 208) may improve tunneling resistance. The plot 400 of FIG. 4A shows the energy barrier (eV) of a dielectric layer having a higher dielectric constant (e.g., $HfO_2$) alone, and the plot 410 of FIG. 4B shows the energy barrier of a dielectric layer having a lower dielectric constant (e.g., $SiO_2$) alone. The lower k-dielectric layer ($SiO_2$) provides a higher energy barrier to tunneling than does the higher-k dielectric layer ($HfO_2$), but the higher-k dielectric layer ($HfO_2$) provides a wider barrier. The plot 420 of FIG. 4C shows the improvement in the magnitude of the tunneling barrier when the higher-k dielectric layer (e.g., $HfO_2$) is disposed adjacent to the lower-k dielectric layer (e.g., $SiO_2$). Accordingly, tunneling current may be reduced. Any combination of higher-k and lower-k dielectrics may be suitable for the charge blocking layer 206 and the control dielectric layer 208. Preferably, as noted above, the charge blocking layer 206 has the higher dielectric constant (e.g., lower barrier height), and the control dielectric layer 208 has the lower dielectric constant (e.g., higher barrier height).

In an exemplary embodiment, charge blocking layer 206 may include a gradient of composition, band gap value and/or dielectric constant through a thickness of the layer 206. The gradient may increase or decrease from a first surface of charge blocking layer 206 (e.g., a surface of charge blocking layer 206 adjacent to charge storage layer 204) to a second surface of charge blocking layer 206 (e.g., a surface of charge blocking layer 206 adjacent to control dielectric layer 208).

For example, the charge blocking layer 206 having a gradient of composition may comprise a dielectric material, and an amount of at least one component of the dielectric material may vary across the thickness of the charge blocking layer 206. Preferably, the dielectric material is a high-k dielectric material. The amount of the component may vary linearly, nonlinearly, or step-wise across the thickness of the charge blocking layer 206. Preferably, the amount of the component is a minimum near the control dielectric layer 208 and increases across the thickness of the charge blocking layer 206. The component may be an element or a compound. For example, the component may be hafnium or hafnium oxide. According to an exemplary embodiment, the charge blocking layer 206 having a gradient of composition is formed of a multicomponent dielectric material. For example, the charge blocking layer 206 may be formed of a multicomponent oxide such as, $Hf_xAl_{1-x}O_y$, $Hf_xSi_{1-x}O_y$, $Zr_xSi_{1-x}O_y$, $Ba_xSr_{1-x}TiO_y$, or $Al_xZr_{1-x}O_y$. The multicomponent dielectric material may include the component (e.g., hafnium) and a second component, and a ratio of the component to the second component may vary across the thickness of the charge blocking layer 206, according to an exemplary embodiment. The multicomponent dielectric material may include nitrogen. For example, the multicomponent dielectric material may be $Hf_xSi_{1-x}O_{2-y}N_y$, according to an exemplary embodiment. The charge blocking layer 206 having a gradient of composition may be disposed between the charge storage layer 204 and the control dielectric layer 208, or between the control dielectric layer 208 and the gate contact 118 of the memory device 100.

Figure 5:
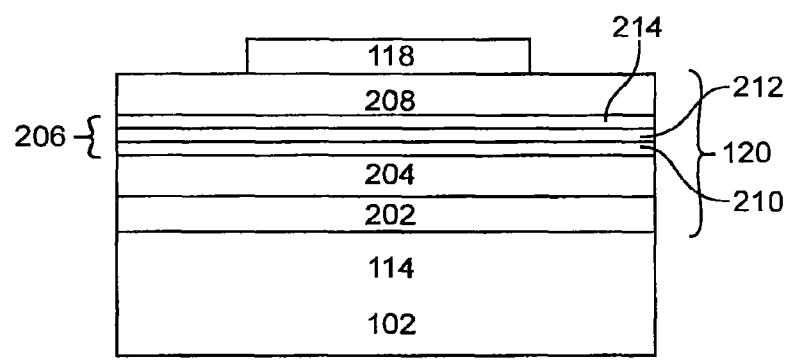
FIGS. 5-6 show cross-sectional views of a gate stack of a memory device according to other embodiments.

In another exemplary embodiment, charge blocking layer 206 comprises a plurality of layers of materials. FIG. 5 shows, for example, a charge blocking layer 206 including three layers. According to this exemplary embodiment, the charge blocking layer 206 includes a first layer 210 closest to the charge storage layer 204, a second (middle) layer 212, and a third layer 214 (furthest from the charge storage layer 204). According to one embodiment, the layer closest to charge storage layer 204 is formed of a relatively high band gap material, while the layer(s) further from charge storage layer 204 are formed of material(s) having a progressively lower band gap. This may be desirable when charge storage layer 204 comprises isolated particles (e.g., nanoparticles, quantum dots), because a relatively higher band gap material allows less tunneling between particles than a lower band gap material. $SiO_2$, $Al_2O_3$, $HfAlO_3$ are exemplary materials having relatively high band gap. As one of ordinary skill in the art would recognize, an alternative embodiment would include a layer closest to the charge storage layer 204 being formed of a relatively low band gap material, and layer(s) further from the charge storage layer 204 being formed of material(s) having a progressively higher band gap.

According to an exemplary three-layer embodiment for charge blocking layer 206, the first layer 210 may be $Al_2O_3$, the second (middle) layer 212 may be $HfAlO_3$, and the third layer 214 may be $HfO_2$ (which has a relatively low band gap). In an exemplary two-layer embodiment for charge blocking layer 206, the first layer (closest to charge storage layer 204) may be $SiO_2$, and the second layer may be $HfO_2$, which has a relatively high dielectric constant (for effective charge blocking) and a low band gap. As described above, control dielectric layer 208 may be a material such as $Al_2O_3$ or $SiO_2$.

In an exemplary embodiment, charge blocking layer 206 may be doped. For example, charge blocking layer 206 may be doped with dopant materials, such as a rare earth metal, transition metal, silicon, oxygen, or nitrogen. According to one exemplary embodiment, the charge blocking layer 206 may be $Hf_{1-x}Si_xO_{2-y}N_y$. The nitrogen may be introduced by a post deposition nitridation treatment. For example, a $Hf_{1-x}Si_xO_2$ layer may be annealed in an environment containing $NH_3$, $N_2O$, or NO to form the $Hf_{1-x}Si_xO_{2-y}N_y$ layer.

In an exemplary embodiment, charge blocking layer 206 is formed to be relatively thin, such as less than about 10 nm, e.g., less than about 5 nm, e.g., less than about 2 nm, to reduce trapping of electrons by the high dielectric material of charge blocking layer 206. Preferably, the charge blocking layer 206 has a thickness sufficient to ensure generally uniform coverage of the underlying layer. For example, the charge blocking layer 206 may be at least 0.1 nm thick. Preferably, the charge blocking layer 206 is at least 0.5 nm thick.

Figure 6:
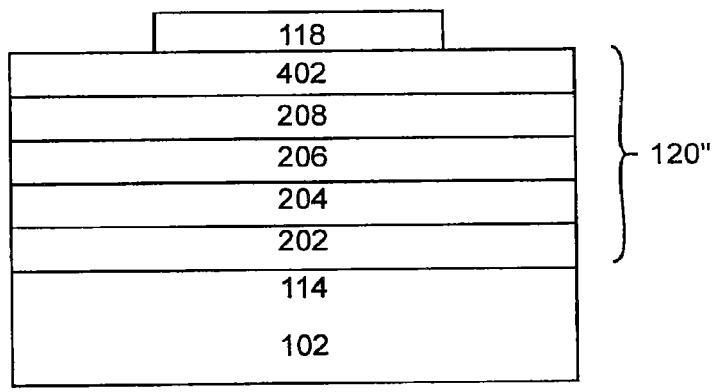

FIG. 6 shows another cross-sectional view of gate stack 120", according to an exemplary embodiment. The configuration of gate stack 120" in FIG. 6 is generally similar to FIG. 2, except that in FIG. 6, gate stack 120" further includes a second charge blocking layer 402 formed on control dielectric layer 208. In FIG. 6, gate contact 118 is formed on second charge blocking layer 402. In an exemplary embodiment, second charge blocking layer 402 is formed of a high-k dielectric material, such as $Al_2O_3$, $HfO_2$, $ZrO_2$, $Hf_{1-x}Al_xO_y$, where x is a positive number between 0 and 1, and y is a positive number, e.g., $HfAlO_3$, $Hf_{1-x}Si_xO_2$, $Hf_{1-x}Si_xO_{2-y}N_y$, etc., preferably $HfO_2$. The second charge blocking layer 402 may be formed of any of the materials described above for first charge blocking layer 206, and may be configured similarly, such as in a single layer configuration (uniform or gradient of material) or multi-layer configuration.

According to an exemplary embodiment in which the second charge blocking layer 402 includes a gradient of composition, the second charge blocking layer 402 may comprise a dielectric material, and an amount of at least one component of the dielectric material may vary across the thickness of the charge blocking layer 402. Preferably, the dielectric material is a high-k dielectric material. The amount of the component may vary linearly, nonlinearly, or step-wise across the thickness of the second charge blocking layer 402. Preferably, the amount of the component is a minimum near the control dielectric layer 208 and increases across the thickness of the second charge blocking layer 402. The component may be an element or compound. For example, the component may be hafnium or hafnium oxide.

According to an exemplary embodiment, the second charge blocking layer 402 having a gradient of composition is formed of a multicomponent dielectric material. For example, the second charge blocking layer 402 may be formed of a multicomponent oxide such as, $Hf_xAl_{1-x}O_y$, $Hf_xSi_{1-x}O_y$, $Zr_xSi_{1-x}O_y$, $Ba_xSr_{1-x}TiO_y$, or $Al_xZr_{1-x}O_y$. The multicomponent dielectric material may include the component (e.g., Hf) and a second component, and a ratio of the component to the second component may vary across the thickness of the second charge blocking layer 402, according to an exemplary embodiment. The multicomponent dielectric material may include nitrogen. For example, the multicomponent dielectric material may be $Hf_xSi_{1-x}O_{2-y}N_y$, according to an exemplary embodiment. The second charge blocking layer 402 having a gradient of composition may be disposed between the control dielectric layer 208 and the gate contact 118 of the memory device 100, or between the charge storage layer 204 and the control dielectric layer 208.

Charge blocking layers 206 and 402, which sandwich control dielectric layer 208, may efficiently block charge transport through control dielectric layer 208. For example, first charge blocking layer 206 (e.g., $HfO_2$) may block electron current from charge storage layer 204 to gate contact 118 during a programming operation. Second charge blocking layer 402 (e.g., $HfO_2$) may block electron current from gate contact 118 to charge storage layer 402 during an erase operation. In addition, the first and/or second charge blocking layers 206, 402 may have other functions. In an exemplary embodiment, the thicknesses of first and second charge blocking layers 206 and 402 are thin, such as less than 10 nm, e.g., less than 5 nm.

Another advantage of the first and second charge blocking layer 206 and 402 is that, although high-k dielectric layers can themselves have traps, first and second charge blocking layers 206 and 402 can be made very thin, such as less than about 4 nm, e.g., less than 2 nm, to reduce a total amount of charge traps while efficiently blocking current flow. Furthermore, second charge blocking layer 402 is positioned adjacent to gate contact 118. Thus, even if a relatively large amount of charge is trapped in second charge blocking layer 402, an effect on the flat-band voltage is proportional to a distance from second charge blocking layer 402 to gate contact 118, which is minimal (since they may be directly adjacent to (in contact with) each other).

Some further exemplary advantages of the embodiment of FIG. 6, where first and second charge blocking layers 206 and 402 are $HfO_2$, and control dielectric layer 208 is $Al_2O_3$, include:

1) An enhancement in the memory program/erase window may be achieved. As used herein, a program/erase (P/E) window is the voltage difference between threshold states of a program state and an erase state. With gate stack 120", memory device 100 can be erased (e.g., up to −6V), with a P/E window of 12.8V or greater. In exemplary embodiments, the P/E window may range from about 8 V to about 16 V (e.g., in ranges of from about 9 V to about 14V, about 10 V to about 13V, or have values of about 9 V, about 10 V, about 11V, about 12V, or about 13V). With scaling of tunneling dielectric layer 202 to 6 nm in a +/−20V P/E limit, the P/E window may be as large as 14.2V, approaching multi-state memory voltage requirements, such as for 3-bit or even 4-bit memory cells;

(2) The P/E window may not show significant drift after 100,000 P/E cycles; and (3) Charge may be retained in charge storage layer 204 at a 12V P/E window, and more importantly 100,000 P/E cycles may not degrade the charge retention characteristics.

Figure 21:
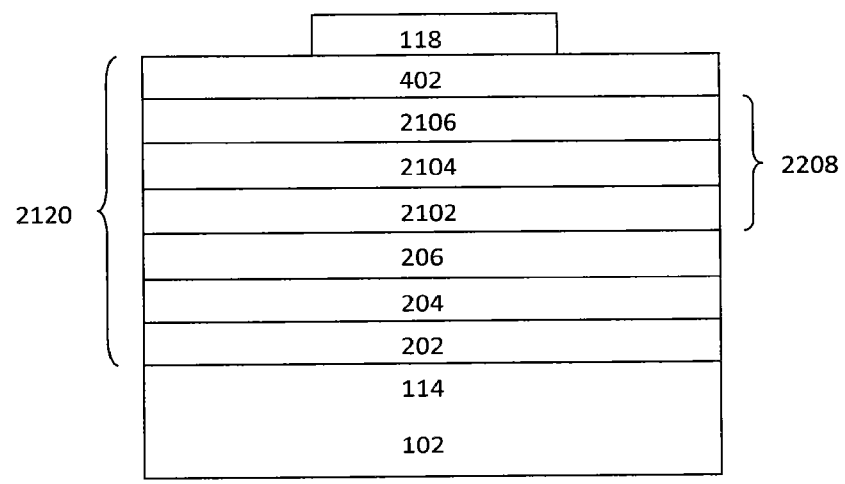
FIG. 21 is a cross-sectional view of an alternative embodiment of a gate stack of a memory device including a multilayer control dielectric.

The control dielectric layer may have a multilayer structure including two or more sublayers. For example, the control dielectric layer 2208 may include three sublayers. FIG. 21 shows an exemplary gate stack 2120 of a memory device that includes a tunneling dielectric layer 202, a charge storage layer 204 comprising localized charge traps or a continuous floating gate, a first charge blocking layer 206, a control dielectric layer 2208 including three sublayers 2102, 2104, 2106, and a second charge blocking layer 402 overlying the control dielectric layer 2208. Deposition techniques known in the art, such as chemical vapor deposition or atomic layer deposition, may be employed to form the control dielectric layer 2208 having the sublayer structure.

According to one exemplary embodiment, the control dielectric layer 2208 may have an ONO structure including a first oxide layer 2102, a nitride layer 2104 overlying the oxide layer 2102, and a second oxide layer 2106. The first oxide layer 2102 may be $SiO_2$, the nitride layer 2104 may be SiN, and the second oxide layer 2106 may be $SiO_2$. The thickness of each sublayer of the control dielectric layer 2208 is preferably about 4 nm or less, and more preferably about 3 nm or less. For example, the ONO layers may have the structure: $SiO_2$ (3 nm)/SiN (3 nm)/$SiO_2$ (3 nm).

A control dielectric layer 2208 having such a sublayer structure has been shown to be effective in combination with hafnium-based charge blocking layers 206, 402 and a nanodot charge storage layer 204 in providing a gate stack 2120 with excellent charge retention capabilities and program/erase characteristics. The control dielectric layer may also be effective in combination with a nitride trap storage layer and one or more charge blocking layers, as will be discussed further below. In addition, the physical layer thickness of the gate stack may be reduced for the same EOT when ONO layers are employed as the control dielectric layer instead of a single aluminum oxide layer, for example. Another advantage of using ONO layers is that they may be readily etched without damaging the sidewalls of the gate stack.

Figure 22A:
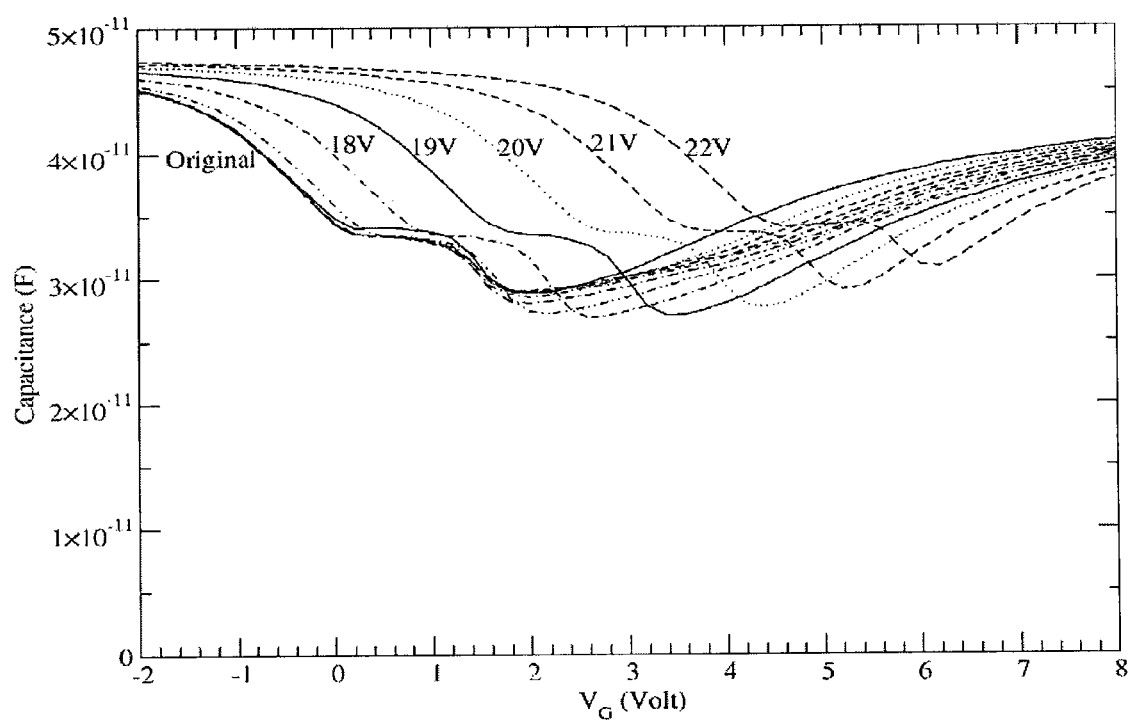
FIGS. 22A-22B are capacitance-voltage curves obtained from programming and erase operations on an embodiment of the gate stack of FIG. 21 where the high-k dielectric layers are 4 nm of $HfO_2$.
Figure 22B:
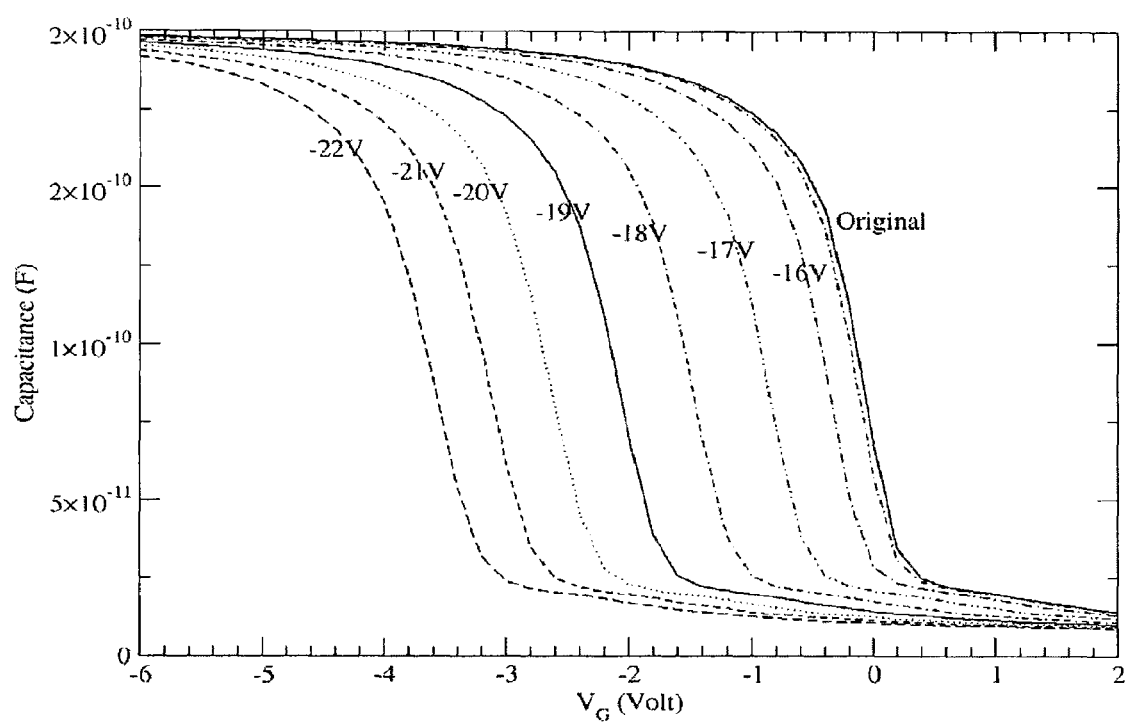

FIGS. 22A and 22B show program and erase characteristics, respectively, for a gate stack ("gate stack A") including an 8 nm $SiO_2$ tunneling dielectric layer 202, Ru nanocrystals as the charge storage layer 204, a 4 nm hafnium oxide layer as the first charge blocking layer 206, an ONO stack of $SiO_2$ (3 nm)/SiN (3 nm)/$SiO_2$ (3 nm) as the control dielectric layer 2208, and a 4 nm hafnium oxide layer as the second charge blocking layer 402. Each capacitance versus voltage (C-V) curve represents a shift of ±1V in gate voltage compared to the previous curve, for a ±12V to ±22V sweep, with capacitance given in farads. A 1V step size, which is nearly achieved during the programming operation, may be obtained with ideal charge blocking behavior.

Figure 23A:
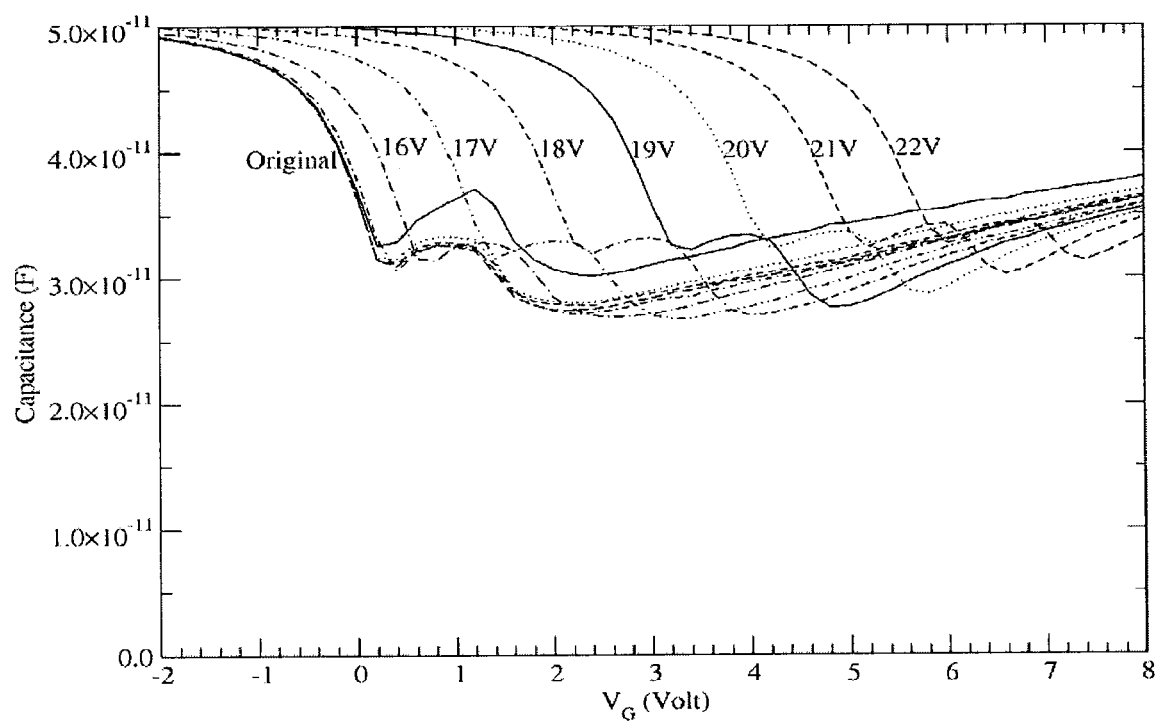
FIGS. 23A-23B are capacitance-voltage curves obtained from programming and erase operations on an embodiment of the gate stack of FIG. 21 where the high-k dielectric layers are 2 nm of $HfO_2$.
Figure 23B:
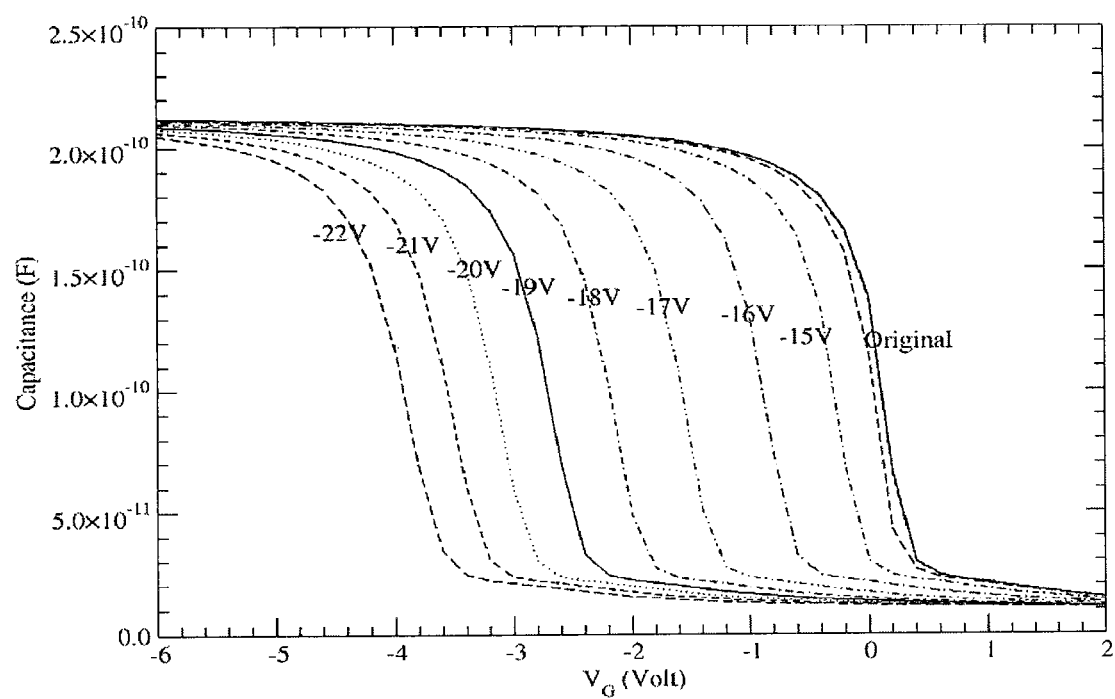

FIGS. 23A and 23B show program and erase characteristics, respectively, for a gate stack ("gate stack B") including an 8 nm $SiO_2$ tunneling dielectric layer 202, Ru nanocrystals as the charge storage layer 204, a 2 nm hafnium oxide layer as the first charge blocking layer 206, an ONO stack of $SiO_2$ (3 nm)/SiN (3 nm)/$SiO_2$ (3 nm) as the control dielectric layer 2208, and a 2 nm hafnium oxide layer as the second charge blocking layer 402. As in FIGS. 22A and 22B, each C-V curve represents a shift of ±1V in gate voltage for a ±12V to ±22V sweep, and capacitance is shown in farads. A roughly 1V step size between the curves is attained during the programming operation.

Figure 24A:
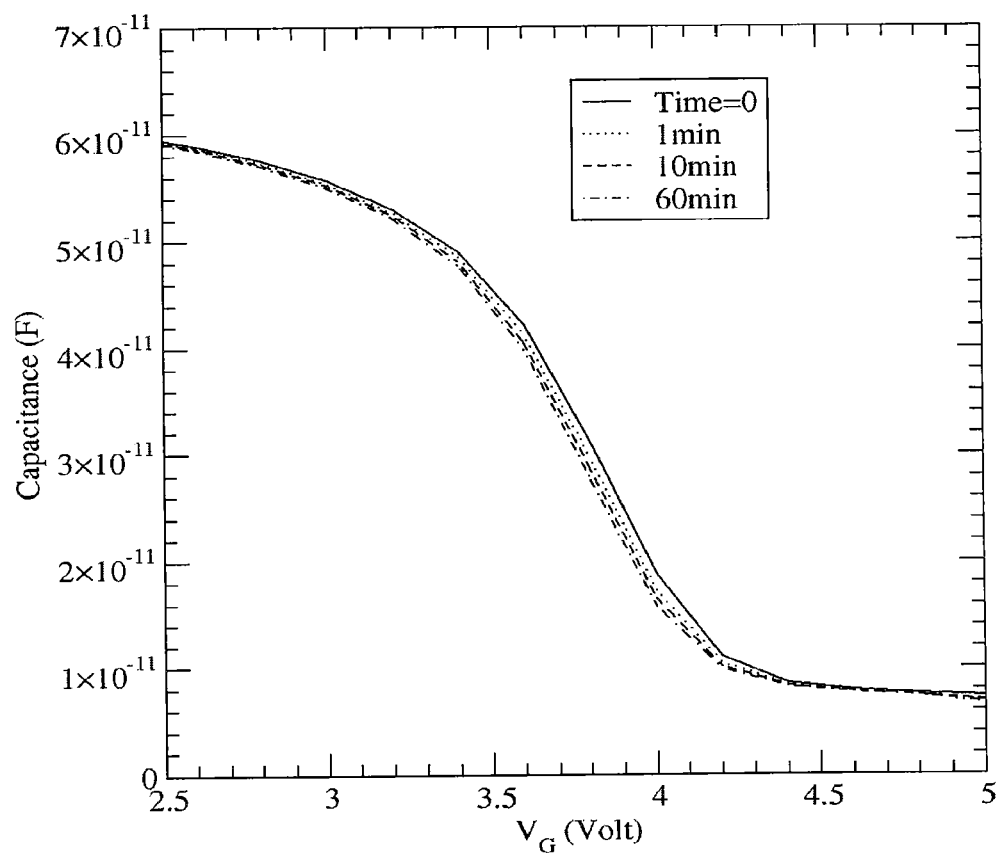
FIGS. 24A-24B are capacitance-voltage curves obtained from charge retention tests of an embodiment of the gate stack of FIG. 21 where the high-k dielectric layers are 4 nm of $HfO_2$.
Figure 24B:
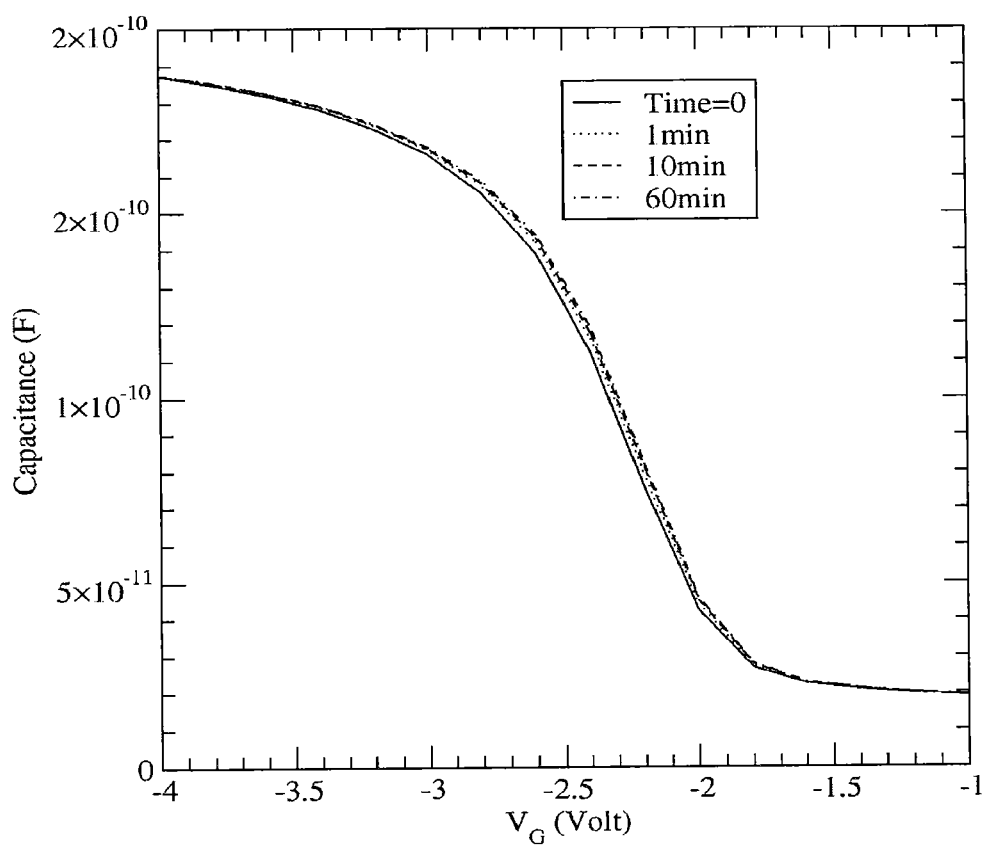
Figure 25A:
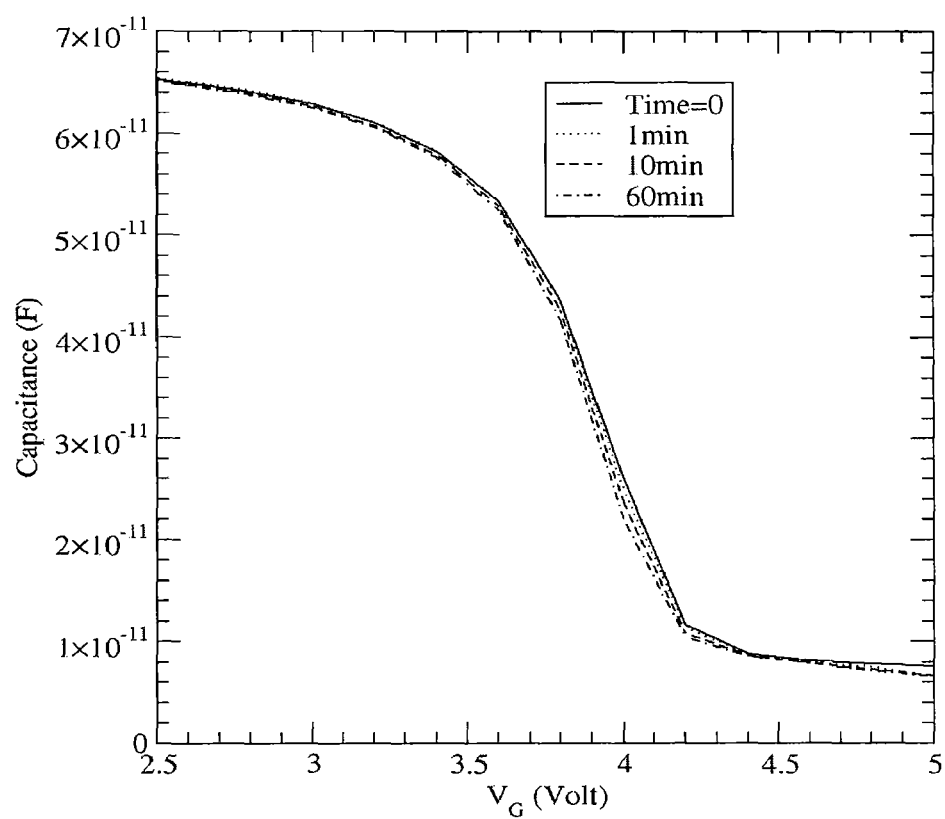
FIGS. 25A-25B are capacitance-voltage curves obtained from charge retention tests of an embodiment of the gate stack of FIG. 21 where high-k dielectric layers are 2 nm of $HfO_2$.
Figure 25B:
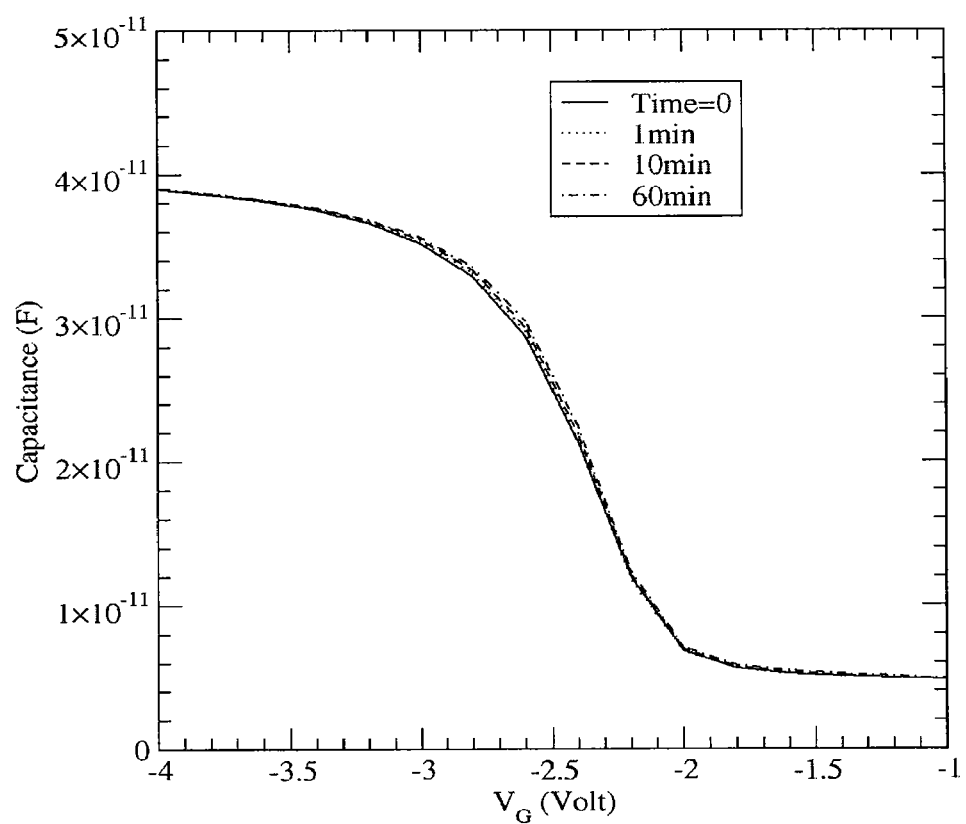
Figure 26:
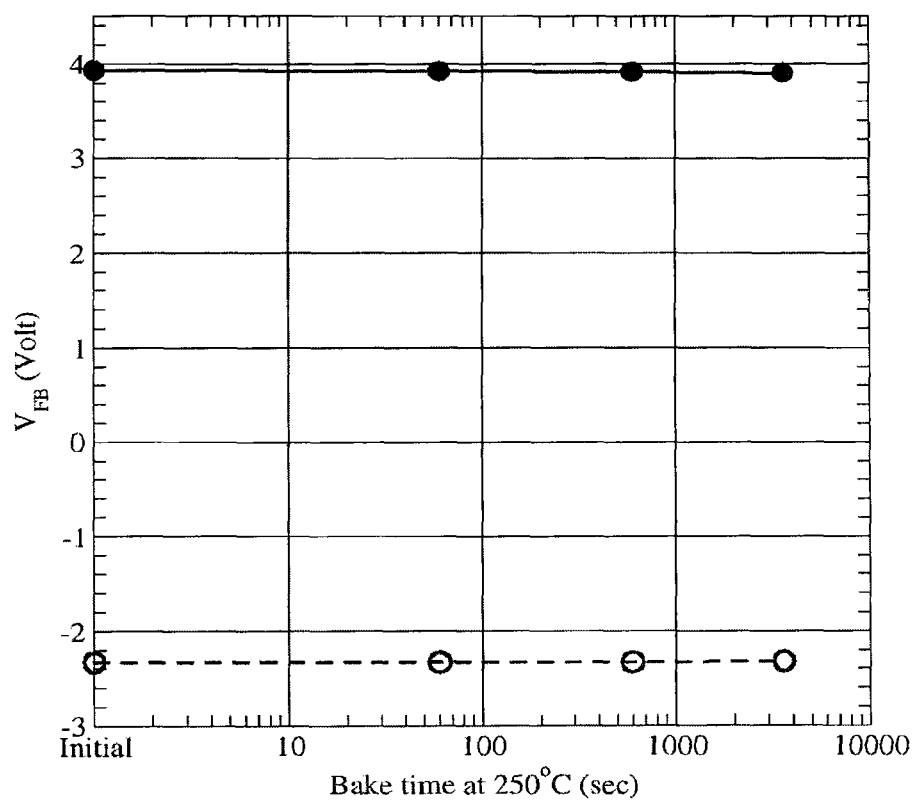
FIG. 26 shows charge retention of an embodiment of the gate stack of FIG. 21 over time for both programming (upper data set) and erase (lower data set) states where the high-k dielectric layers are 2 nm of $HfO_2$.

The C-V curves of FIGS. 24A-24B show charge retention characteristics for gate stack A immediately after programming (FIG. 24A) and erase (FIG. 24B) operations at 250° C., and then after 1 min, 10 min, and 60 min. These test conditions were employed to simulate charge retention over a much longer period (e.g., up to ten years) at room temperature. FIGS. 25A-25B show charge retention characteristics for gate stack B under the same conditions after programming (FIG. 25A) and erase (FIG. 25B) operations. The charge retention of gate stack B at 250° C. is shown as a function of time in FIG. 26. For both program and erase states, the change in the flat band voltage ($\Delta V_{FB}$) is less than 0.1 V after 60 minutes at 250° C.

Figure 27:
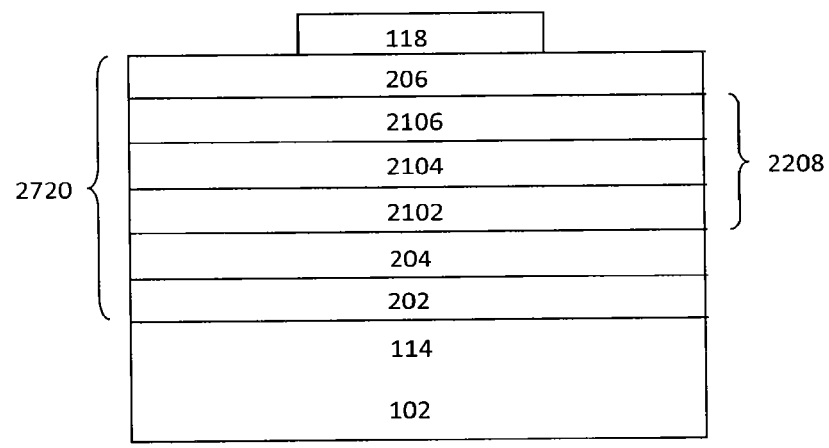
FIG. 27 is a cross-sectional view of an alternative embodiment of a gate stack of a memory device including a multilayer control dielectric.

Referring to FIG. 27, the control dielectric layer may 2208 may be part of a gate stack including a nitride trap (e.g., SiN) charge storage layer. FIG. 27 shows an exemplary gate stack 2720 of a memory device that includes a tunneling dielectric layer 202, a nitride charge storage layer 204 including localized charge traps, the control dielectric layer 2208 including three sublayers 2102, 2104, 2106, and a charge blocking layer 206 overlying the control dielectric layer. As in the gate stack embodiment of FIG. 21, the control dielectric layer 2208 may have an ONO structure including a first oxide layer 2102, a nitride layer 2104 overlying the oxide layer 2102, and a second oxide layer 2106. The first oxide layer 2102 may be SiO$_2$, the nitride layer 2104 may be SiN, and the second oxide layer 2106 may be SiO$_2$. The thickness of each sublayer of the control dielectric layer 2208 is preferably about 4 nm or less, and more preferably about 3 nm or less. For example, the ONO layers may have the structure: SiO$_2$ (3 nm)/SiN (3 nm)/SiO$_2$ (3 nm).

The control dielectric layer 2208 of the exemplary gate stacks 2120, 2720 of FIGS. 21 and 27 is not limited to an ONO stack. The control dielectric layer 2208 may include, for example, one or more silicate layers, such as Hf$_x$Si$_{1-x}$O$_y$, Al$_x$Si$_{1-x}$O$_y$, Zr$_x$Si$_{1-x}$O$_y$, and Hf$_x$Al$_y$Si$_z$O, where x is a positive number between 0 and 1, and y and z are positive numbers. According to one exemplary embodiment, the control dielectric layer 2208 may include a central layer 2104 comprising a metal silicate sandwiched between two oxide layers 2102, 2106. For example, the control dielectric layer 2208 may have the structure HfO$_2$/HfSiO/HfO$_2$. According to another exemplary embodiment, the control dielectric layer 2208 may be comprised entirely of metal silicate sublayers 2102, 2104, 2106, such as HfSiO/AlSiO/HfSiO.

The charge blocking layer 206 of FIG. 27, and each of the first and second charge blocking layers 206, 402 of FIG. 21, are preferably formed of a high-k dielectric material. According to one embodiment, the high-k dielectric material may be a single component oxide such as HfO$_2$. Alternatively, according to another embodiment, the high-k dielectric material may be a multicomponent oxide such as a metal silicate (e.g., hafnium silicate or aluminum silicate). Suitable materials for the first and second charge blocking layers may include: Al$_2$O$_3$, HfO$_2$, ZrO$_2$, Gd$_2$O$_3$, Yb$_2$O$_3$, Dy$_2$O$_3$, Nb$_2$O$_5$, Y$_2$O$_3$, La$_2$O$_3$, ZrO$_2$, TiO$_2$, Ta$_2$O$_5$, Pr$_2$O, SrTiO$_3$, Ba$_x$Sr$_{1-x}$TiO$_3$, Zr$_x$Si$_{1-x}$O$_y$, Hf$_x$Si$_{1-x}$O$_y$ (e.g., HfSiO$_4$), Hf$_{1-x}$Al$_x$O$_y$, (e.g., HfAlO$_3$), Al$_x$Si$_{1-x}$O$_y$, Hf$_x$Al$_y$Si$_z$O, and Al$_x$Zr$_{1-x}$O$_y$, where x is a positive number between 0 and 1, and y and z are positive numbers. Also, as described previously, the charge blocking layers may include nitrogen and/or a gradient of composition across the thickness of the layer. Preferably, the thickness of the first and second charge blocking layers 206, 402 is about 4 nm or less, or about 2 nm or less. The tunneling dielectric layer 202 of the gate stacks 2120, 2720 is as described previously, and may be SiO$_2$.

Figure 28:
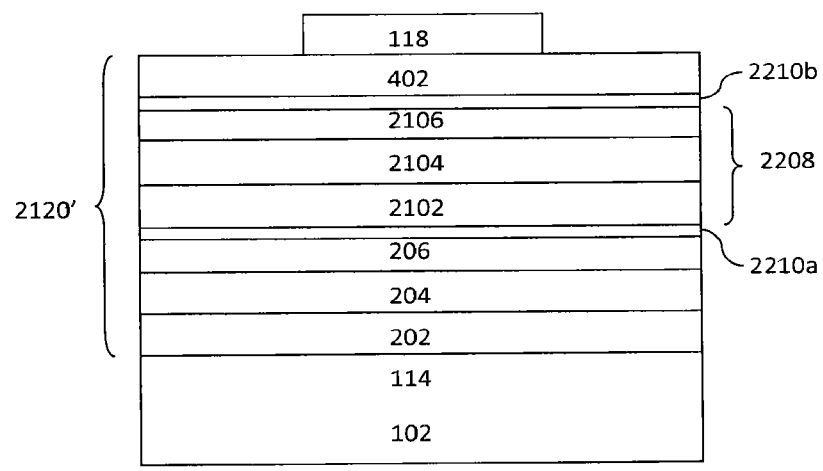
FIG. 28 is a cross-sectional view of an alternative embodiment of the gate stack of FIG. 21.

According to another exemplary embodiment, a thin dielectric layer 2210 may lie between the control dielectric layer 2208 and the first charge blocking layer 206 and/or the second charge blocking layer 402. At the interface between two dielectric films, there are dipole moments as a result of local charge transfer. The dipole moment differs with different combinations of dielectric materials. One can utilize this dipole moment to increase or decrease the barrier height at the interface. It has been shown that Al$_2$O$_3$/SiO$_2$ interface has a higher dipole moment than HfO$_2$/SiO$_2$ interface (*Appl. Phys. Lett.*, 92, 132907, 2008.) Referring to FIG. 28, which shows an alternative embodiment 2120' of the gate stack 2120 of FIG. 21, a first thin dielectric layer 2210*a* may be disposed between the first charge blocking layer 206 and the control dielectric layer 2208, and a second thin dielectric layer 2210*b* may be disposed between the second charge blocking layer 402 and the control dielectric layer 2208. Preferably, the thin dielectric layer(s) 2210 has a thickness of about 1 nm or less. The thickness may also be about 0.5 nm or less. A very thin Al$_2$O$_3$ layer of less than about 1 nm in thickness inserted at a HfO$_2$ and SiO$_2$ interface may be sufficient to increase the dipole moment. Therefore, if an Al$_2$O$_3$ layer of about 0.6 nm is inserted between HfO$_2$ and SiO$_2$ layers, the tunnel barrier height may be increased and the leakage tunneling current may be suppressed. In particular, by including a thin Al$_2$O$_3$ layer of less than 1 nm 2210*a* between the first charge blocking layer 206, which may be HfO$_2$, and the first oxide layer 2102, which may be SiO$_2$, the program window can be improved due to the increased barrier height on top of the conductive charge storage elements (e.g., nanocrystals or a floating gate). By including a thin Al$_2$O$_3$ layer of less than 1 nm 2210*b* below the upper charge blocking layer 402, the erase window can be improved due to increased barrier height for the control gate 118 during erase. Besides Al$_2$O$_3$, other single-component or multi-component oxides may also be suitable, such as HfO$_2$, ZrO$_2$, Gd$_2$O$_3$, Yb$_2$O$_3$, Dy$_2$O$_3$, Nb$_2$O$_5$, Y$_2$O$_3$, La$_2$O$_3$, ZrO$_2$, TiO$_2$, Ta$_2$O$_5$, Pr$_2$O, SrTiO$_3$, Ba$_x$Sr$_{1-x}$TiO$_3$, Zr$_x$Si$_{1-x}$O$_y$, Hf$_x$Si$_{1-x}$O$_y$ (e.g., HfSiO$_4$), Hf$_{1-x}$Al$_x$O$_y$, (e.g., HfAlO$_3$), Al$_x$Si$_{1-x}$O$_y$, Hf$_x$Al$_y$Si$_z$O, and Al$_x$Zr$_{1-x}$O$_y$, where x is a positive number between 0 and 1, and y and z are positive numbers. Vapor deposition techniques known in the art, such as atomic layer deposition or chemical vapor deposition, may be employed for forming the thin dielectric layer (s) 2210.

Figure 7:
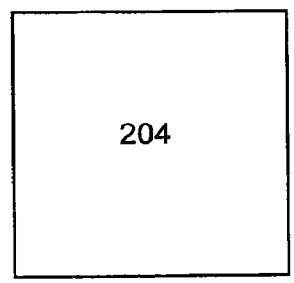
FIG. 7 shows a contiguous charge storage layer according to one embodiment.
Figure 8:
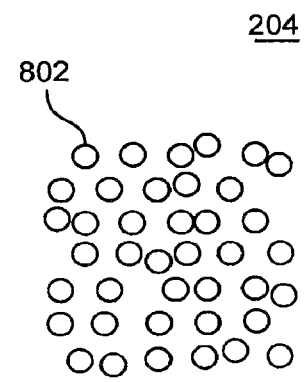
FIG. 8 shows a non-contiguous charge storage layer according to another embodiment.

In some exemplary embodiments of memory device 100, charge storage layer 204 is a single continuous region. For example, FIG. 7 shows a plan view of charge storage layer 204 having a planar, continuous configuration. For example, charge storage layer 204 may be formed from a continuous film of silicon (or polysilicon), a metal, etc. In such a configuration, if a single point of the continuous region breaks down and begins to lose charge, the entire region can lose its charge, causing memory device 100 to lose its programmed state. However, some embodiments may offer some protection from this problem. For example, FIG. 8 shows a plan view of charge storage layer 204 having a non-continuous configuration, according to an exemplary embodiment. In the example of FIG. 8, charge storage layer 204 comprises a plurality of nanoparticles 802. Because nanoparticles 802 of charge storage layer 204 each separately store charge, and are insulated from one another, even if a single nanoparticle loses charge, this will not likely affect the remaining nanoparticles of charge storage layer 204. The same advantage may be obtained with nonconductive nitride-based charge storage layers which store charge in localized charge trap regions. Thus, a memory device incorporating a charge storage layer 204 according to the present disclosure may maintain a constant programmed state over a much longer time than conventional memory devices.

In an exemplary embodiment, nanoparticles 802 are electrically isolated nanocrystals. Nanocrystals are small clusters or crystals of a conductive material that are electrically isolated from one another. Generally, nanocrystals have a crystallite size of approximately 100 nm or less. One advantage in using nanocrystals for charge storage layer 204 is that they do not form a continuous film, and thus charge storage layers formed of nanocrystals are self-isolating. Because nanocrystals form a non-continuous film, charge storage layers may be formed without concern about shorting of the charge storage medium of one cell level to the charge storage medium of adjacent cells lying directly above or below (i.e., vertically adjacent). Yet another advantage of the use of nanocrystals for charge storage layers is that they may experience less charge leakage than do continuous film charge storage layers.

Nanocrystals can be formed from conductive material such as palladium (Pd), iridium (Ir), nickel (Ni), platinum (Pt), gold (Au), ruthenium (Ru), cobalt (Co), tungsten (W), tellurium (Te), rhenium (Re), molybdenum (Mo), iron platinum alloy (FePt), tantalum (Ta), tantalum nitride (TaN), etc. Such materials generally have a higher work function (e.g., about 4.5 eV or higher) than many semiconductors such as silicon, which is desirable for multiple electron storage. They may also have a higher melting point (which allows a higher thermal budget), have longer retention times, and have high density of states for both positive and negative charge storage.

Methods for forming nanocrystals are well known in the art, for example, as disclosed in U.S. patent application Ser. No. 11/506,769, filed Aug. 18, 2006, the disclosure of which is incorporated herein by reference in its entirety. A metal nanocrystal charge storage layer can be formed by physical vapor deposition (PVD) or atomic layer deposition (ALD) in which a thin film is first deposited on a surface of a substrate (e.g., by sputtering using PVD) and then annealed at high temperature (e.g., about 900 degrees C. or higher) for a short time (e.g., about 10 seconds) to coalesce metal particles of nanoscale dimensions. The uniformity and size of the metal particles can be controlled by varying the thickness of the sputtered metal layer, the annealing temperature and annealing time, pressure, and ambient gas species, etc. When silicon nanocrystals are used in charge storage layer 204, the silicon nanocrystals may be formed by a process such as CVD as described, for example, in U.S. Pat. No. 6,297,095, which is incorporated by reference herein in its entirety. Charge storage layer 204 may include preformed colloidal metal or semiconductor quantum dots deposited on the tunneling dielectric layer 202 by methods such as spin coating, spray coating, printing, chemical self-assembly and the like. For example, such processes are described in U.S. Pat. No. 6,586,785, U.S. patent application Ser. No. 11/147,670, and U.S. patent application Ser. No. 11/495,188, which is each incorporated by reference herein in its entirety.

Additionally, instead of including a dielectric isolated charge storage layer for charge storage in memory device 100, a nonconductive trapping layer formed in a dielectric stack of the gate stack may be used. For example, the charge storage medium can be a dielectric stack comprising a first oxide layer (e.g., tunneling dielectric layer 202) adjacent to channel region 114, a nonconductive nitride layer adjacent to the first oxide layer, and a second oxide layer adjacent to the nitride layer and adjacent to gate contact 118. Such a dielectric stack is sometimes referred to as an ONO stack (i.e., oxide-nitride-oxide) stack. The second oxide layer can be replaced with one of gate stacks 120, 120', or 120" to improve the performance of the traditional ONO stack. Other suitable charge trapping dielectric films such as an H+ containing oxide film can be used if desired.

Exemplary Embodiments

Figure 9A:
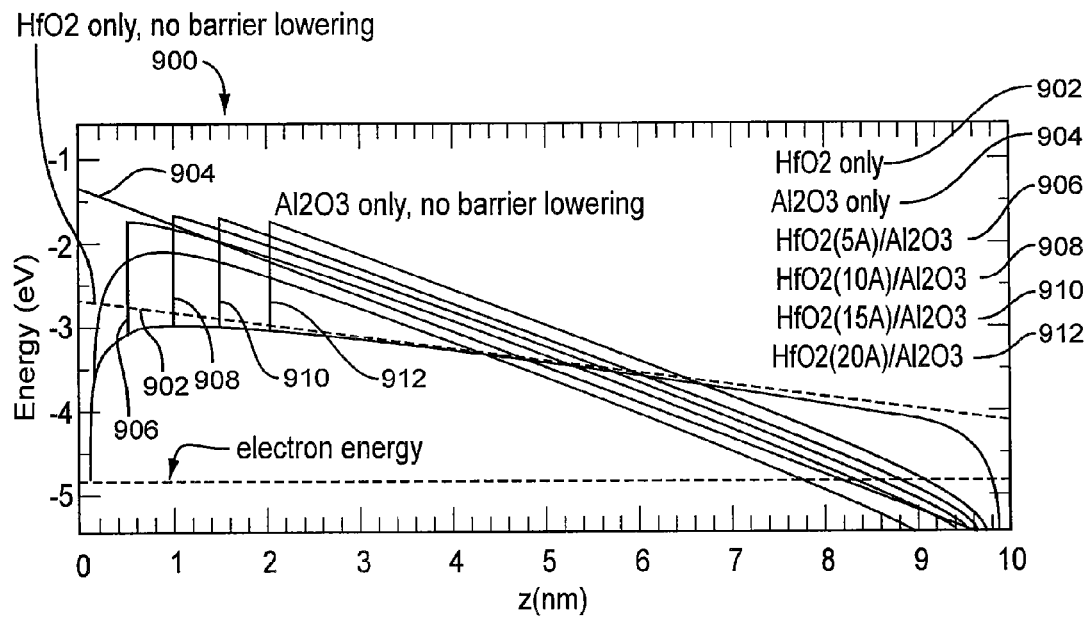
FIGS. 9A and 9B show simulation plots related to a combination control dielectric layer, according to various embodiments.
Figure 9B:
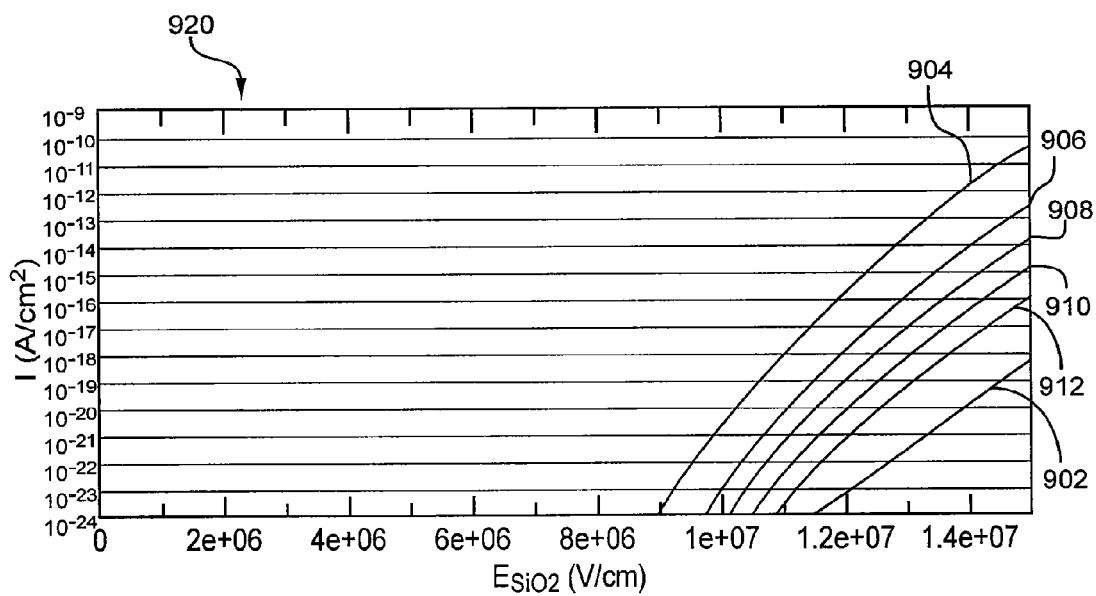

In an exemplary embodiment, charge storage layer 204 includes metal dots, charge blocking layer 206 is $HfO_2$, and control dielectric layer 208 is $Al_2O_3$. FIG. 9A shows a simulation plot 900 of energy (eV) versus a thickness (nm) for a combination control dielectric of charge blocking layer 206 ($HfO_2$) and control dielectric layer 208 ($Al_2O_3$). FIG. 9B shows a simulation plot 920 of current ($A/cm^2$) versus electric field (V/cm). The plot includes a plot line 902 for the combination control dielectric including only $HfO_2$, and a plot line 904 for the combination control dielectric including only $Al_2O_3$. For both of plot lines 902 and 904, no barrier lowering is indicated. The data in FIGS. 9A and 9B show that including a thin layer of $HfO_2$ at the interface of metal and $Al_2O_3$ can reduce the electron tunneling current by many orders of magnitude. This is true even if the $HfO_2$ layer is less than 1 nm thick.

FIGS. 10A-10C show plots 1000, 1010, and 1020 related to an exemplary gate stack similar to gate stack 120 shown in FIG. 2. As shown in FIG. 10B, an erase voltage is approximately −3.7V and a program voltage is approximately 9.3V, for a total P/E window of 13 V.

Figure 11A:
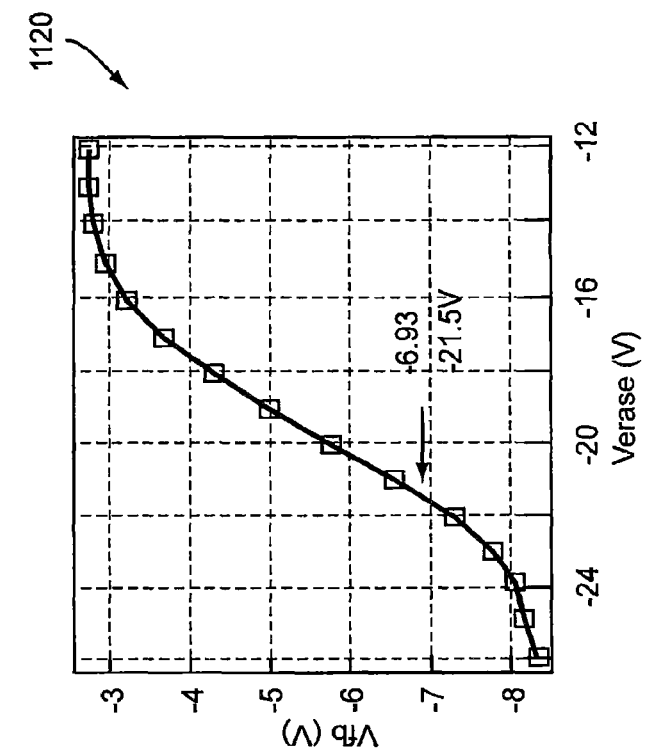
Figure 11B:
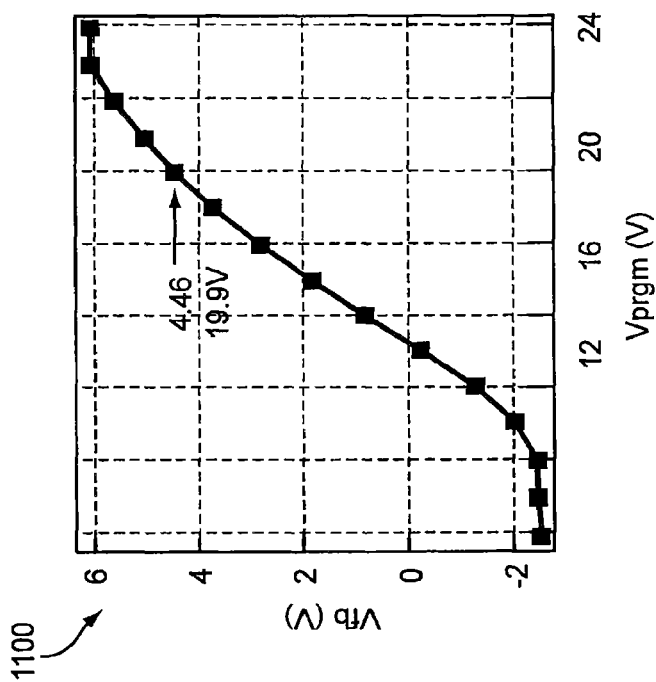

FIGS. 11A and 11B show plots 1100, 1120 of program and erase voltages for an exemplary gate stack similar to gate stack 120" shown in FIG. 6. In this example, charge storage layer 204 is formed of quantum dots, first charge blocking layer 206 is formed of $HfO_2$ having a thickness of 4 nm, control dielectric layer 208 is formed of $Al_2O_3$ at a thickness of 12 nm, and second charge blocking layer 402 is formed of $HfO_2$ at a thickness of 4 nm. As indicated by the data in FIGS. 11A and 11B, a P/E linear window is approximately 11.39V.

Figure 11C:
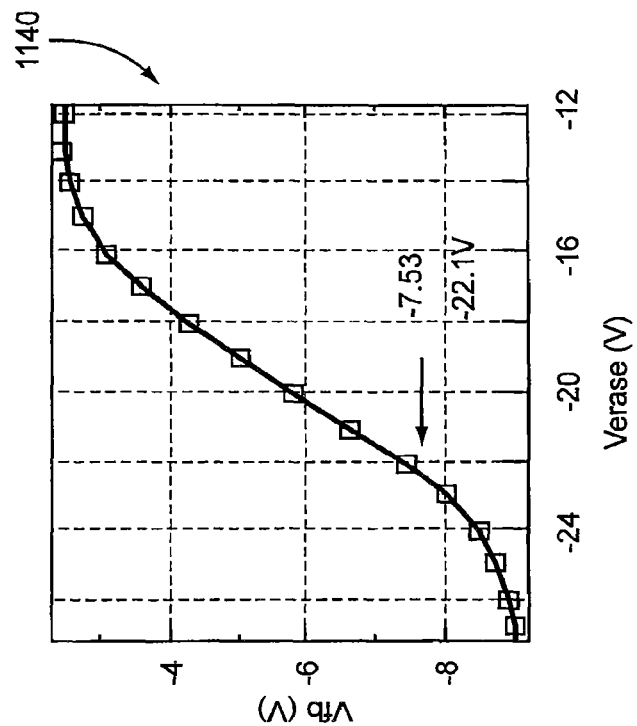
Figure 11D:
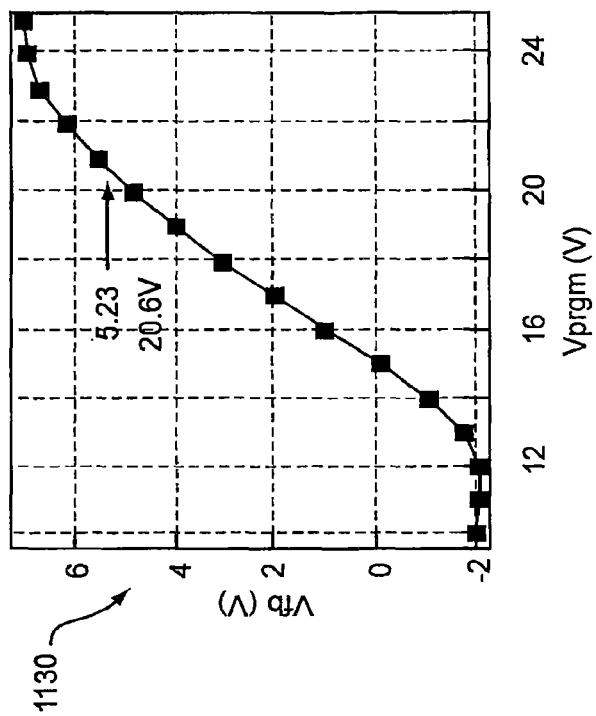

FIGS. 11C and 11D respectively show plots 1130 and 1140 of program and erase voltages for an exemplary gate stack similar to gate stack 120" shown in FIG. 6. In this example, charge storage layer 204 is formed of quantum dots, first charge blocking layer 206 is formed of $HfO_2$ having a thickness of 4 nm, control dielectric layer 208 is formed of $Al_2O_3$ at a thickness of 12 nm, and second charge blocking layer 402 is formed of $HfO_2$ at a thickness of 8 nm. As indicated by the data in FIGS. 11C and 11D, a P/E linear window is approximately 12.76V.

Figure 11E:
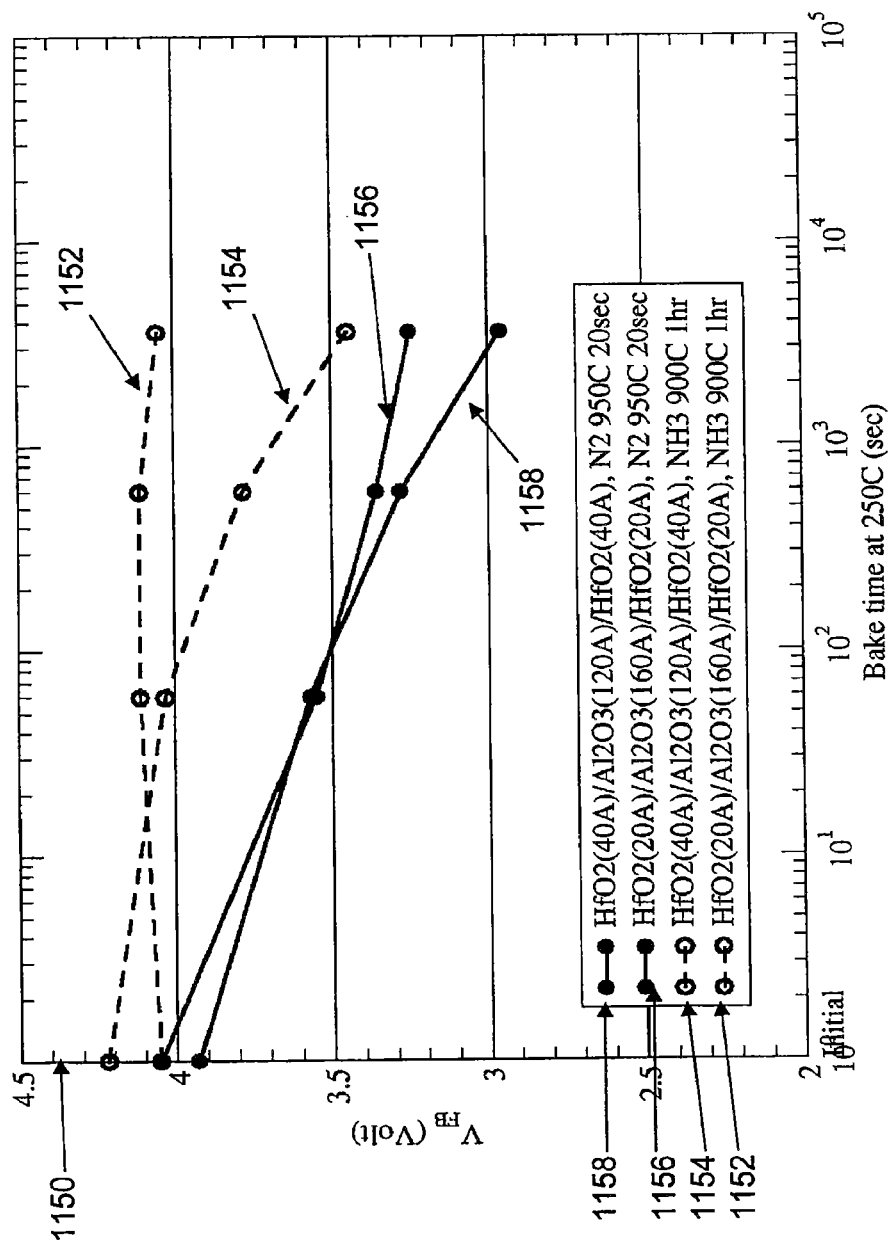
FIGS. 11E and 11F show plots related to charge retention for memory devices including various exemplary gates stacks.
Figure 11F:
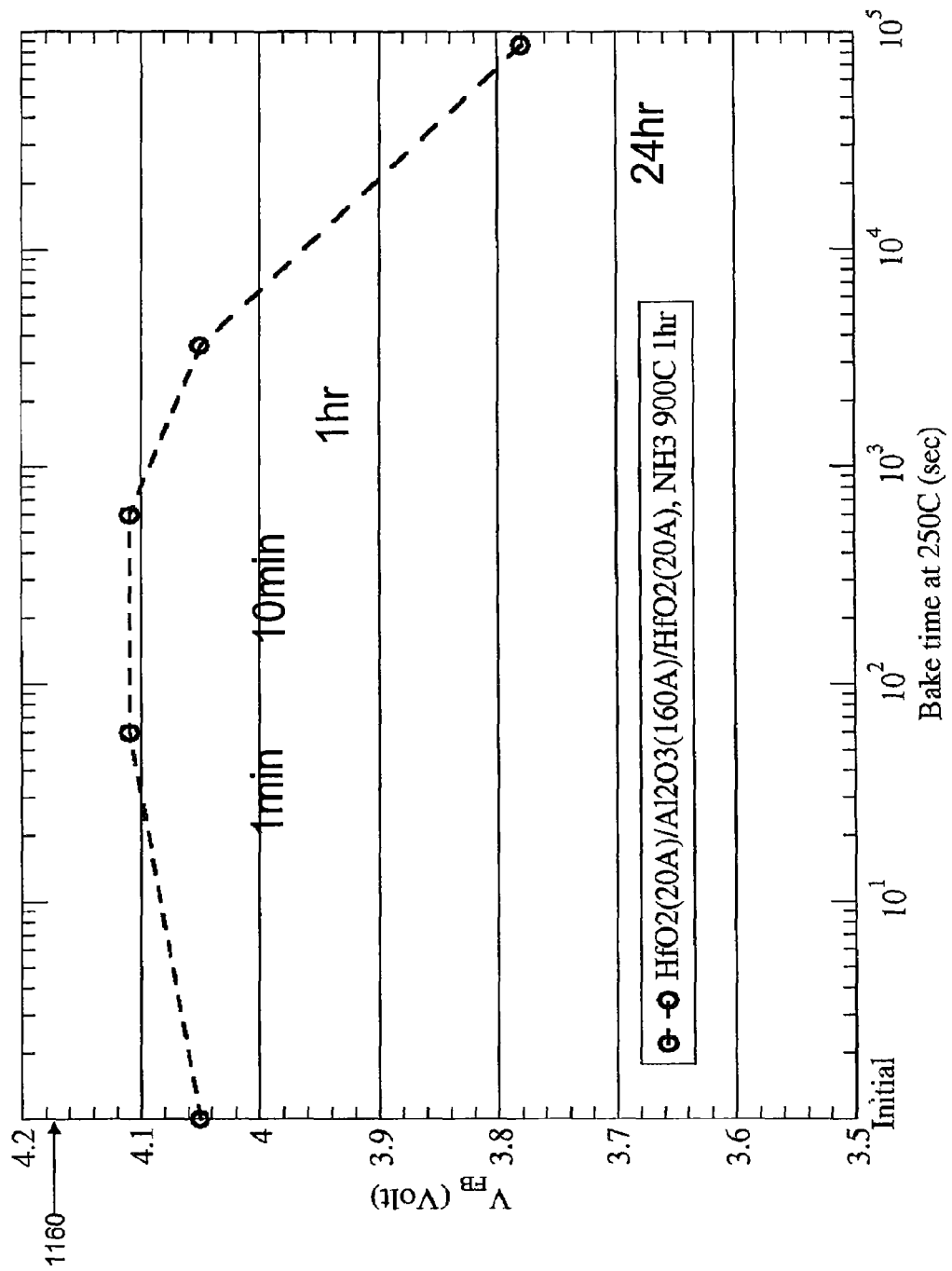

FIGS. 11E and 11F show plots 1150 and 1160, respectively, obtained from charge retention tests of memory devices including four exemplary gate stacks similar to gate stack 120" shown in FIG. 6. According to first and third embodiments (1152, 1156) of the gate stack, first charge blocking layer 206 is formed of $HfO_2$ of 2 nm in thickness that has undergone a nitridation treatment; control dielectric layer 208 comprises $Al_2O_3$ of 16 nm in thickness; and second charge blocking layer 402 is formed of $HfO_2$ of 2 nm in thickness that has undergone a nitridation treatment. According to second and fourth embodiments (1154, 1158) of the gate stack, first charge blocking layer 206 is formed of $HfO_2$ of 4 nm in thickness that has undergone a nitridation treatment; control dielectric layer 208 comprises $Al_2O_3$ of 12 nm in thickness; and second charge blocking layer 402 is formed of $HfO_2$ of 4 nm in thickness that has undergone a nitridation treatment. In the first and second embodiments (1152, 1154), the nitridation treatment entails an ammonia ($NH_3$) anneal followed by a rapid thermal anneal (RTA) in nitrogen, and in the third and fourth embodiments (1156, 1158) the nitridation treatment entails just the RTA in nitrogen. The ammonia anneal was carried out at 900° C. for 1 h at an ammonia pressure of 250 mTorr, and the RTA was carried out in flowing nitrogen at 950° C. for 20 s. Alternatively, the nitridation treatment may be carried out in a nitrogen plasma. Having undergone the nitridation treatment, all or a portion of the first and second charge blocking layers 206, 402 of the exemplary embodiments may include hafnium oxynitride (HfON).

The samples were prepared on a substrate including an 80 Å $SiO_2$ tunnel oxide layer. The charge storage layer 204 of the four exemplary gate stacks in the examples of FIGS. 11E and 11F includes metal nanocrystals, but alternatively the charge storage layer 204 may be a nitride layer or a polycrystalline silicon (polysilicon) layer, as described previously. In the case of a nitride charge storage layer, a dual layer dielectric structure including just the first charge blocking layer 206 and the control dielectric layer 208, as shown for example in FIGS. 2 and 12, may be advantageous.

To carry out the charge retention tests, the memory devices including the exemplary gate stacks are initially programmed to approximately 4V and then baked (heated) at 250° C. for up to 24 hours. Under these conditions, the memory devices undergo an accelerated reliability test that allows the charge loss that would occur over a much longer period (e.g., up to ten years) at room temperature to be simulated.

FIG. 11E shows flatband voltage $V_{FB}$ as a function of bake time in seconds, where data were obtained from each memory device at the start, after 60 seconds, after 600 seconds, and after 3,600 seconds (1 hour). The memory devices including the gate stacks that were nitrided in ammonia (the first and second embodiments) show the best charge retention. Of these two embodiments, the memory device including the gate stack having a 16 nm $Al_2O_3$ layer sandwiched between two 2 nm $HfO_2$ layers (first embodiment; curve 1152) had the higher charge retention with a charge loss ($\Delta V_{FB}$) of about 0.1 V at 250° C. for 1 h. The memory device including the 12 nm $Al_2O_3$ layer sandwiched between two 4 nm $HfO_2$ layers (second embodiment of the gate stack; curve 1154) showed the second best charge retention with a charge loss of about 0.7 V at 250° C. for 1 h.

The memory devices including the gate stacks that underwent only the RTA in nitrogen (third and fourth embodiments) show higher charge losses. Of these two embodiments, the memory device including the gate stack having a 12 nm $Al_2O_3$ layer sandwiched between two 4 nm $HfO_2$ layers (fourth embodiment; curve 1158) had the lowest charge retention of all four devices with a charge loss of about 1 V at 250° C. for 1 h. The third embodiment of the gate stack (curve 1156), with a 16 nm $Al_2O_3$ layer sandwiched between two 2 nm $HfO_2$ layers, exhibited a charge loss of about 0.8 V at 250° C. for 1 h.

Referring now to FIG. 11F, the charge retention of the memory device including the first embodiment of the gate stack, which includes the 16 nm $Al_2O_3$ layer sandwiched between two 2 nm $HfO_2$ layers that underwent the ammonia anneal and then the RTA, was evaluated over a 24 h period at the same test temperature of 250° C. The memory device exhibited a charge loss ($\Delta V_{FB}$) of 0.32 V over the duration of the test.

Preferably, the memory device exhibits a charge loss of about 0.5 V or less over a period of 24 hours at 250° C. In addition, the memory device preferably exhibits a charge retention of about 85% or greater. More preferably, the memory device exhibits a charge retention of about 90% or greater.

The inventors believe that the inclusion of nitrogen in the $HfO_2$ layers serves to densify the high K dielectric, thereby reducing the trap density and the rate of charge leakage. The data indicate that the thickness of the layers also plays a role in the charge retention capability of the device. Preferably, the control dielectric layer 208 has a thickness of from about 6 times to about 10 times that of the first and second charge blocking layers 206, 402. It may be advantageous, for example, for the control dielectric layer 208 to have a thickness of from about 4 nm to about 18 nm, or from about 8 nm to about 16 nm, and for each of the first and second charge blocking layers 206, 402 to have a thickness of from about 1 nm to about 6 nm, or from about 1 nm to about 3 nm.

In the preceding examples, the oxynitride layers were formed by nitriding hafnium oxide layers deposited by atomic layer deposition or a similar technique. It is also contemplated that the oxynitride may include a component other than hafnium and may be formed by nitriding an oxide other than hafnium oxide. For example, the oxynitride may be a silicon oxynitride formed by nitriding silicon oxide. Generally speaking, the oxynitride may include a component M ($MO_{2-y}N_y$), where M is selected from the group consisting of, for example, Hf, Si, and Al. The oxynitride may also include more than one component (e.g., M and M') in addition to oxygen and hydrogen; for example, the component M may be present at a concentration x and M' may be present at a concentration of 1-x: $M_xM'_{1-x}O_{2-y}N_y$. According to this embodiment, for example, M may be Hf and M' may be Si, and the oxynitride may be $Hf_xSi_{1-x}O_{2-y}N_y$.

If the nitridation treatment (e.g., ammonia anneal) is carried out after all of the layers of the gate stack are deposited, then the second charge blocking layer 402 may include an excess of nitrogen compared to the first charge blocking layer 206. Accordingly, it may be advantageous to carry out a nitridation treatment after the first charge blocking layer 206 is deposited and before the second charge blocking layer 402 is deposited, and then to repeat the nitridation treatment after forming the second charge blocking layer 402. Using this processing approach, the first and second charge blocking layers 208, 402 may contain similar amounts of nitrogen.

For example, referring again to FIG. 6, a layer of $HfO_2$ may be deposited as the first charge blocking layer 206 on the charge storage layer 204 of the gate stack 120". Prior to depositing additional layers, the device may be placed in a furnace and annealed in, for example, 250 mTorr of ammonia for 1 h at about 900° C. As a result of this nitridation treatment, an oxynitride (HfON) may be formed from some or all of the oxide ($HfO_2$) of the first charge blocking layer 206. Then, the control dielectric layer 208 (e.g., $Al_2O_3$) and the second charge blocking layer 402 (e.g., $HfO_2$) may be deposited by ALD or another technique, and the nitridation treatment can be repeated to form an oxynitride from the oxide of the second charge blocking layer 402. For example, the device may be returned to the furnace and annealed in ammonia for 1 h at 900° C. as described previously. Consequently, HfON may be obtained from some or all of the $HfO_2$ of the second charge blocking layer 402, as well as from some or all of the first charge blocking layer 206. It may also be advantageous as a final step to place the ammonia-annealed device in a tube configured for flowing nitrogen to perform a rapid thermal anneal (RTA) at a temperature of about 1000° C. for about 10-30 seconds. The RTA may be effective in driving hydrogen out of the gate stack. In the case of a gate stack including only one charge blocking layer adjacent to the control dielectric layer, more than one nitridation treatment may not be necessary.

As described above, the ammonia anneal is preferably carried out at a temperature of about 900° C. or less. For example, the anneal may be carried out at a temperature of about 850° C. or less, or at a temperature of about 800° C. or less. Preferably, the temperature of the ammonia anneal is at least about 750° C. The duration of the ammonia anneal is preferably about 60 minutes, although any time in the range of from about 50 minutes to about 70 minutes may be suitable for the nitridation treatment. Generally speaking, a rapid thermal anneal in ammonia may be carried out at higher temperatures and shorter times than a furnace anneal in ammonia.

Figure 12:
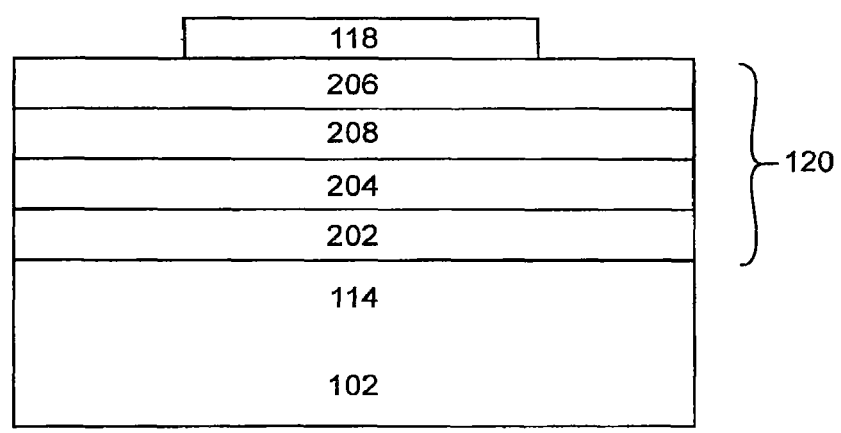
FIG. 12 shows a cross-sectional view of a gate stack of a memory device according to another embodiment.
Figure 13:
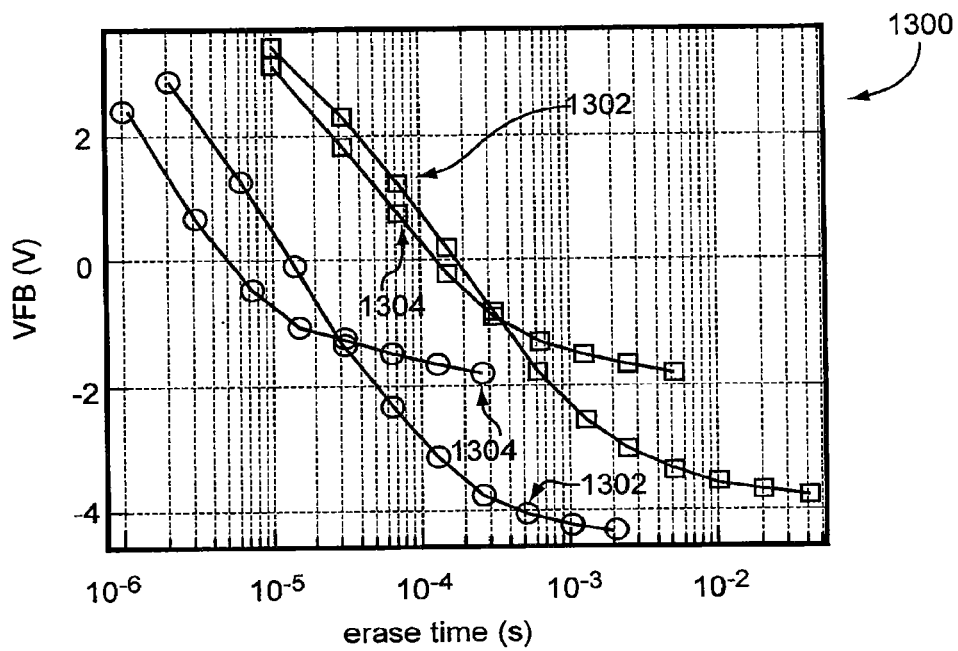
FIG. 13 shows a plot of erase time (x-axis) versus flat-band voltage (y-axis) for gate stacks using a nitride layer as the charge trapping layer, comparing a gate stack without one or more charge blocking layers and an improved gate stack with a charge blocking layer.
Figure 14:
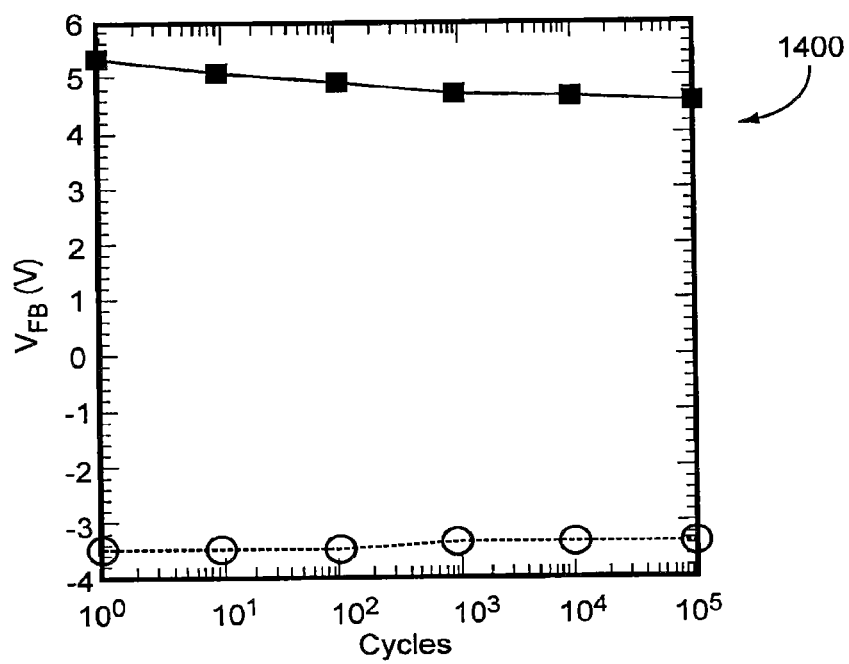
FIG. 14 shows a plot of the number of program and erase cycles (x-axis) versus the flat-band voltage (y-axis) using the improved gate stack of FIG. 13.

In another exemplary embodiment, the gate stack of the memory device may include a nitride layer as the charge storage layer, an $Al_2O_3$ layer as the control dielectric layer, and a hafnium containing compound such as $HfO_2$ as the charge blocking layer. As shown in FIG. 12, the charge blocking layer 206 may be formed above the control dielectric layer 208 and adjacent the control gate 118 according to this embodiment. As noted above, the gate stack may include one (or more) other charge blocking layers, such as a charge blocking layer below the control dielectric layer and adjacent the nitride layer. FIG. 13 shows a chart 1300 of erase time (x-axis) versus flat-band voltage (y-axis) comparing a conventional gate stack (reference numeral 1304) without one (or more) charge blocking layers, versus an improved gate stack (reference numeral 1302) described above using a nitride layer as the charge trapping layer and a charge blocking layer (e.g., $HfO_2$) formed adjacent to the control dielectric layer (e.g., $Al_2O_3$). FIG. 14 shows a chart 1400 comparing the number of program and erase cycles (x-axis) versus the flat-band voltage (y-axis) using the improved gate stack represented by reference numeral 1302 in FIG. 13. FIG. 14 shows a chart of room temperature charge retention mapping time (x-axis) versus flat-band voltage (y-axis) using the improved gate stack.

Figure 15:
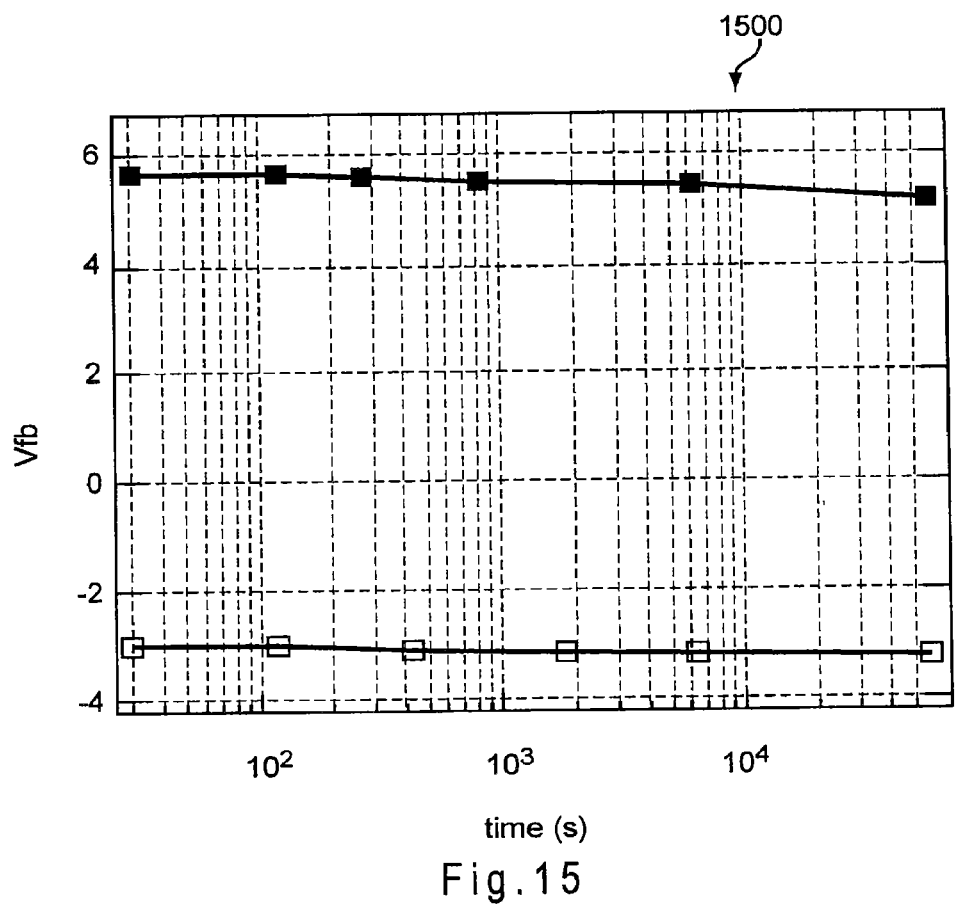
FIG. 15 shows a chart of room temperature charge retention mapping time (x-axis) versus flat-band voltage (y-axis) using the improved gate stack of FIG. 13.

As first shown in FIG. 13, the use of the improved gate stack 1302 comprising charge blocking layer (e.g., $HfO_2$) formed over the control dielectric layer (e.g., $Al_2O_3$) with a nitride charge trapping layer shows an enhancement in the memory P/E window (e.g., on the order of about 2 volts or greater) compared to conventional gate stack 1304 including only an $Al_2O_3$ control dielectric layer without a charge blocking layer. Such a memory device with the improved gate stack has a total P/E window of greater than about 8 volts, which is believed to be the highest P/E window reported in the literature to date using a nitride layer as the charge trapping layer. In addition, as shown in the plot 1400 of FIG. 14, the P/E window does not show significant drift after 100,000 P/E cycles using the improved gate stack embodiment. And, as shown in the plot 1500 of FIG. 15, the charge is retained at greater than an 8 V P/E window using the improved gate stack, and 100,000 P/E cycles do not degrade the charge retention characteristics of the memory device.

Figure 16A:
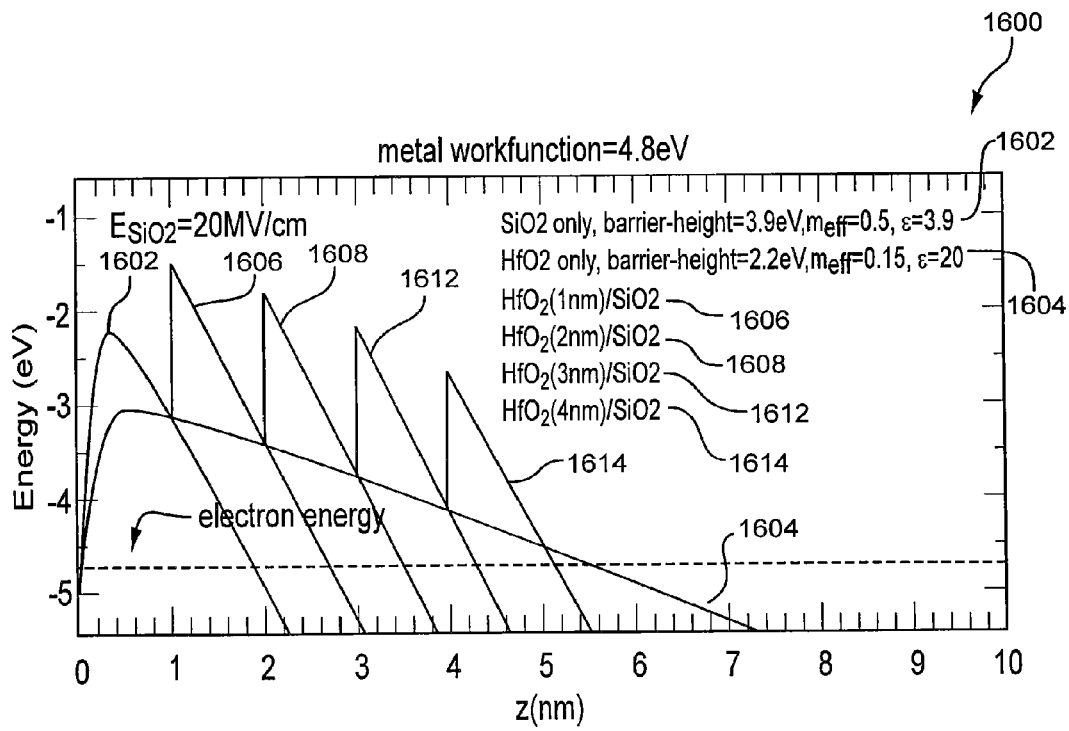
FIG. 16A-16B show simulation plots related to a combination control dielectric layer, according to several embodiments.
Figure 16B:
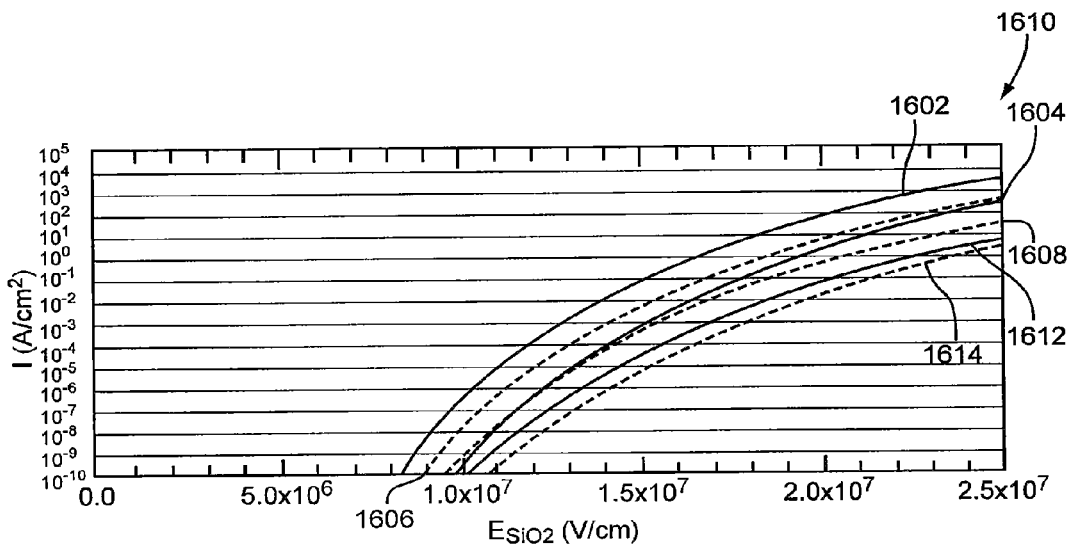

In another exemplary embodiment, the charge blocking layer 206 is $HfO_2$ and the control dielectric layer 208 is $SiO_2$. FIG. 16A shows a simulation plot 1600 of energy (eV) versus thickness (nm) for various dielectric layers, including $SiO_2$ alone (data line 1602), $HfO_2$ alone (data line 1604), and combinations of $HfO_2$ with $SiO_2$ (data lines 1606, 1608, 1612, 1614). FIG. 16B shows a simulation plot 1610 of Fowler-Nordheim tunneling current density ($A/cm^2$) versus electric field (V/cm) for the same dielectric layers. The calculated data show that including a thin layer of $HfO_2$ at an interface between a conductor (e.g., a metal having a work function of 4.8 eV) and $SiO_2$ can reduce electron tunneling by several orders of magnitude.

Figure 17A:
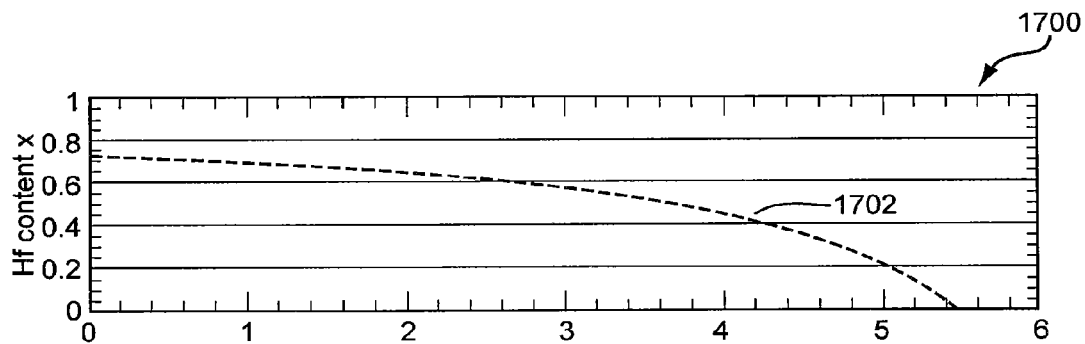
FIGS. 17A-17C show simulation plots related to a charge blocking layer having a composition gradient, according to several embodiments.
Figure 17B:
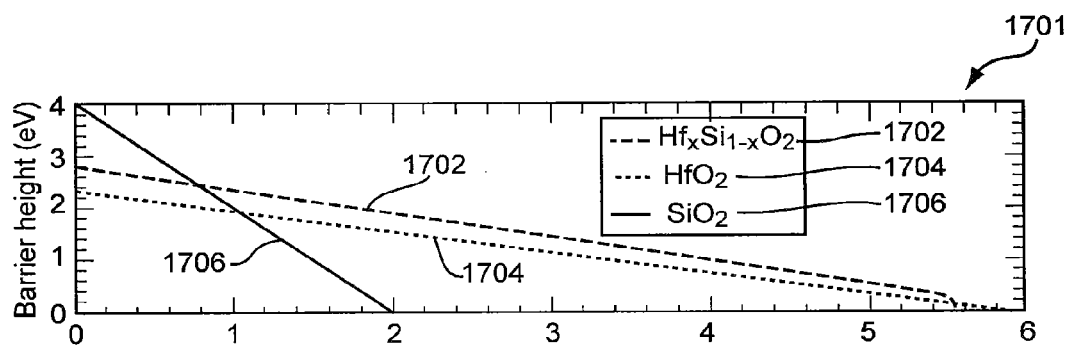
Figure 17C:
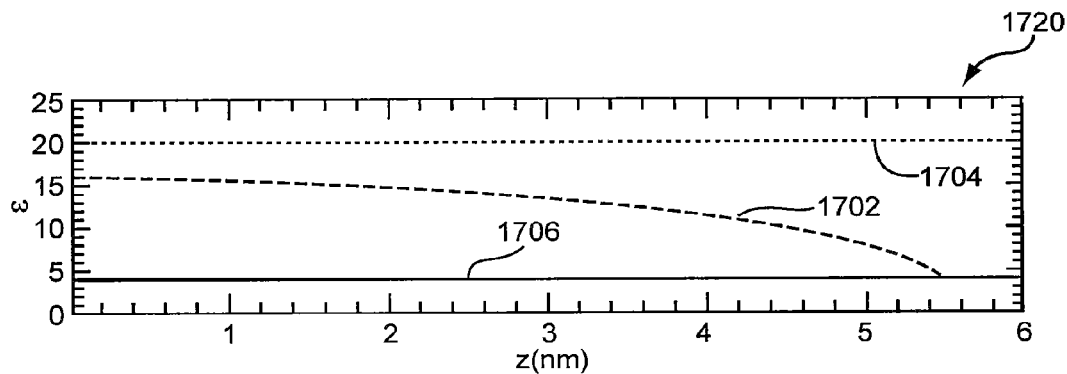

In another exemplary embodiment, the charge blocking layer 206 is $Hf_xSi_{1-x}O_2$ and the amount (x) of Hf varies across the thickness (z) of the charge blocking layer, as shown in plot 1700 of FIG. 17A. In this figure, the amount of Hf decreases away from the interface (z=0) in a nonlinear fashion. The optimal composition and thickness of the charge blocking layer to suppress electron tunneling depend on the electric field strength. The data were optimized for an electric field strength ($E_{SiO2}$) of 20 MV/cm. FIG. 17B shows a simulation plot 1710 of barrier height (eV) versus distance (z) from the interface for the $Hf_xSi_{1-x}O_2$ layer of varying Hf content compared to the barrier height for $HfO_2$ and $SiO_2$ layers. Similarly, FIG. 17C shows a simulation plot 1720 of the variation in dielectric constant (e) across the layer (z) for the $Hf_xSi_{1-x}O_2$ layer of varying Hf content. Dielectric constants of the $HfO_2$ and $SiO_2$ layers are also shown. The data lines for $Hf_xSi_{1-x}O_2$, $HfO_2$, and $SiO_2$ are represented by reference numerals 1702, 1704, and 1706, respectively.

Figure 18:
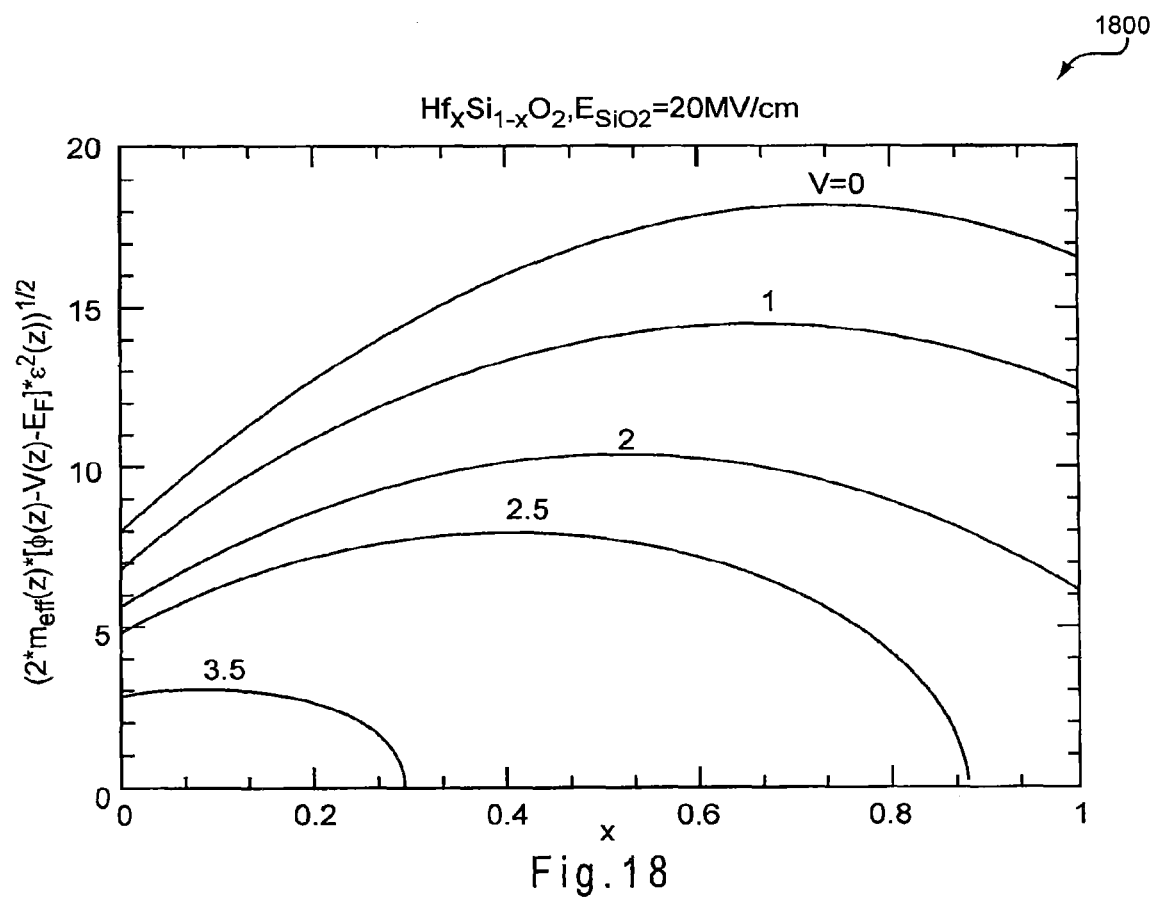
FIG. 18 shows a simulation plot related to a charge blocking layer having a composition gradient, according to several embodiments.

Plot 1800 in FIG. 18 shows how the optimal Hf content (x) of the $Hf_xSi_{1-x}O_2$ layer varies as a function of voltage for a given electric field strength.

Figure 19A:
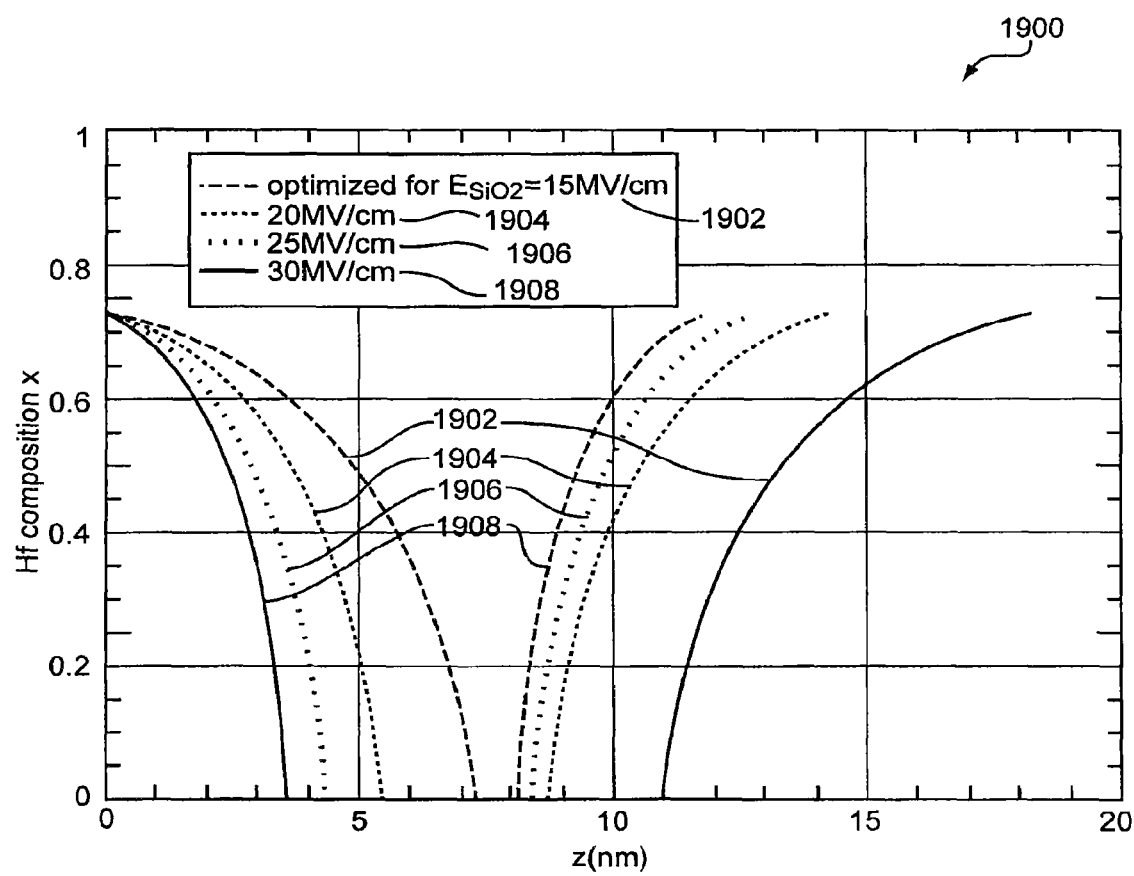
FIGS. 19A-19D show simulation plots related to a charge blocking layer having a composition gradient, according to several embodiments.

Plot 1900 of FIG. 19A shows optimal Hf contents (x) for various electric field strengths across a charge blocking layer/control dielectric layer/charge blocking layer structure of the following composition: $Hf_xSi_{1-x}O_2/SiO_2/Hf_xSi_{1-x}O_2$. Data lines 1902, 1904, 1906, and 1908 correspond respectively to electric field strengths of 15 MV/cm, 20 MV/cm, 25 MV/cm, and 30 MV/cm. For an equivalent oxide thickness (EOT) of 7 nm, the optimal film composition is roughly $Hf_{2/3}Si_{1/3}O_2$ (4.5 nm)/$SiO_2$ (5 nm)/$Hf_{2/3}Si_{1/3}O_2$ (4.5 nm) at an electric field strength of 20 MV/cm.

Figure 19B:
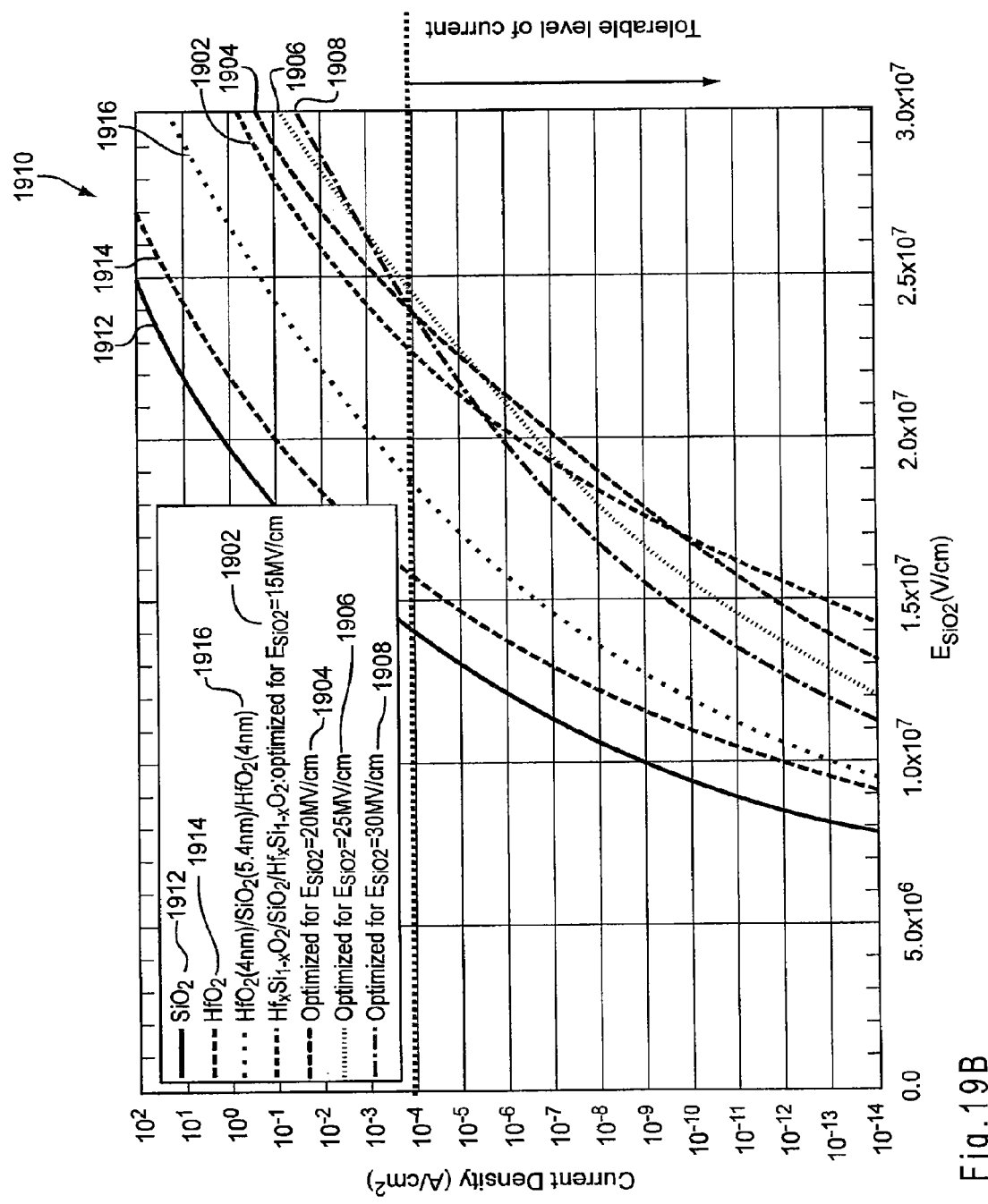

Plot 1910 of FIG. 19B shows Fowler-Nordheim tunneling current density as a function of electric field strength for the same layer structure and composition as in FIG. 19A, and also for $SiO_2$, $HfO_2$, and for $HfO_2$ (4 nm)/$SiO_2$ (5.4 nm)/$HfO_2$ (4 nm) (data lines 1912, 1914, and 1916, respectively). Tunneling current can be reduced by over two orders of magnitude by using a compositionally graded dielectric as the charge blocking layer. The data show that tunneling current may be maintained at less than about $10^{-4}$ $A/cm^2$ at an electric field strength that is equivalent to an electric field strength of $2.5 \times 10^7$ V/cm in $SiO_2$. Accordingly, a total dynamic linear range of a memory device may be extended to ±10V with Vg~±25V using an optimized charge blocking layer.

Figure 19C:
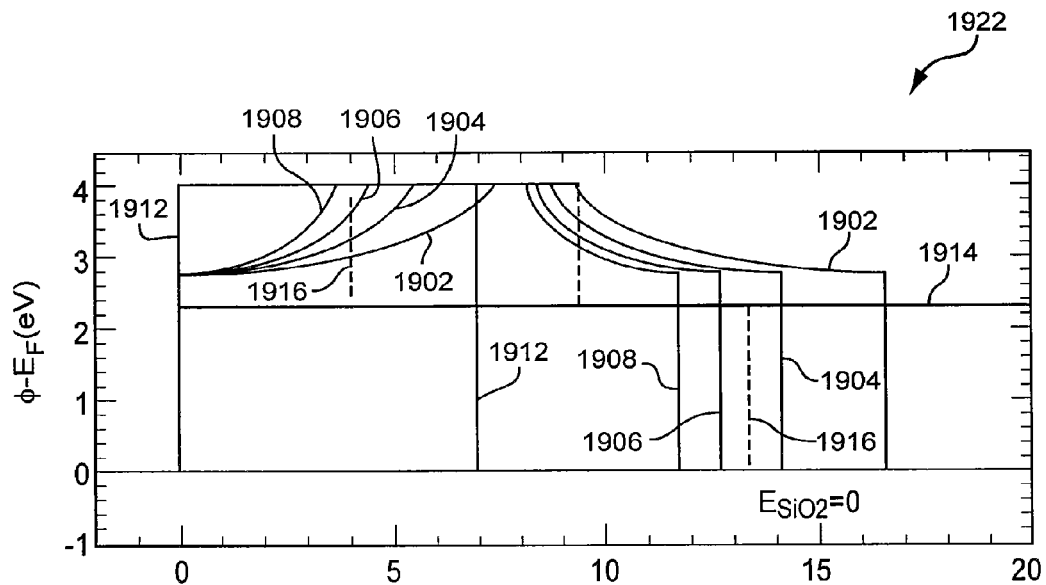
Figure 19D:
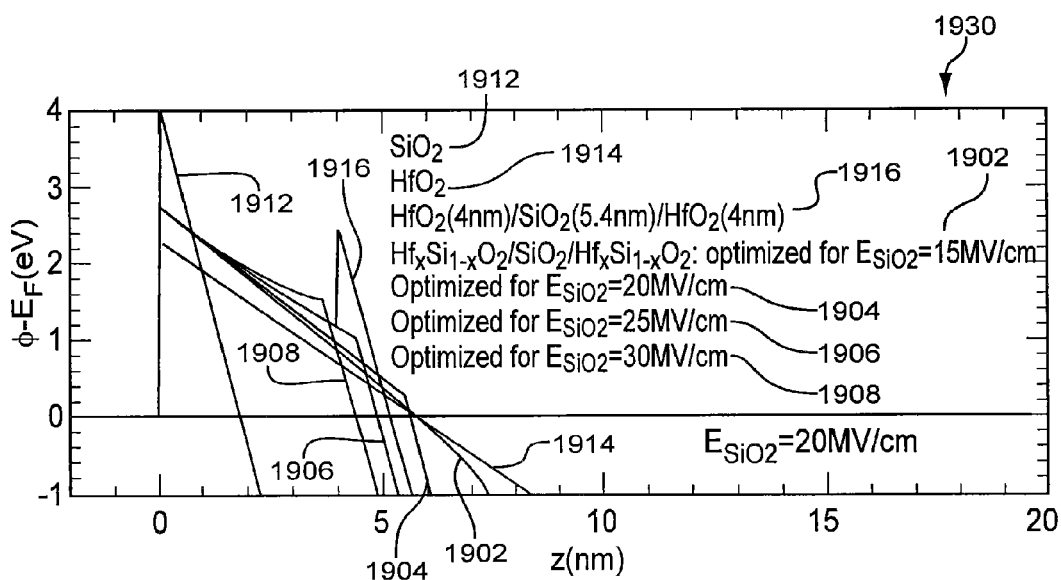

Plots 1920 and 1930 of FIGS. 19C and 19D, respectively, show energy band diagrams calculated for various electric field strengths for the above-mentioned layer structures and compositions.

Various data presented in the previous figures were calculated using the Wentzel-Kramers-Brillouin (WKB) approximation, where ψ(x) represents the wave function in the tunnel barrier and κ(z) represents the imaginary part of the wave vector:

$$\psi(x) \sim \exp\left[-\int_0^{\kappa(z)=0} \kappa(z)\,dz\right]$$

$$\kappa(z) = \frac{1}{\hbar}\sqrt{2m_{eff}(z)[\varphi(z)-V(z)-E_F]}$$

To minimize the tunneling current Φ(x), $$\int_0^{\kappa(z)=0} \kappa(z)\,dz$$

is maximized.

$$\int_0^{\kappa(z)=0} \kappa(z)\,dz = \frac{1}{\hbar}\int_0^{\varphi(z)-V(z)-E_F=0} \sqrt{2m_{eff}(z)[\varphi(z)-V(z)-E_F]} \times dz$$

$$= \frac{1}{\hbar}\int \sqrt{2m_{eff}(z)[\varphi(z)-V(z)-E_F]} \times \frac{dV(z)}{E(z)}$$

$$= \frac{1}{\hbar E_{SiO2}\varepsilon_{SiO2}}\int_0^{\varphi(z)-E_F} \sqrt{2m_{eff}(z)[\varphi(z)-V(z)-E_F] \times \varepsilon^2(z)} \times dV(z)$$

Thus, $\sqrt{2m_{eff}(z)[\phi(z)-V(z)-E_F] \times \varepsilon^2(z)}$ is maximized for each V(z). For a material M including components A and B, where x represents the proportion of A and (1−x) is the proportion of B, e.g., M=x×A+(1−x)×B, needed material constants may be obtained by linear superposition. For example, a dielectric constant c of the material M may be obtained from $\varepsilon = x \times \varepsilon_A + (1-x) \times \varepsilon_B$. An effective mass $m_{eff}$ of the material M may be obtained from $m_{eff} = x \times m_{eff,A}(1-x) \times m_{eff,B}$. Electron affinity go may be obtained from $\phi = x \times \phi_A + (1-x) \times \phi_B$. $E_F$ is the Fermi energy.

It is believed that the above-described calculation procedure is useful for predicting the behavior of dielectric layers, gate stacks, and/or memory devices described herein; however, this calculation procedure should not be used to limit the scope of the present invention.

Multistate Memory Embodiments

A memory device may have any number of memory cells. In a conventional single-bit memory cell, a memory cell assumes one of two information storage states, either an "on" state or an "off" state. The binary condition of "on" or "off" defines one bit of information. As a result, a conventional memory device capable of storing n-bits of data requires (n) separate memory cells.

The number of bits that can be stored using single-bit per cell memory devices depends upon the number of memory cells. Thus, increasing memory capacity requires larger die sizes containing more memory cells, or using improved photolithography techniques to create smaller memory cells. Smaller memory cells allow more memory cells to be placed within a given area of a single die.

An alternative to a single-bit memory cell is a multi-bit or multistate memory cell, which can store more than one bit of data. A multi-bit or multistate flash memory cell may be produced by creating a memory cell with multiple, distinct threshold voltage levels, $V_{t1-n}$, as described, for example, in U.S. Pat. No. 5,583,812, which is incorporated by reference herein in its entirety. Each distinct threshold voltage level, $V_{t1-n}$, corresponds to a value of a set of data bits, with the number of bits representing the amount of data that can be stored in the multistate memory cell. Thus, multiple bits of binary data can be stored within the same memory cell.

Each binary data value that can be stored in a multistate memory cell corresponds to a threshold voltage value or range of values over which the multistate memory cell conducts current. The multiple threshold voltage levels of a multistate memory cell are separated from each other by a sufficient amount so that a level of a multistate memory cell can be programmed or erased in an unambiguous manner. The specific relationship between the data programmed into the memory cell and the threshold voltage levels of the cell depends upon the data encoding scheme adopted for the multistate memory cell.

In programming a multistate memory cell, a programming voltage is applied over a sufficient time period to store enough charge in the charge storage layer to move the multistate memory cell's threshold voltage to a desired level. This level represents a state of the multistate memory cell, corresponding to an encoding of the data programmed into the multistate memory cell.

According to various exemplary embodiments, multiple threshold voltage levels for a multistate memory cell/device may be provided in charge storage layer 204 by electrically isolated nanoparticles (such as shown in FIG. 8) or a contiguous or non-contiguous metal (or silicon) layer such as shown in FIG. 7.

In another embodiment of multi-bit memory cells, as described for example in U.S. Pat. No. 5,768,192, which is incorporated by reference herein in its entirety, charge is stored in a non-conductive charge trapping layer (e.g., a nitride layer) in two physically distinct regions on opposite sides of the memory cell near the source and drain regions of the device. By developing symmetric and interchangeable source and drain regions in the cell, two non-interactive physically distinct charge storage regions are created, with each region physically representing one bit of information mapped directly to the memory array and each cell thereby containing two bits of information. Programming of the cell is performed in a forward direction which includes injecting electrical charge into the charge trapping material within the gate utilizing hot electron injection for a sufficient time duration such that electrical charge becomes trapped asymmetrically in the charge trapping material, the electrical charge being injected until the threshold voltage of the gate reaches a predetermined level. The cell is then read in the reverse direction from which it was programmed. This type of multi-bit memory cell can also be extended to charge storage layer memory devices using discrete metal nanocrystals as the charge storage medium, as described, for example, in U.S. Patent Publication No. 2004/0130941, which is incorporated by reference herein in its entirety.

The present inventors have also discovered that multi-bit storage using asymmetrical charge storage as described above can be accomplished using colloidal metal nanocrystals (e.g., as described in U.S. Pat. No. 6,586,785 and in U.S. patent application Ser. Nos. 11/147,670 and 11/495,188). The tighter control of the size and uniformity of such colloidal metal dots (e.g., over other deposited nanocrystals using PVD or CVD) has the advantage of relaxing the requirement on threshold spread by minimizing lateral charge conduction between adjacent dots when selectively charging a small portion of the nanocrystals near the source and/or drain of the device to produce the charging asymmetry.

A significant feature of the use of the devices and methods described herein is that they may enable the reliable storage of multiple bits in a single device using, e.g., any of the conventional techniques for generating multi-state memory as described herein. Conventional flash memories using multi-bit storage achieved through the above-described methods such as the multi-level approach suffer from the stringent requirements on the control of the threshold spread. The present exemplary embodiments, however, may overcome many of the limitations of conventional flash memory devices by providing a large programming/erase window (on the order of, e.g., 8 volts or greater, or 12 volts or greater), increased programming/erasing speed and good charge retention. This may allow for a greater separation between the various threshold voltage states from each other so that a level of a multistate memory cell can be programmed or erased in an unambiguous manner.

The present embodiments may also further enable the storage of multiple bits, such as three or more (e.g., four) bits per cell by, e.g., storing charge in each of two different storage locations in the charge storage layer and further adding the ability to store different quantities or charge states in each of the two locations using e.g., multiple voltage threshold levels as described above. The charge storage layer may be, for example, a nanocrystal layer or a non-conductive nitride layer, as described above. By storing four different quantities of charge at each location the memory device can thereby store 4×4=16 different combinations of charge providing the equivalent of four bits per cell. The enhancement in program/erase window provided by the teachings described herein without compromising charge retention may further enable multi-bit storage capability by providing greater flexibility in the injection and detection of charge in the storage medium and a relaxed requirement on threshold spread.

Figure 20:
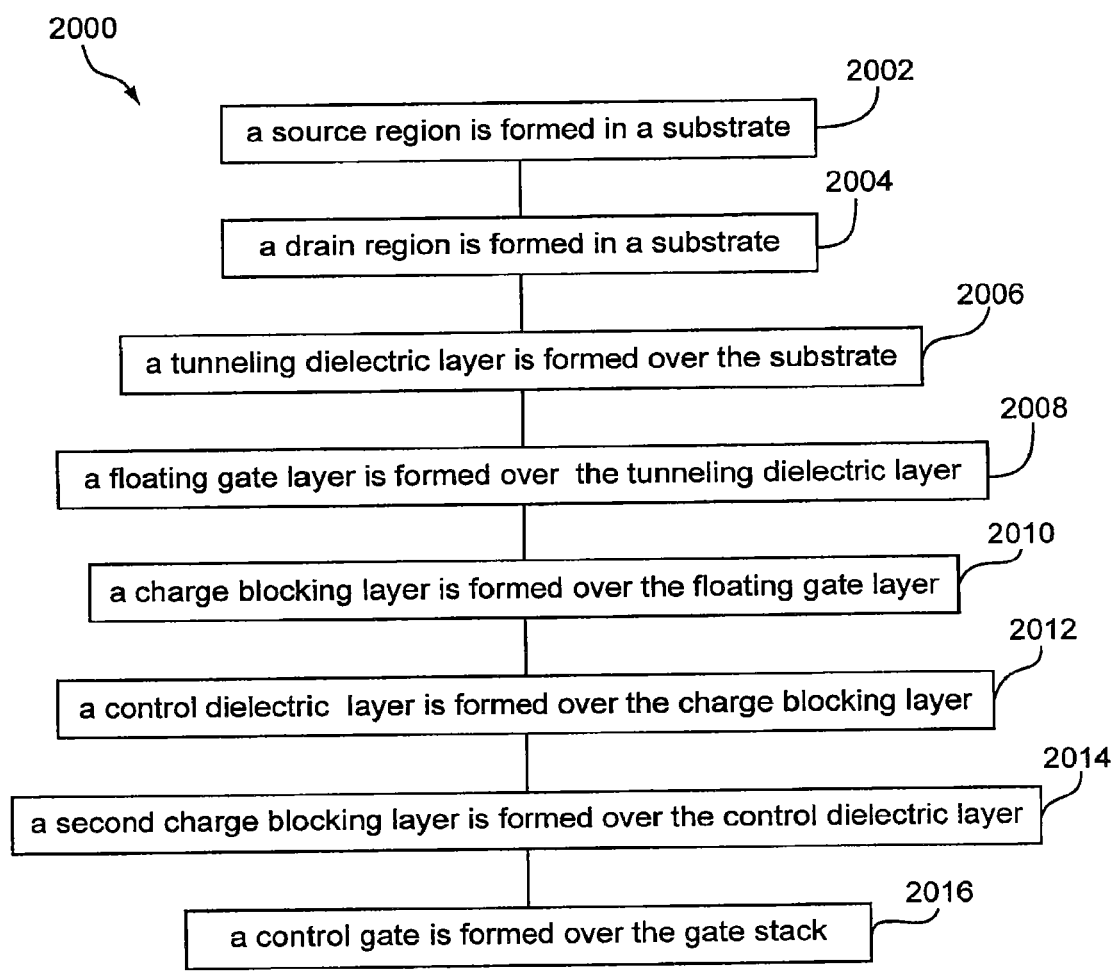
FIG. 20 shows a flowchart of a method for forming an electronic device, such as a memory device, according to one embodiment.

The exemplary embodiments described herein may be assembled according to well known semiconductor manufacturing techniques. FIG. 20 shows a flowchart 2000 providing an exemplary procedure for forming an electronic device, such as a memory device. Flowchart 2000 is provided for illustrative purposes, but is not intended to be limiting. Further structural and operational embodiments will be apparent to persons skilled in the relevant art(s) based on the following discussion. The procedure of flowchart 2000 does not necessarily have to be followed in the order shown.

Flowchart 2000 begins with formation of a source region in a substrate 2002. For example, as shown in FIG. 1, source region 112 may be formed in substrate 102. Source region 112 may be formed according to conventional doping or other techniques. Furthermore, in an exemplary embodiment, source contact 104 may be formed on source region 112 according to conventional deposition or other techniques.

Next, a drain region may be formed in the substrate 2004. For example, as shown in FIG. 1, drain region 116 may be formed in substrate 102. Drain region 116 may be formed according to conventional doping or other techniques. Furthermore, in an embodiment, drain contact 106 may be formed on drain region 116 according to conventional deposition or other techniques.

A tunneling dielectric layer may be formed on the substrate 2006. For example, as shown in FIGS. 2 and 6, tunneling dielectric layer 202 may be formed on channel region 114 of substrate 102. Tunneling dielectric layer 202 may be formed according to conventional oxide growth or other techniques.

A charge storage layer may be formed on the tunneling dielectric layer 2008. For example, as shown in FIGS. 2 and 6, charge storage layer 204 may be formed over tunneling dielectric layer 202. In an exemplary embodiment, charge storage layer 204 is formed directly on tunneling dielectric layer 202. In another embodiment, charge storage layer 204 is formed on an intermediate layer formed on tunneling dielectric layer 202, such as barrier layer 302 shown in FIG. 3.

Charge storage layer 204 may be a metal or semiconductor material layer (continuous or non-continuous) or a layer of particles, such as further described above. Charge storage layer 204 may be formed by deposition techniques such as physical vapor deposition (PVD), chemical vapor deposition (CVD), electrochemical deposition (ECD), molecular beam epitaxy (MBE), atomic layer deposition (ALD), or other techniques described elsewhere herein or otherwise known.

The charge blocking layer may be formed on the charge storage layer 2010. For example, as shown in FIGS. 2 and 6, charge blocking layer 206 is formed over charge storage layer 204. Charge blocking layer 206 may be formed according to any deposition technique described elsewhere herein or otherwise known, such as by atomic layer deposition. In an exemplary embodiment, as described above, charge blocking layer 206 may be doped. Furthermore, in another exemplary embodiment, as described above, charge blocking layer 206 may be formed as a gradient or as having multiple layers.

Atomic layer deposition may be particularly suitable for forming a charge blocking layer 206 including a composition gradient or multiple layers. For example, to form a charge blocking layer 206 composed of a dielectric material having a component that varies in concentration across a thickness of the charge blocking layer 206, one or more first monolayers of the dielectric material may be deposited using a first precursor of a first chemistry, and then one or more second monolayers of the dielectric material may be deposited using a second precursor of a second chemistry, and then one or more third monolayers of the dielectric material may be deposited using a third precursor of a third chemistry, etc. In other words, consecutive depositions of one or more monolayers may be carried out using different precursors in order to form the charge blocking layer 206 including either a composition gradient or multiple layers. It is also envisioned that a charge blocking layer 206 of a uniform composition may be deposited initially and then a rapid thermal anneal (RTA) may be employed to achieve the effect of a compositionally graded layer.

A control dielectric layer may be formed on the charge blocking layer 2012. For example, as shown in FIGS. 2 and 6, control dielectric layer 208 is formed over charge blocking layer 206. Control dielectric layer 208 may be formed according to any deposition technique described elsewhere herein or otherwise known, such as by atomic layer deposition.

A second charge blocking layer may be formed over the control dielectric layer 2014. As shown in FIG. 6, second charge blocking layer 402 is formed over control dielectric layer 208. Second charge blocking layer 402 may be formed according to any deposition technique described elsewhere herein or otherwise known, such as atomic layer deposition. In an embodiment, in a similar fashion to first charge blocking layer 206, second charge blocking layer 402 may be doped. Furthermore, in an embodiment, in a similar fashion to first charge blocking layer 206, second charge blocking layer 402 may be formed as a gradient or as having multiple layers.

The second charge blocking layer 402 is not necessarily formed in all embodiments. For example, FIG. 2 shows a gate stack 120 that does not include a second charge blocking layer. In another example, as shown in FIG. 11, the gate stack 120 may include the charge blocking layer 206 on the control dielectric layer 208, and a second charge blocking layer may not be formed.

A control gate may be formed over the gate stack 2016. For example, as shown in FIG. 2, gate contact 118 is formed over control dielectric layer 208 of gate stack 120. As shown in FIG. 6, gate contact 118 is formed over second charge blocking layer 402 of gate stack 120". Gate contact 118 may be formed on gate stacks 120 and 120" according to conventional deposition or other techniques.

Methods, systems and apparatuses for improved electronic devices, such as memory devices that may have enhanced characteristics, including increased charge retention, enhanced memory program/erase window, improved reliability and stability, with feasibility for single or multistate (e.g., two, three or four bit) operation, have been described herein.

The use of a multi-layer control dielectric, such as a double or triple layer control dielectric, in a nonvolatile memory device has been disclosed. The multi-layer control dielectric may include a combination of high-k dielectric materials such as aluminum oxide ($Al_2O_3$), hafnium oxide ($HfO_2$), and/or hybrid films of hafnium aluminum oxide ($HfAlO_x$, wherein x is a positive integer, e.g., 1, 2, 3, 4, etc.) therein.

A double control dielectric layer for a memory device has been described, including, for example, a control dielectric layer of $Al_2O_3$, and a charge blocking layer of $HfO_2$ (or $Hf_{1-x}Al_xO_y$, where x is a positive number between 0 and 1, and y is a positive number, e.g., $HfAlO_3$). The layer of $HfO_2$ may provide an efficient charge blocking layer to block electron current flow from the charge storage layer to the control gate during a programming operation of the memory device.

A double control dielectric layer for a memory device including, for example, a control dielectric layer of $Al_2O_3$ and a layer of a hafnium containing compound such as $HfO_2$ between the control dielectric and the control gate has also been disclosed. The layer of $HfO_2$ may suppress a tunneling current from a control gate of the memory device during erase operations which can lead to large over-erase voltages.

A double control dielectric layer for a memory device including, for example, a control dielectric layer of $Al_2O_3$ and a layer of a hafnium containing compound such as $HfO_2$ between the control dielectric and the charge storage layer has also been disclosed. The layer of $HfO_2$ may suppress a tunneling current from the charge storage layer of the memory device to the control gate during programming operations.

A triple control dielectric layer for a memory device also has been described. For example, the triple control dielectric layer may include a first layer of a hafnium containing compound such as $HfO_2$ (or $Hf_{1-x}Al_xO_y$, where x is a positive number between 0 and 1, and y is a positive number, e.g., $HfAlO_3$) adjacent to the charge storage layer of the device, a second layer of a hafnium containing compound such as $HfO_2$ adjacent to the control gate of the memory device, and a layer of $Al_2O_3$ between the first and second layers of $HfO_2$. The second layer of $HfO_2$ may block electron current from the control gate to the charge storage layer during the erase operation of the memory device.

The thickness of single or dual layers of the charge blocking layer may be kept very thin while still efficiently blocking current flow. For example, in an embodiment, the thickness is less than about 10 nm e.g., less than about 5 nm, e.g., less than about 4 nm. In another example embodiment, the thickness is less than about 2 nm Preferably, the thickness is greater than about 0.1 nm The use of such a double or triple layer control dielectric may provide the unexpected result of achieving a very large program/erase window (e.g., on the order of at least 8 volts or greater, for example, about 9 volts, e.g., about 10 volts, e.g., about 11 volts, e.g., about 12 volts or greater), while still providing for good charge retention and programming/erasing speed, which is important in making reliable multi-bit/cell memory devices with scaling to smaller node sizes. Furthermore, the charge blocking layer may dramatically reduce the amount of current that flows through the control dielectric during the program, erase, and read operations, which may enable flash memory devices that can endure a large number of program/erase cycles without significant drift in operation voltages.

In exemplary embodiments, various high-k dielectric materials, such as $Gd_2O_3$, $Yb_2O_3$, $Dy_2O_3$, $Nb_2O_5$, $Y_2O_3$, $La_2O_3$, $ZrO_2$, $TiO_2$, $Ta_2O_5$, $SrTiO_3$, $Ba_xSr_{1-x}TiO_3$, $Zr_xSi_{1-x}O_y$, $Hf_xSi_{1-x}O_y$, $Hf_xSi_{1-x}O_{2-y}N_y$, $Al_xZr_{1-x}O_2$, or $Pr_2O$, for example, may be used for the charge blocking layer.

A charge blocking layer including a composition gradient across the thickness of the charge blocking layer also has been described herein. For example, the charge blocking layer may be made of a dielectric material, and an amount of at least one component of the dielectric material may vary across the thickness of the charge blocking layer. For example, the component may be hafnium or hafnium oxide. According to an exemplary embodiment, the charge blocking layer having a composition gradient may be formed of a multicomponent oxide such as, for example, $Hf_xAl_{1-x}O_y$, $Hf_xSi_{1-x}O_y$, $Zr_xSi_{1-x}O_y$, $Ba_xSr_{1-x}TiO_y$, and $Al_xZr_{1-x}O_y$. The multicomponent oxide may include nitrogen (e.g., $Hf_xSi_{1-x}O_{2-y}N_y$) according to an exemplary embodiment. The charge blocking layer having a composition gradient may be disposed between the charge storage layer and the control dielectric layer, or between the control dielectric layer and the gate contact of the memory device. According to some exemplary embodiments, the gate stack may include both a first and a second charge blocking layer. One or both charge blocking layers may have a composition gradient, as described herein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A gate stack comprising the following layers in successive order:
    a first dielectric layer comprising a tunneling dielectric layer;
    a charge storage layer on the first dielectric layer;
    a second dielectric layer comprising a high-k dielectric material on the charge storage layer;
    a third dielectric layer comprising $SiO_2$ on the second dielectric layer;
    a fourth dielectric layer comprising $Si_3N_4$ on the third dielectric layer;
    a fifth dielectric layer comprising $SiO_2$ on the fourth dielectric layer, and
    a sixth dielectric layer comprising a high-k dielectric material on the fifth dielectric layer,
    wherein each of the second and the sixth dielectric layers comprises a metal oxide or a metal silicate.

2. The gate stack of claim 1, wherein the charge storage layer comprises nanocrystals having a size less than 5 nm.

3. The gate stack of claim 1, wherein the charge storage layer comprises a continuous floating gate.

4. The gate stack of claim 1, wherein each of the third, fourth, and fifth dielectric layers has a thickness of 3 nm or less.

5. The gate stack of claim 1, wherein each of the second and the sixth dielectric layers has a thickness of 2 nm or less.

6. The gate stack of claim 1, wherein each of the second and the sixth dielectric layers comprises one of hafnium and zirconium.

7. The gate stack of claim 1, wherein at least one of the second and the sixth dielectric layers comprises a metal silicate.

8. The gate stack of claim 7, wherein the metal silicate is selected from the group consisting of a hafnium silicate and an aluminum silicate.

9. The gate stack of claim 1, further comprising a seventh dielectric layer of 1 nm or less in thickness disposed between at least one of: (a) the second dielectric layer and the third dielectric layer; and (b) the fifth dielectric layer and the sixth dielectric layer.

10. The gate stack of claim 9, wherein the seventh dielectric layer comprises aluminum oxide.

11. The gate stack of claim 2, wherein the nanocrystals comprise ruthenium nanocrystals.

* * * * *